United States Patent [19]
Sunouchi et al.

[11] Patent Number: 5,363,325
[45] Date of Patent: Nov. 8, 1994

[54] DYNAMIC SEMICONDUCTOR MEMORY DEVICE HAVING HIGH INTEGRATION DENSITY

[75] Inventors: Kazumasa Sunouchi, Yokohama; Tsuneaki Fuse, Tokyo; Akihiro Nitayama, Kawasaki; Takehiro Hasegawa, Tokyo; Shigeyoshi Watanabe, Yokohama; Fumio Horiguchi, Tokyo; Katsuhiko Hieda, Yokohama, all of Japan

[73] Assignee: Kabushiki Kaisha Toshiba, Kawasaki, Japan

[21] Appl. No.: 907,032

[22] Filed: Jul. 1, 1992

[30] Foreign Application Priority Data
Jul. 1, 1991 [JP] Japan .............. 3-160568
Mar. 31, 1992 [JP] Japan .............. 4-105764

[51] Int. Cl.$^5$ .............................. G11L 11/24
[52] U.S. Cl. ................ 365/149; 365/177; 257/273; 257/360; 257/363; 257/370
[58] Field of Search ............... 257/276, 297, 370, 349, 257/350, 372, 135, 139, 141, 143, 144, 300, 363, 273; 365/177, 150, 149

[56] References Cited
U.S. PATENT DOCUMENTS

| | | | |
|---|---|---|---|
| 4,677,589 | 6/1987 | Haskell et al. | 365/177 |
| 4,961,165 | 10/1990 | Ema | 365/149 |
| 5,031,020 | 7/1991 | Momose | 257/370 |
| 5,198,995 | 3/1993 | Dennard et al. | 365/149 |

OTHER PUBLICATIONS

"A Block Oriented RAM with Half-Sized DRAM Cell and Quasi-folded Data Line Architecture", Kimura et al ISSCC91/Session 6/High Density DRAM/Paper TA 6.2, Mar. 1991 IEEE.
"Cell Plate Line Connecting Complementary Bitline ($C^3$) Architecture For Battery Operating DRAMs", Asakura et al., LSI Research and Development Lab, Mitsubishi Electric Corporation.
Technical Digest of IEDM, "A Bipolar-EPROM (Bi--EPROM) Structure for 33 v Operation and High Speed Application" N. Matsukawa, et al., 1990, pp. 90-313-90-316.

*Primary Examiner*—Eugene R. LaRoche
*Assistant Examiner*—F. Niranjan
*Attorney, Agent, or Firm*—Oblon, Spivak, McClelland, Maier & Neustadt

[57] ABSTRACT

A bipolar transistor $Q_1$ having a collector formed of a substrate region SUB of a MOS transistor $M_1$, a base formed of the drain region of the MOS transistor and an emitter formed on the base and connected to a bit line BL is connected between the bit line BL and a memory cell MC formed of the MOS transistor $M_1$ and and a capacitor $C_1$ and the current amplifying operation of a bipolar transistor is used for data readout.

17 Claims, 48 Drawing Sheets

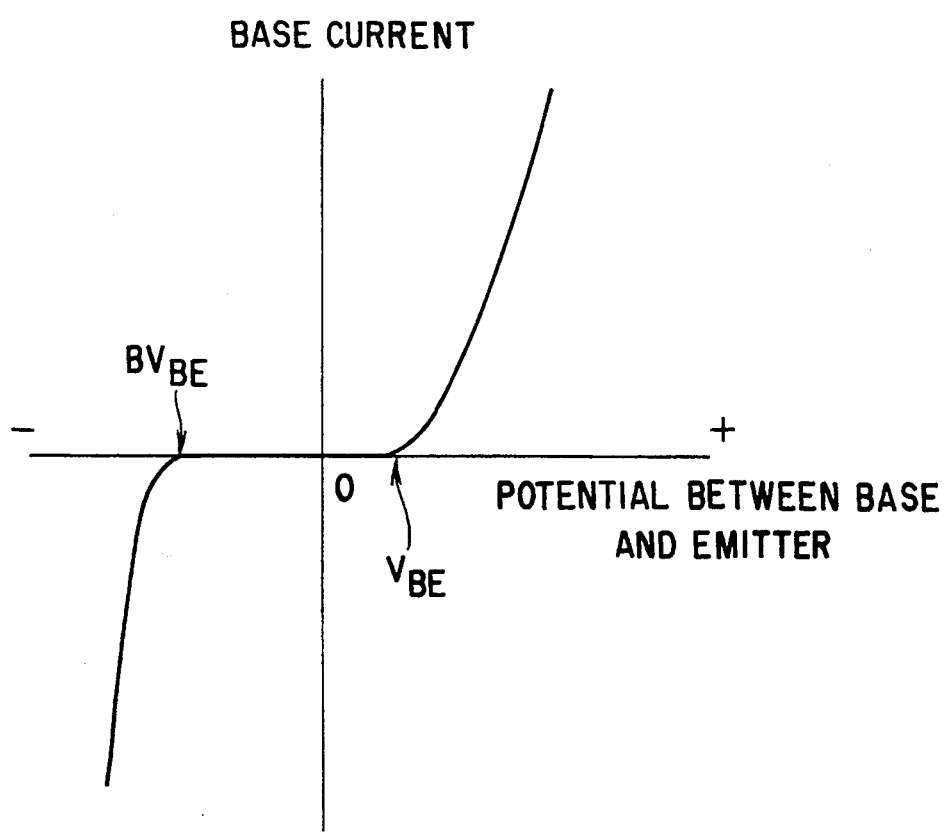
F I G. 3

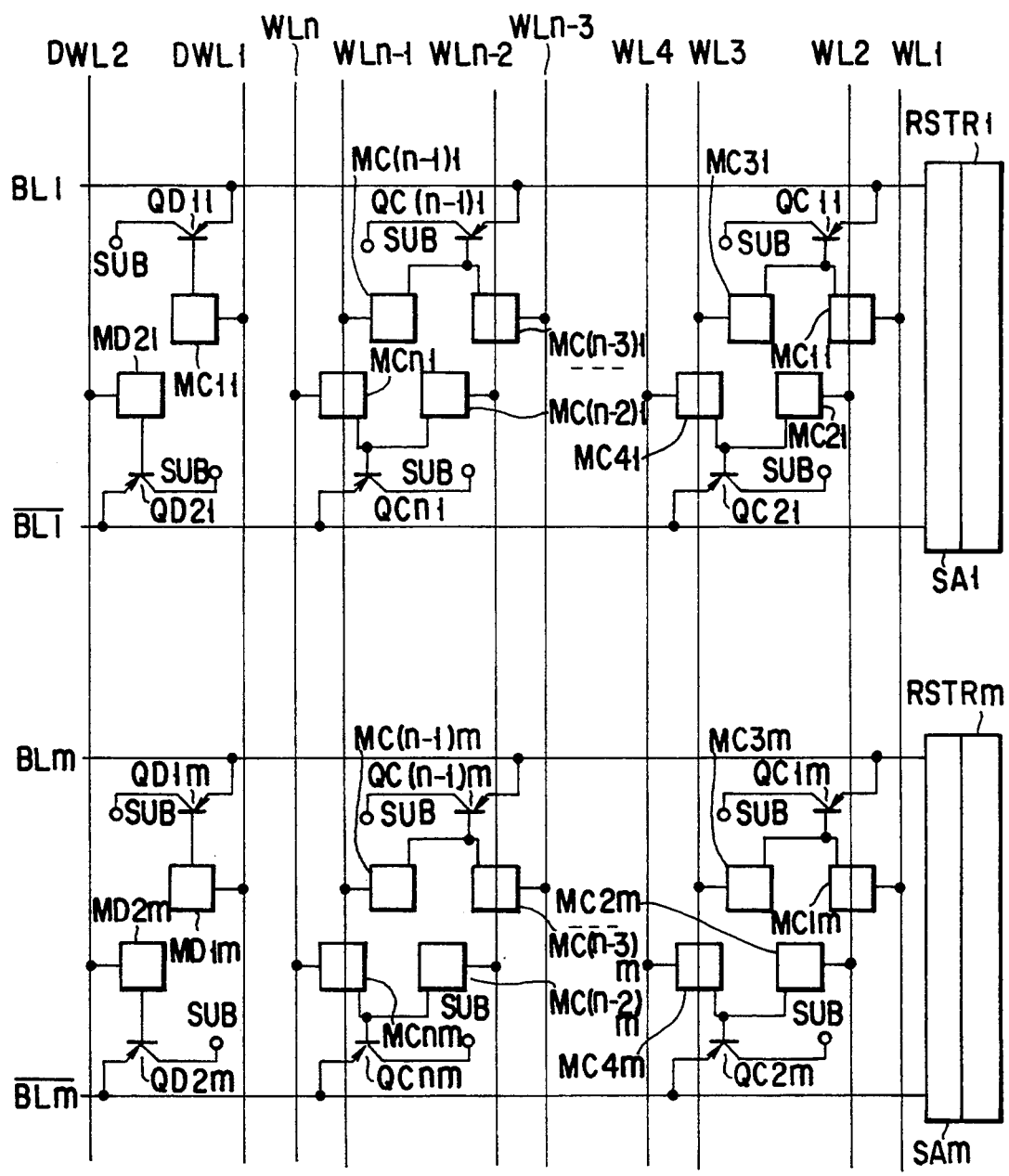
F I G. 9

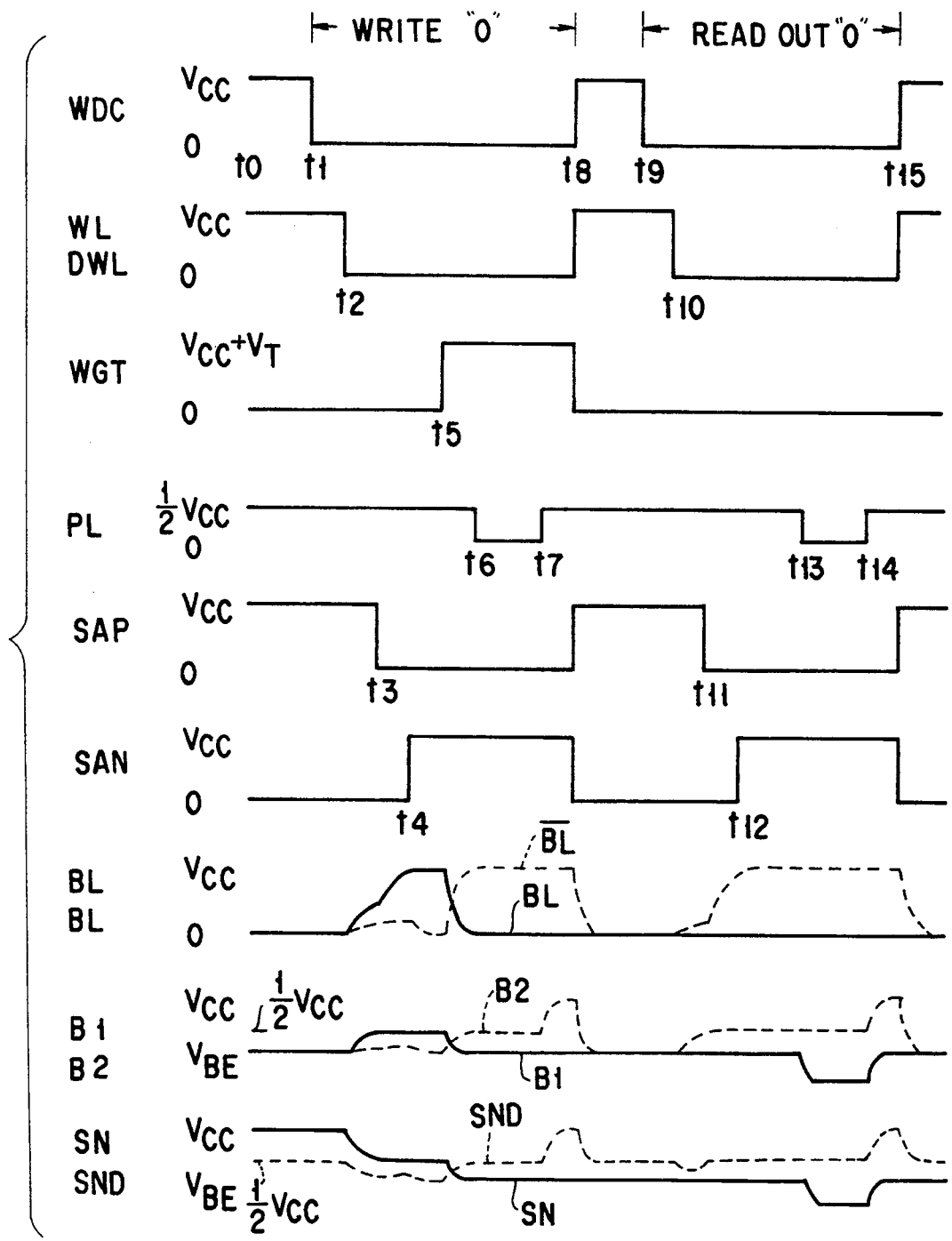
F I G. 14

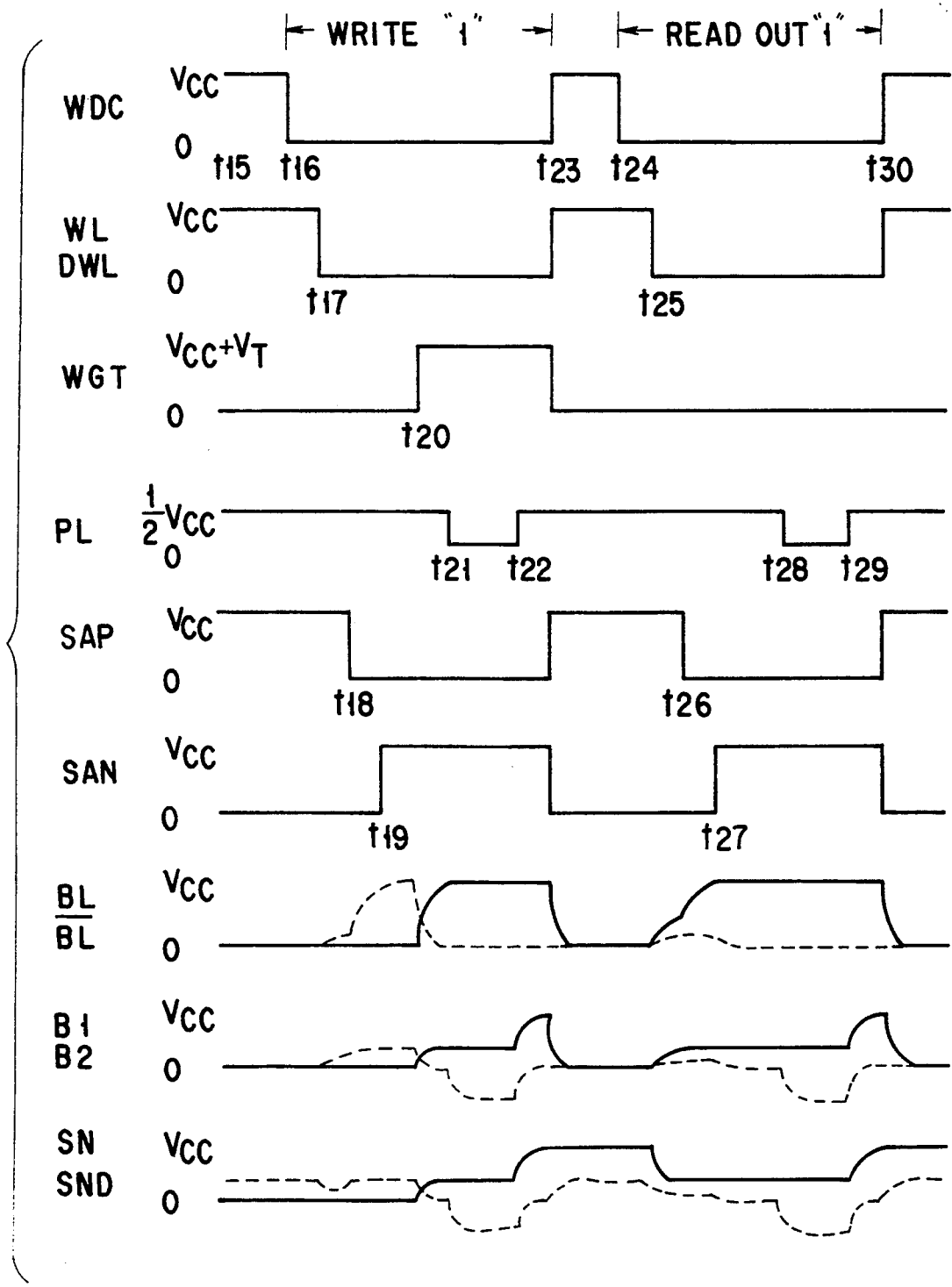
F I G. 15

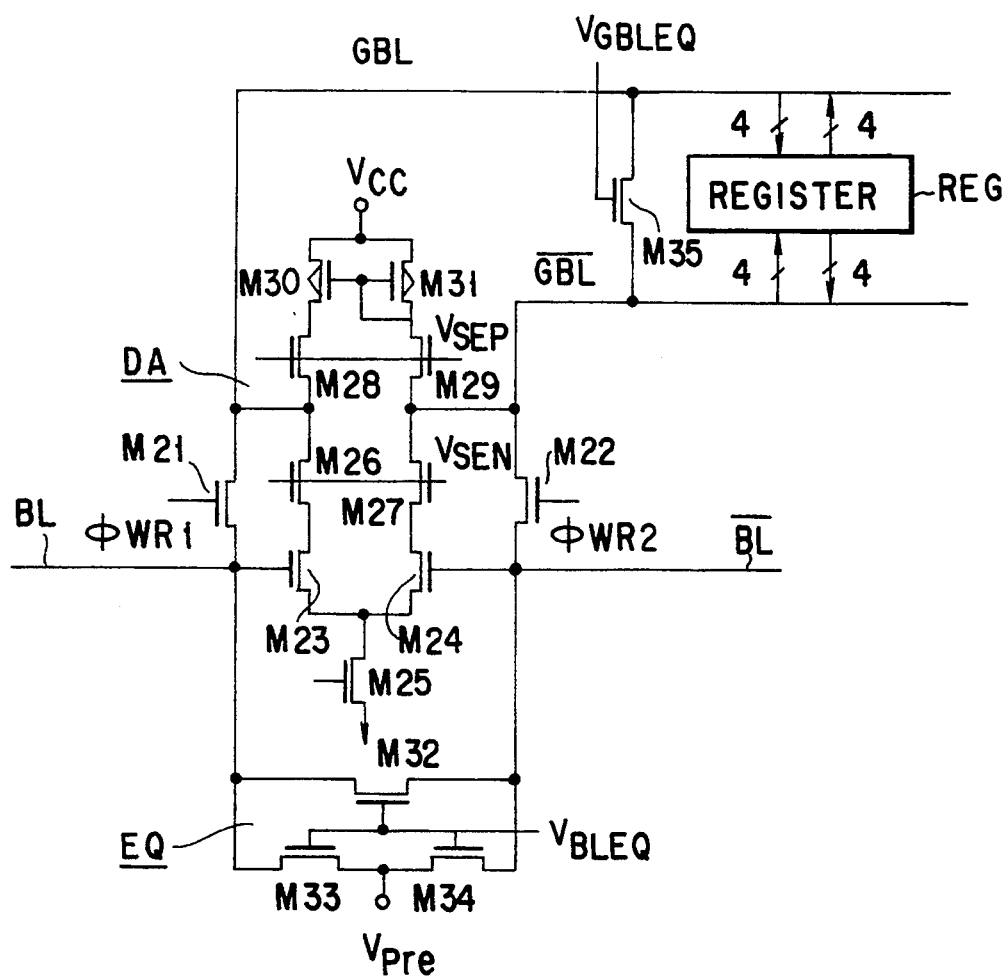
F I G. 17

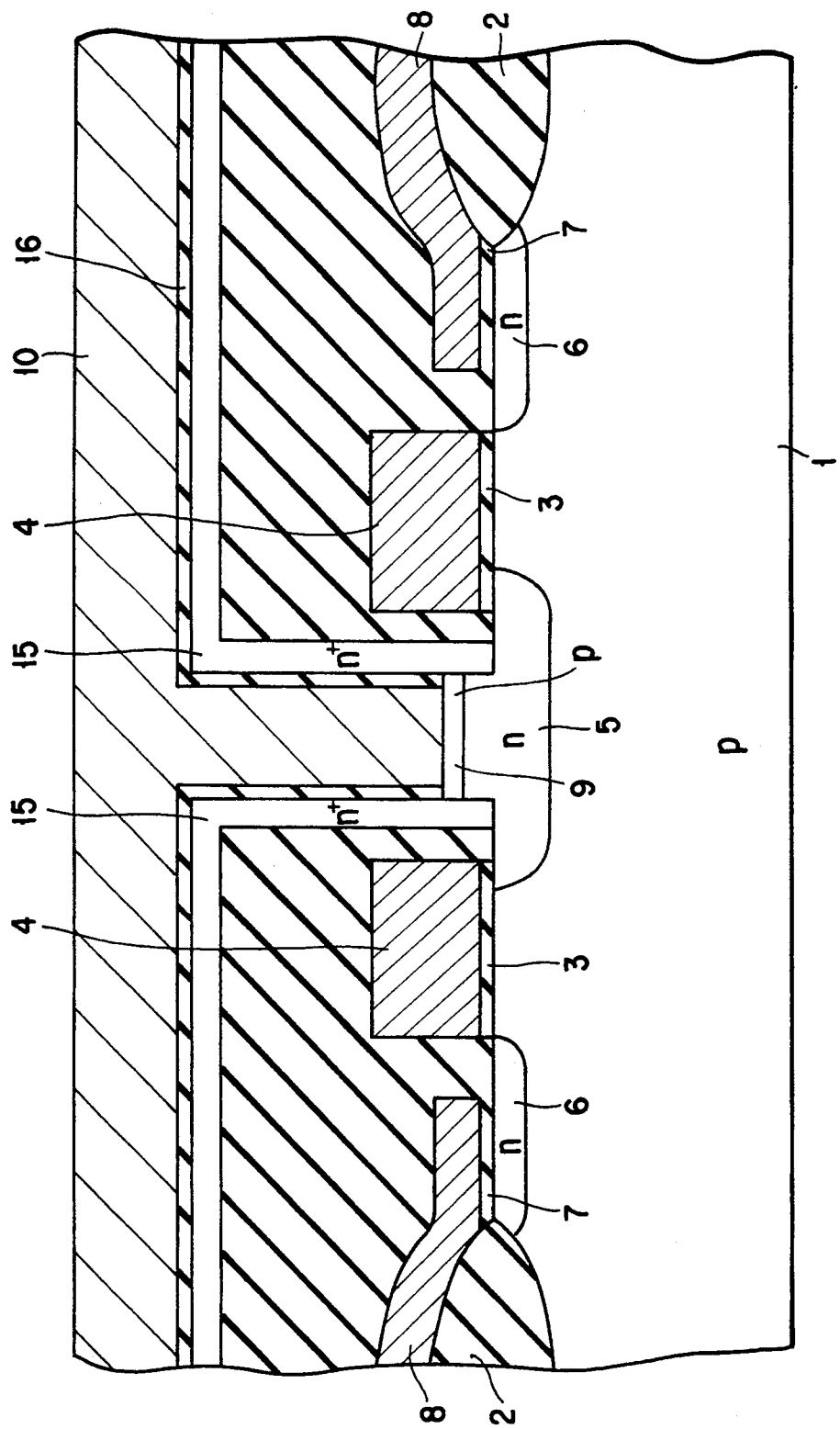
F I G. 25

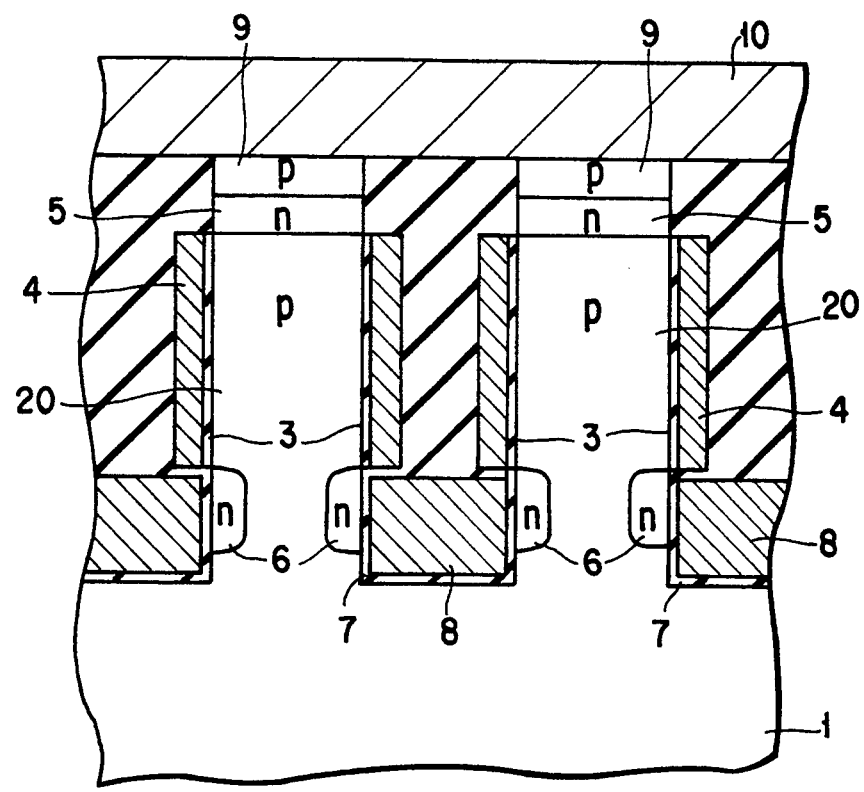
F I G. 26

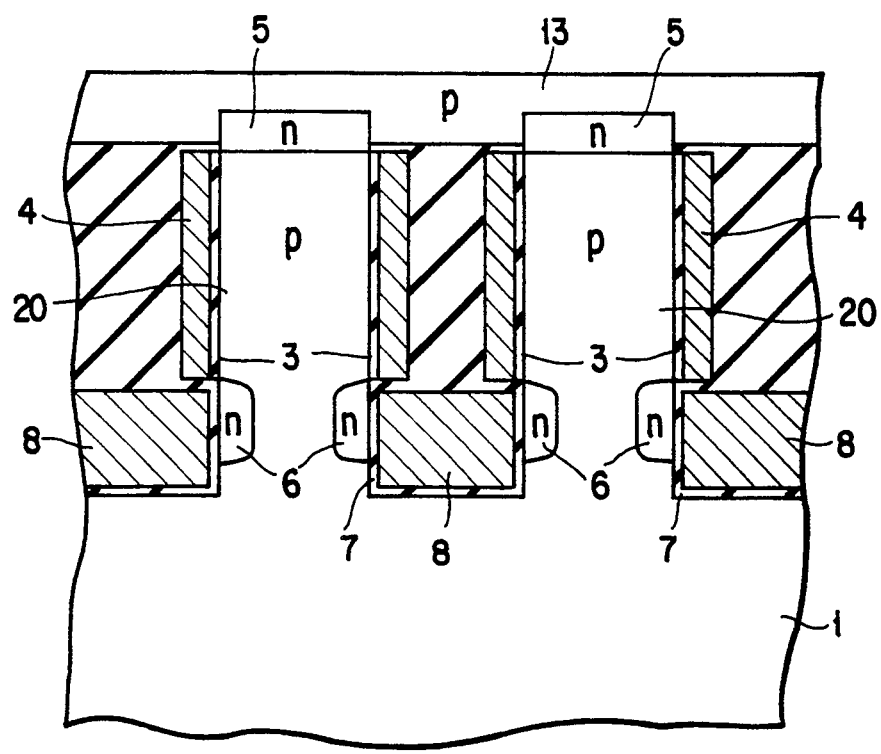
F I G. 27

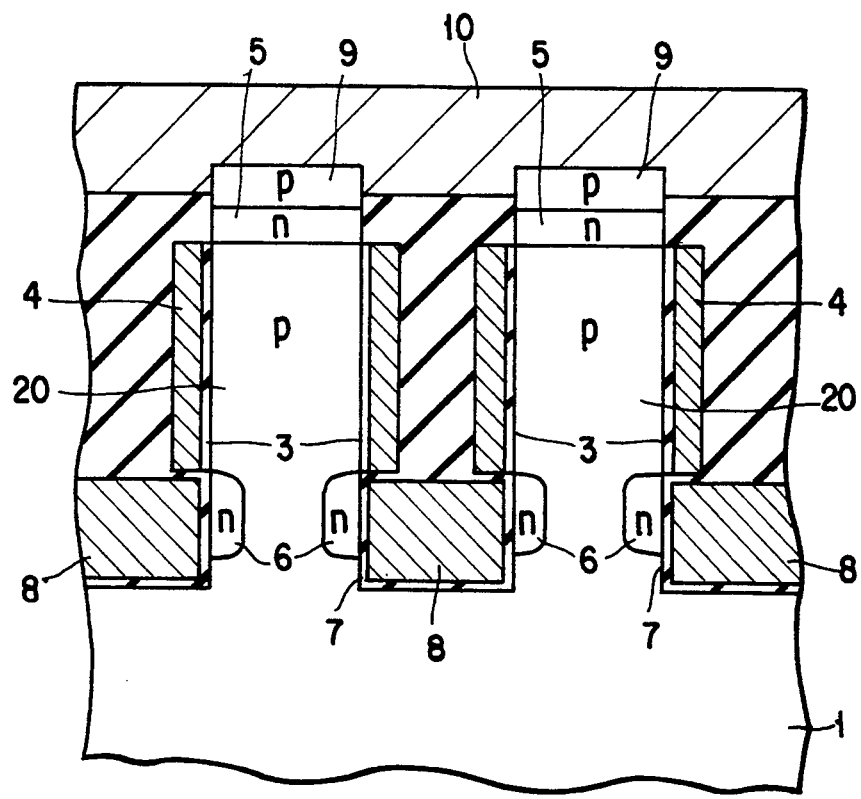
F I G. 28

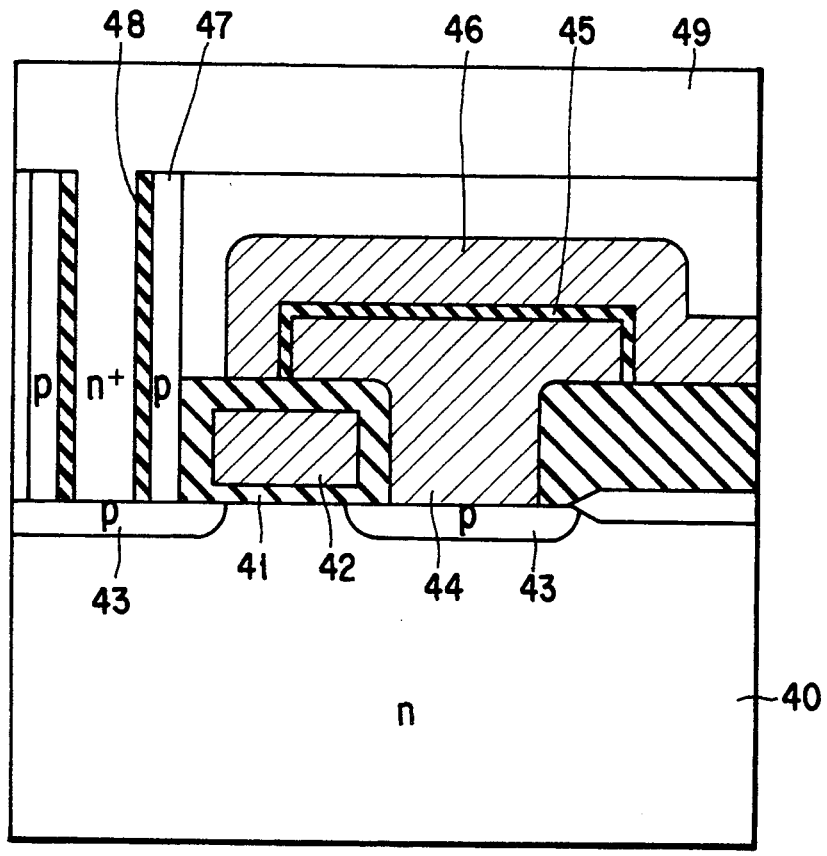
F I G. 29

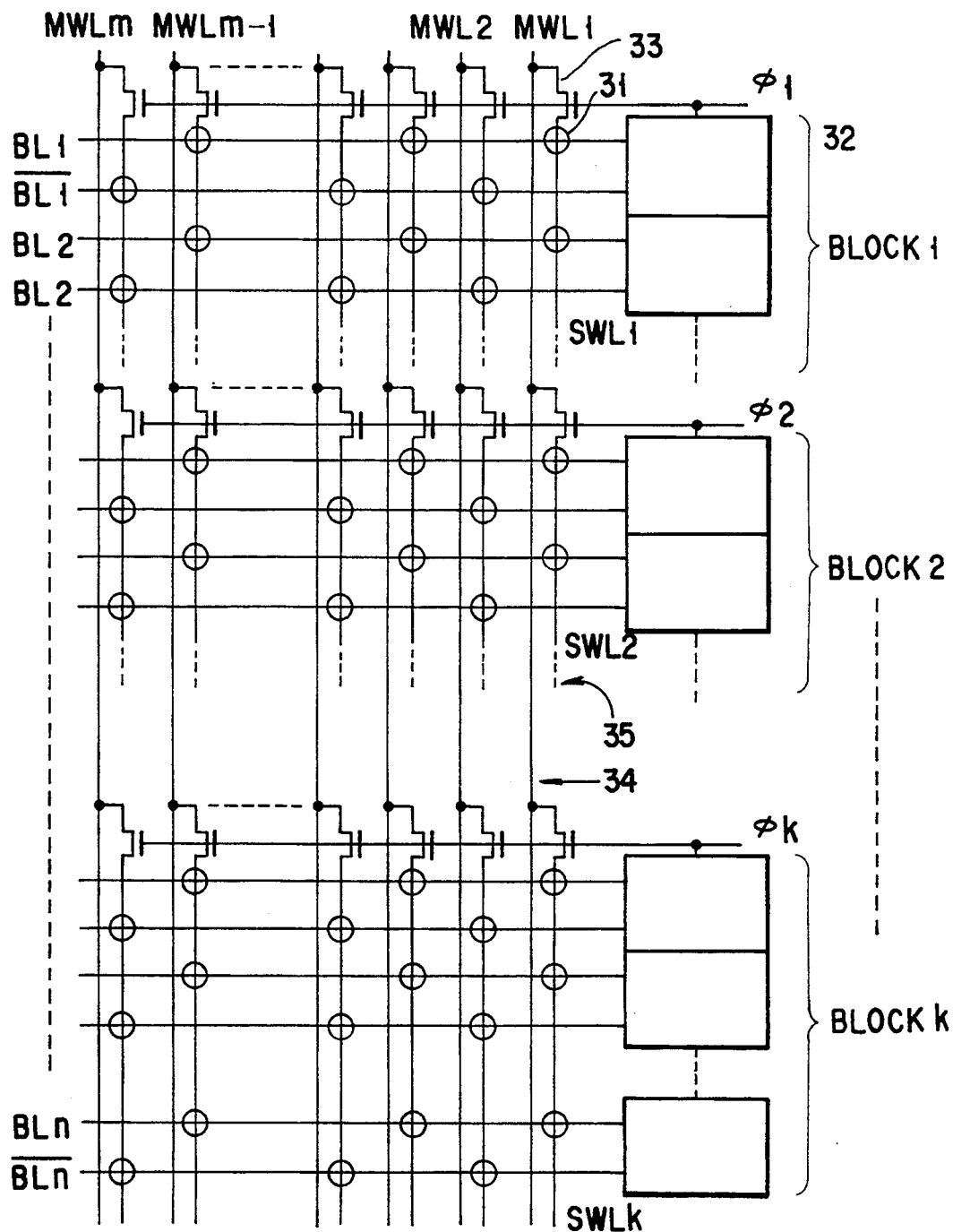
F I G. 30

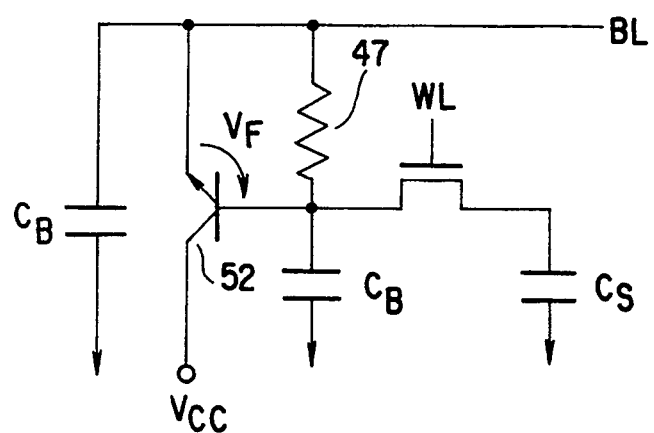
F I G. 32

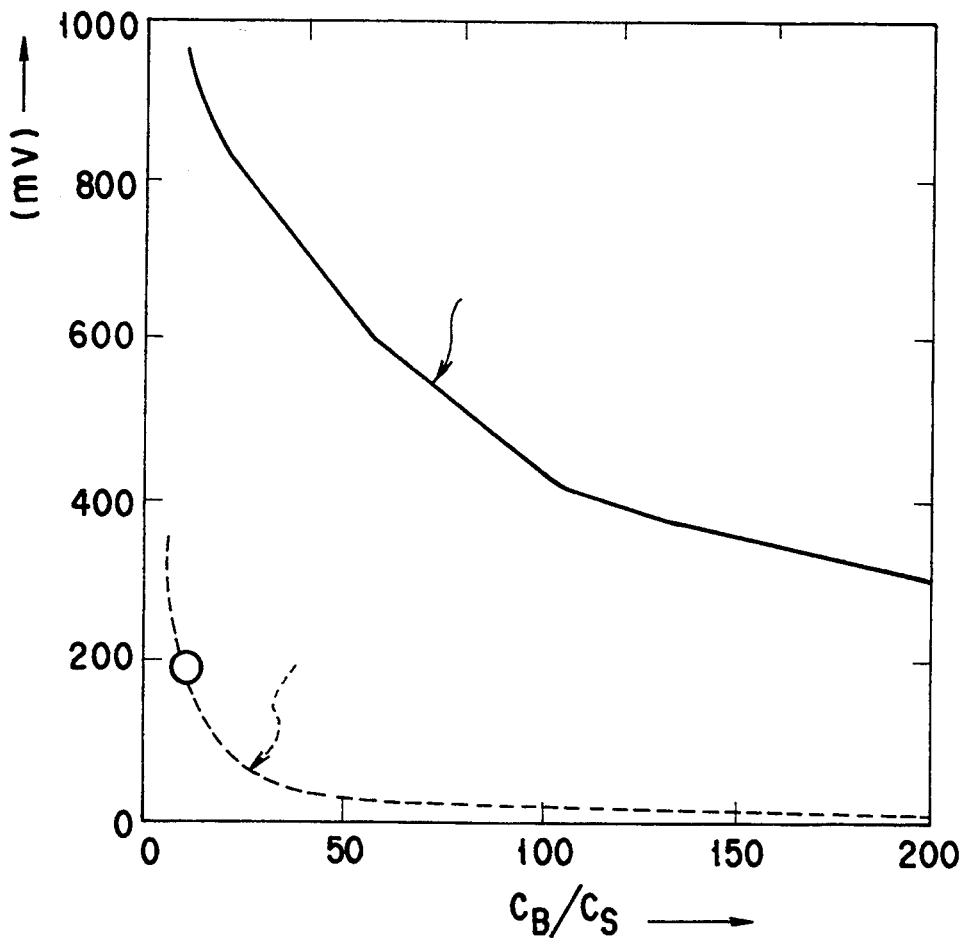
F I G. 33

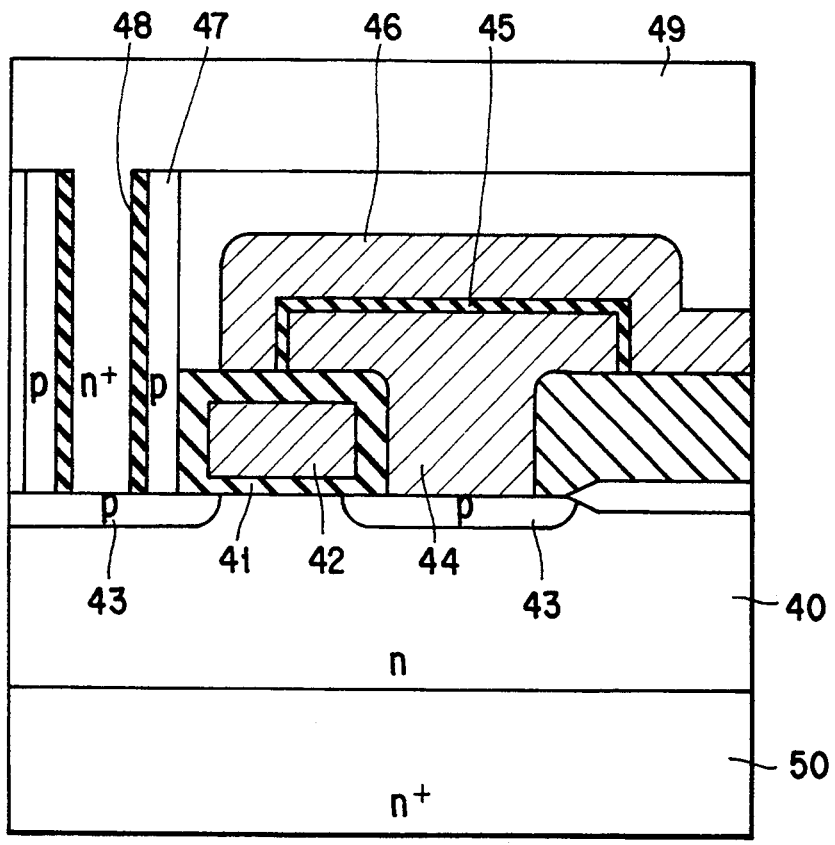
F I G. 34

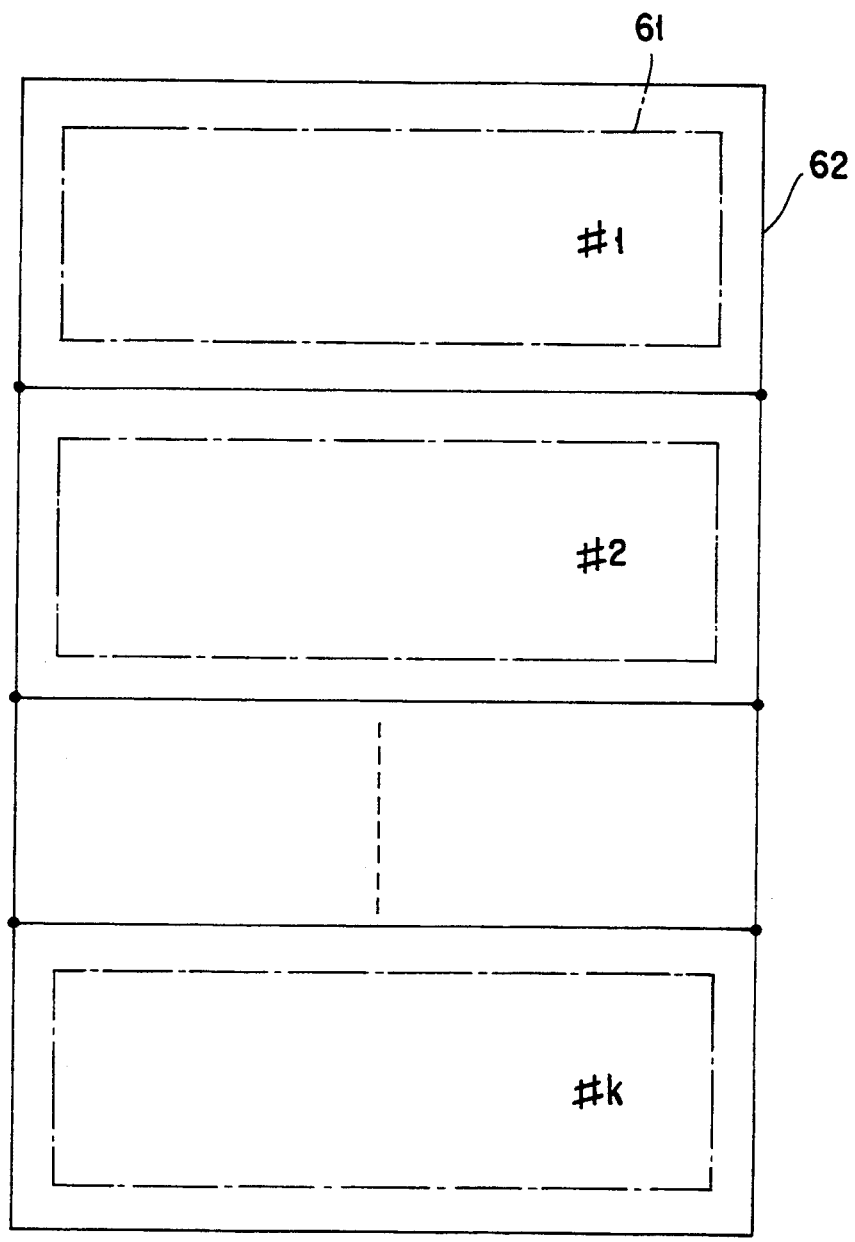
F I G. 35

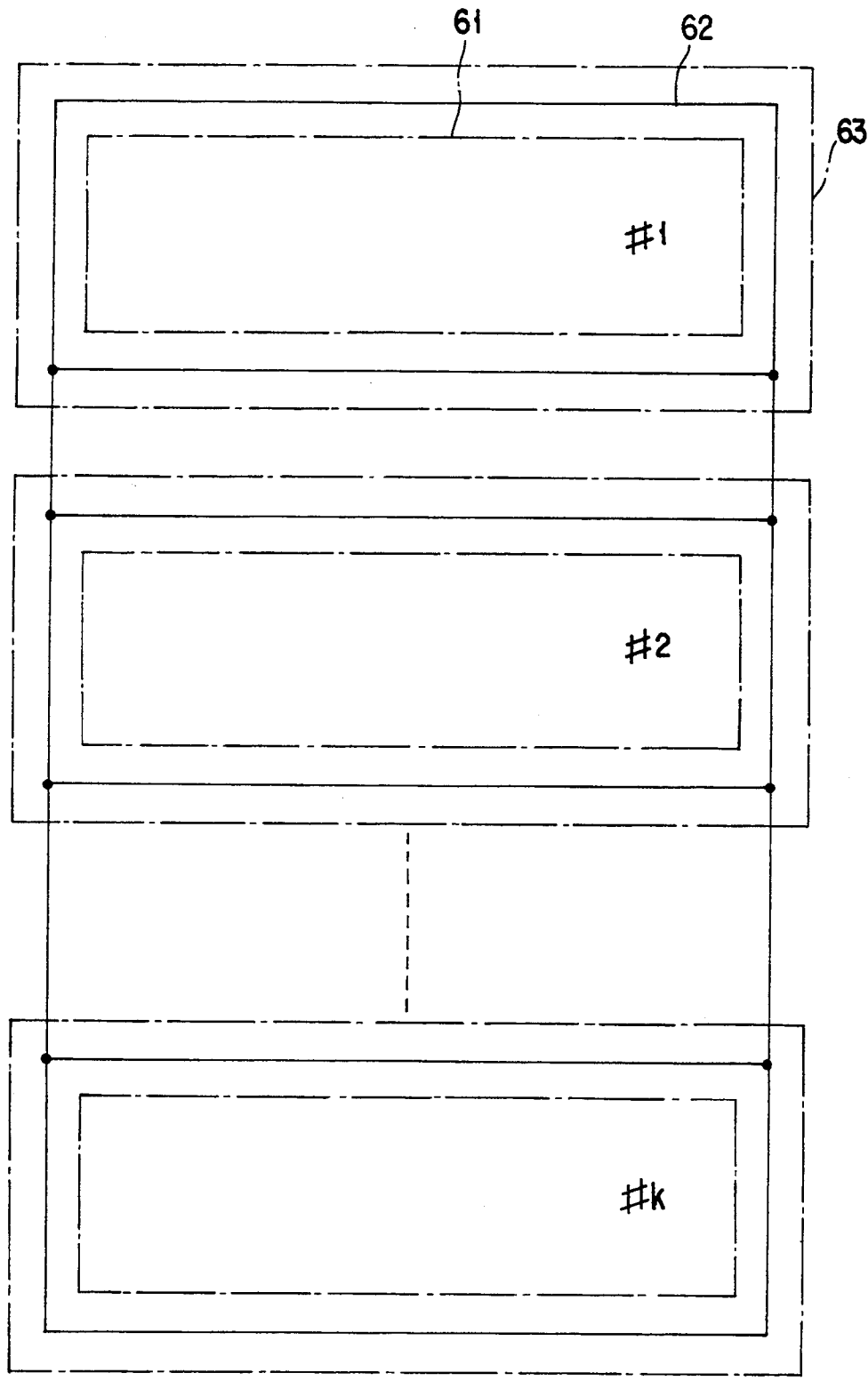
F I G. 36

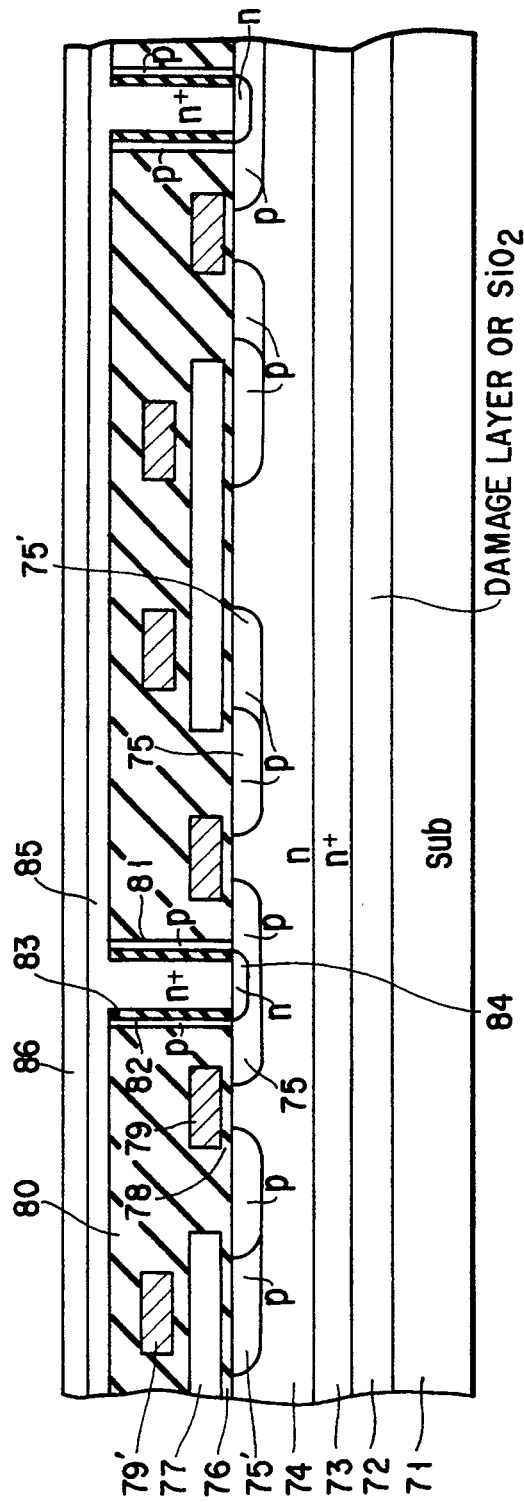
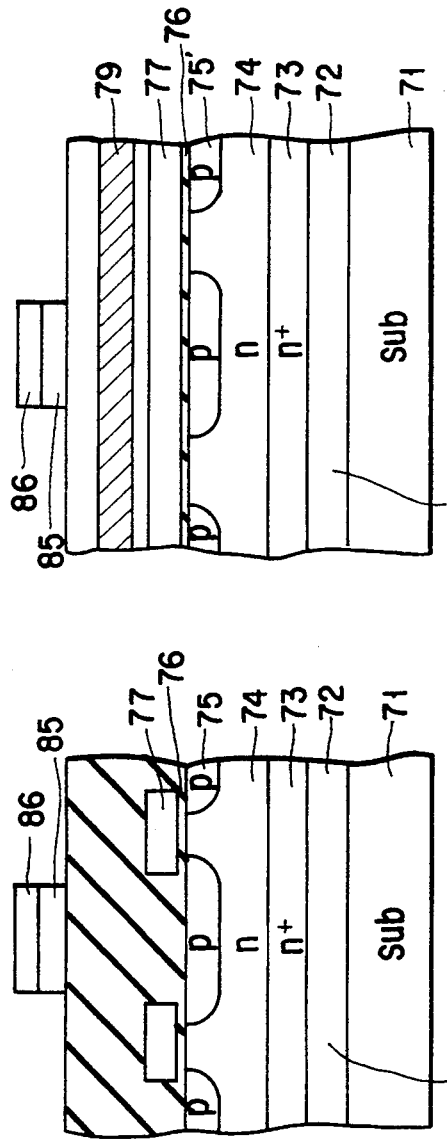
FIG. 38A
FIG. 38B
FIG. 38C

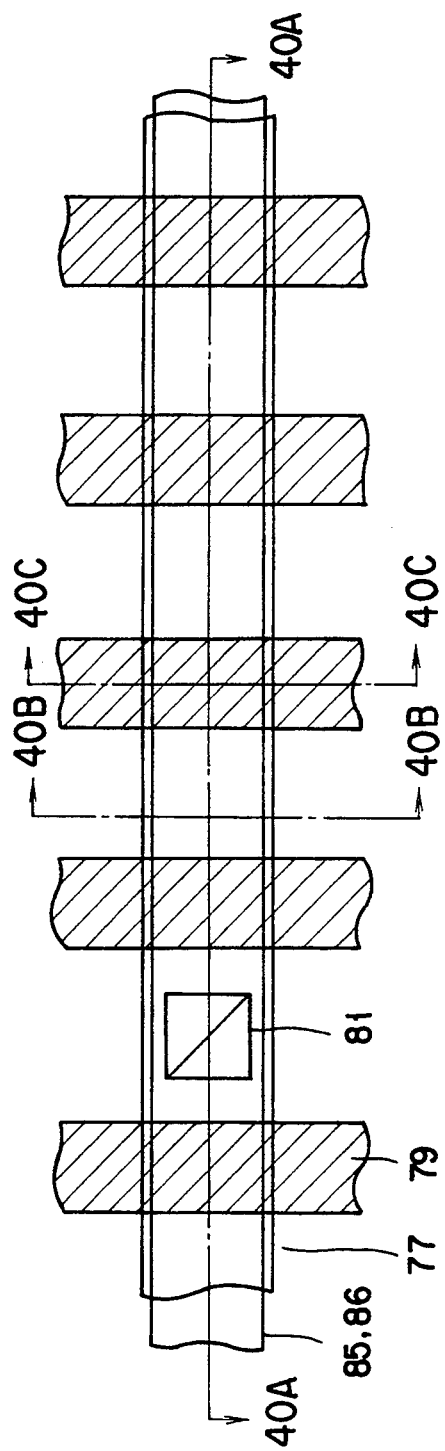
F I G. 39

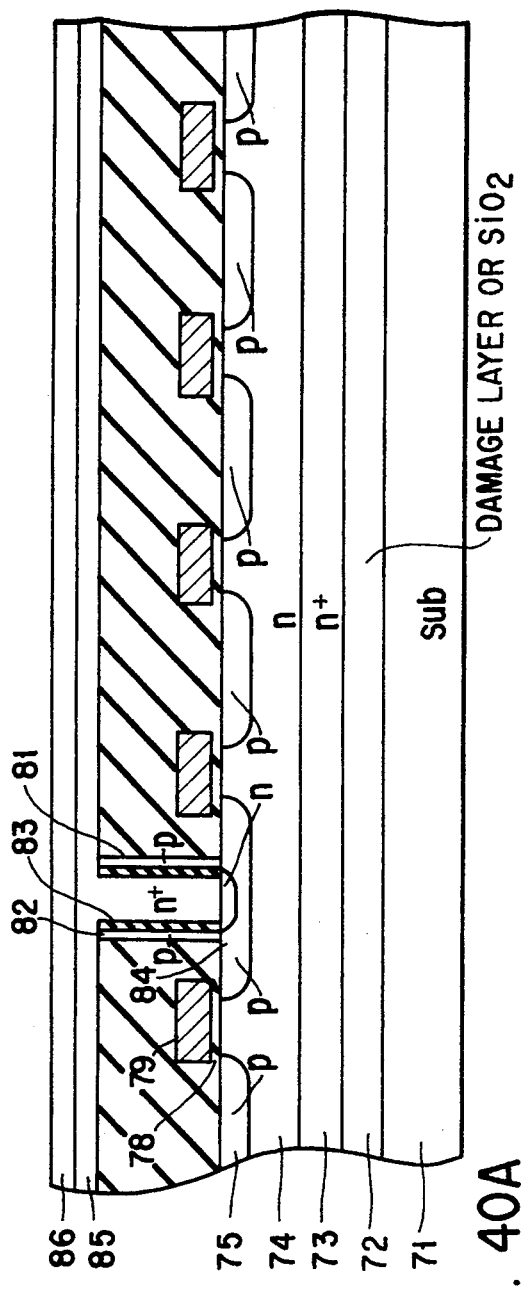
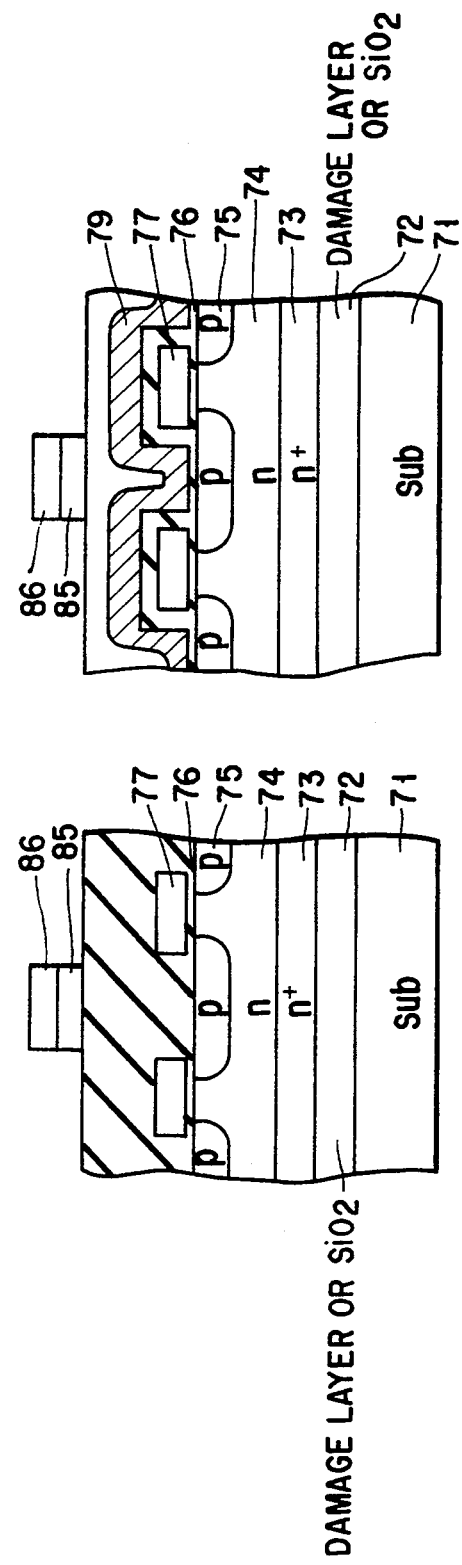
FIG. 40A
FIG. 40B
FIG. 40C

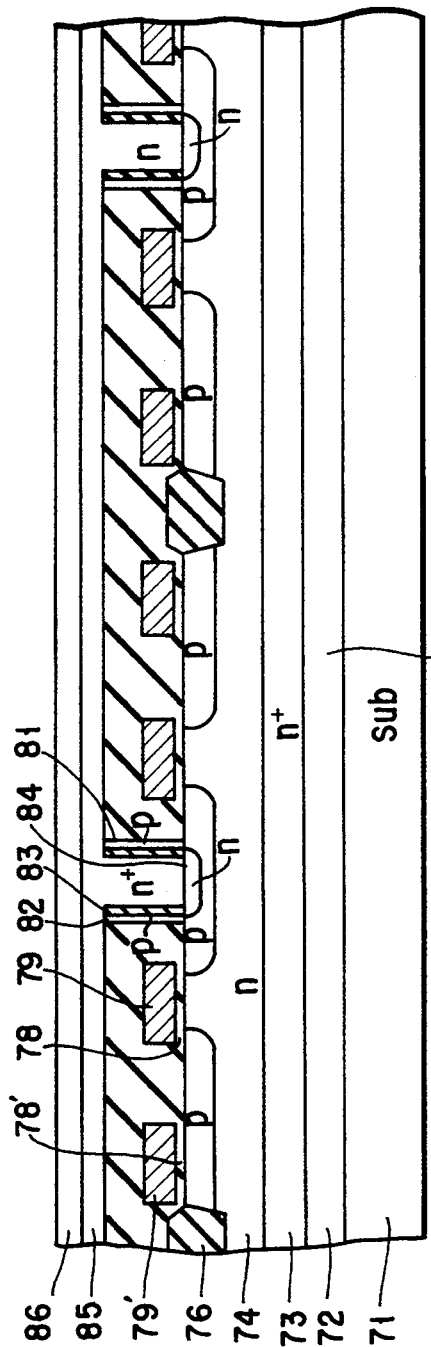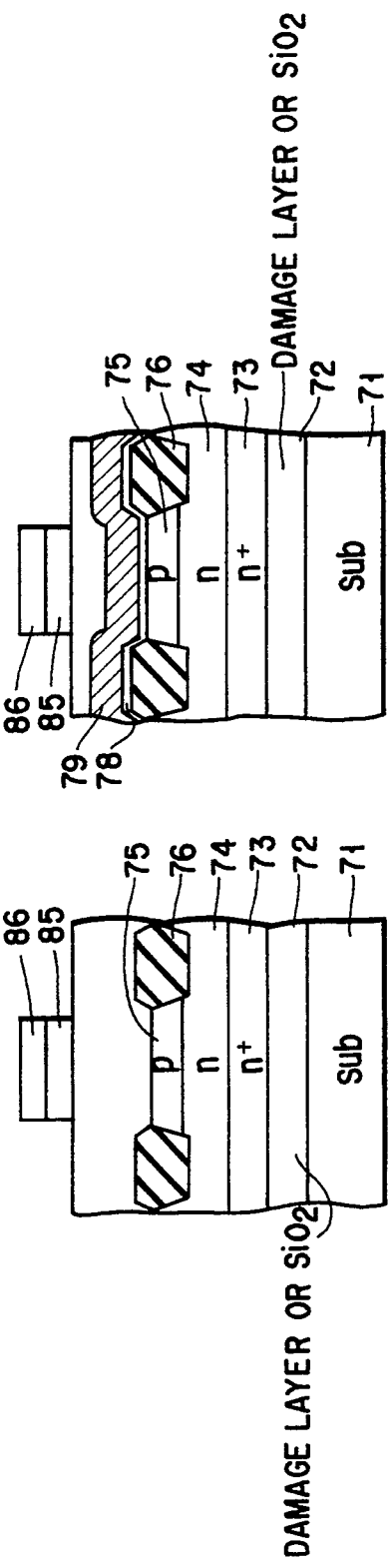
FIG. 43A
FIG. 43B
FIG. 43C

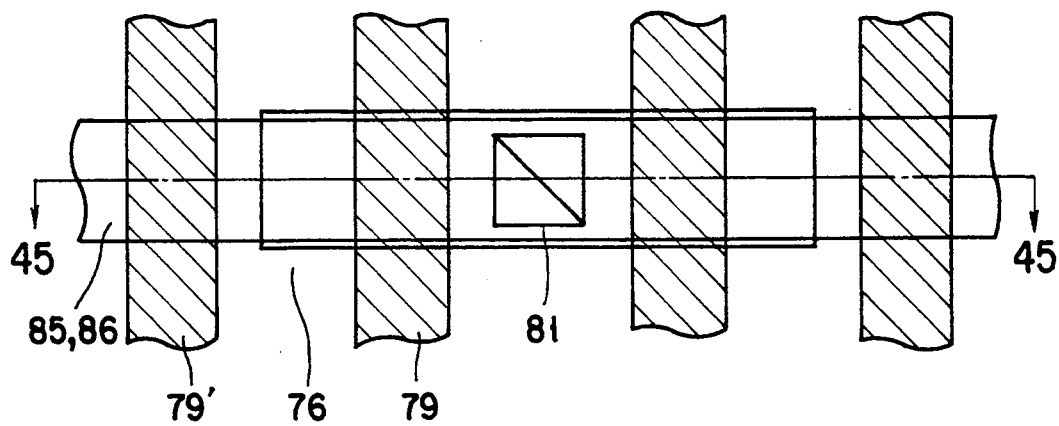
F I G. 44
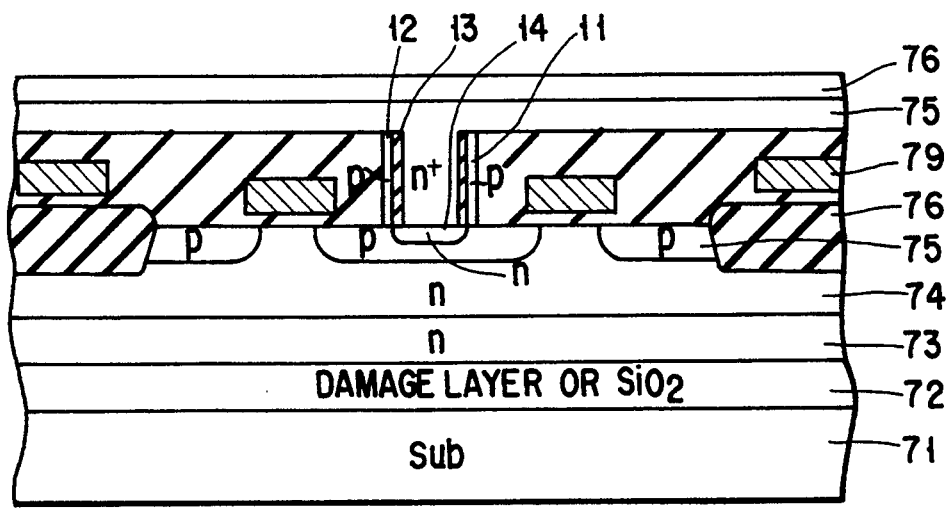
F I G. 45

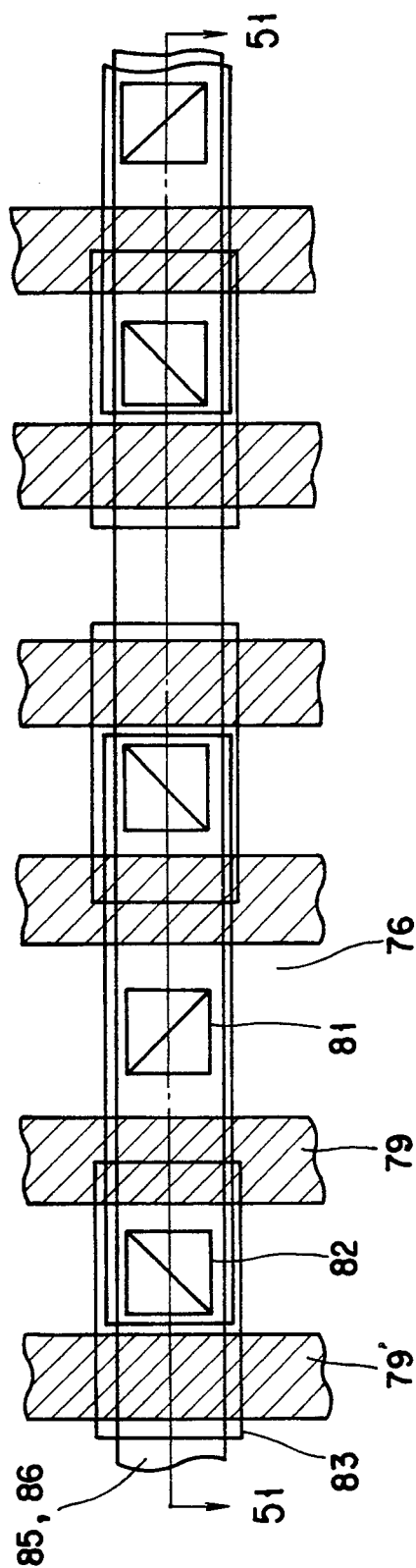
F I G. 50

DYNAMIC SEMICONDUCTOR MEMORY DEVICE HAVING HIGH INTEGRATION DENSITY

BACKGROUND OF THE INVENTION

1. Field of the Invention

This invention relates to a dynamic semiconductor memory device (DRAM) formed with high integration density.

2. Description of the Related Art

The integration density of a DRAM having one-transistor/one-capacitor memory cells is markedly enhanced with the further development of the fine patterning process. In the DRAM, the magnitude of a signal read out and supplied to the bit line is determined by the ratio $C_s/C_B$ of the capacitance $C_s$ of the capacitor to the capacitance $C_B$ of the bit line and a power source potential $V_{cc}$. When the cell area is reduced to form the DRAM with high integration density, the capacitance $C_s$ of the capacitor becomes small and the capacitance $C_B$ of the bit line is increased with an increase in the integration density. Therefore, since the magnitude of a signal to be detected by a sense amplifier is reduced with an increase in the integration density of the DRAM, the reliability of the DRAM is lowered.

In the prior art, in order to obtain a large capacitance of the capacitor with small area, trench capacitors and stacked capacitors have been proposed. However, even if the above capacitors are used, there is a restriction on the increase of the capacitance of the capacitor. In order to reduce the bit line capacitance, a method of dividing the bit line so as to reduce the length of a bit line connected to a sense amplifier is effective. However, if the number of divisions of the bit line becomes large, the number of sense amplifiers is increased accordingly, thereby increasing the chip area. Thus, reduction in the bit line capacitance by the bit line division is limited. The magnitude of a readout signal becomes larger as the power source potential $V_{cc}$ becomes higher, but since the withstanding voltage and reliability of the elements are lowered with greater miniaturization of the elements, it is required to lower the power source potential $V_{cc}$.

For the above reasons, it becomes difficult to increase the magnitude of a signal read out on the bit line and at the same time enhance the integration density of the DRAM.

Further, with an increase in the integration density of the DRAM, a problem of noises appearing on the bit line occurs. One of the bit line noises is caused by the capacitive coupling between the bit lines. That is, since the bit lines are arranged with a small pitch, the bit line noise becomes extremely large. The other noise is caused by the capacitive coupling between the bit line and a word line which is arranged to cross the bit line. The word line and bit line are arranged to cross each other with an inter-level insulation film disposed therebetween and the inter-level insulation film becomes thinner as the integration density becomes higher. This is because the aspect ratio of a contact hole for the bit line must be made as small as possible. Therefore, the amount of noise transmitted from the word line to the bit line is increased with an increase in the integration density of the DRAM.

The high-speed operation of the bit line sense amplifier will be degraded by a reduction in the magnitude of a readout signal and an increase in the noise with an increase in the integration density of the DRAM. In general, the bit line sense amplifier is constructed by a flip-flop. The sensitivity of the bit line sense amplifier is determined by the degree of variation in the threshold voltages of MOS transistors constituting the flip-flop. Therefore, when the bit line sense amplifier constituted by MOS transistors whose threshold voltages are not constant is operated at a high speed, "0" or "1" of a small signal read out on the bit line may be erroneously determined.

As described above, in the conventional DRAM, the magnitude of a signal appearing on the bit line is further reduced and the amount of bit line noise is increased by a reduction in the capacitance of the capacitor, increase in the capacitance of the bit line, lowering in the power source potential and the like caused with an increase in the integration density. Therefore, unless the above problems are solved, it is difficult to further enhance the integration density of the DRAM. Further, in order to correctly operate the bit line sense amplifier irrespective of reduction in the magnitude of a signal read out on the bit line, the high-speed operation of the bit line sense amplifier must be sacrificed.

As the related document of this invention, an article by N. Matsukawa et al., "A BIPOLAR-EPROM (BI-EPROM) STRUCTURE FOR 3.3 V OPERATION AND HIGH SPEED APPLICATION", Technical Digest of IEDM, pp. 313–316, IEEE 1990 is provided.

SUMMARY OF THE INVENTION

An object of this invention is to provide a DRAM which can be formed with higher integration density and can be operated at a higher speed.

The basic structure of the DRAM of this invention is attained by a structure having a bipolar transistor disposed between the drain of a cell transistor and a bit line. The equivalent circuit of the bipolar transistor is a circuit having a base connected to the drain of the cell transistor, an emitter connected to the bit line and a collector connected to the substrate region of the cell transistor. More specifically, the bipolar transistor is formed with a vertical structure having a collector and a base which are respectively formed of the substrate region and drain of the cell transistor and an emitter formed in the bit line contact portion.

The DRAM of this invention based on the above basic structure is constructed as follows.

A first DRAM of this invention is a dynamic semiconductor memory device which comprises a semiconductor substrate; a memory cell constructed by a capacitor and a MOS transistor formed in the semiconductor substrate; a bipolar transistor having a collector formed of a substrate region of first conductivity type of the MOS transistor, a base of second conductivity type formed of a drain of the MOS transistor and an emitter of the first conductivity type forming a junction together with the base thereof; a bit line connected to the emitter of the bipolar transistor, for transferring data with respect to the memory cell; and a word line connected to a gate of the MOS transistor, for driving the memory cell.

A second DRAM of this invention is a dynamic semiconductor memory device which comprises a semiconductor substrate having a region of first conductivity type; a MOS transistor having a source and a drain of second conductivity type which are separately formed in the first conductivity type region of the substrate and a gate electrode acting as a word line and formed over the first conductivity type region which lies between the source and drain with a gate insulation film disposed therebetween; a capacitor formed in the substrate and having the source of the second conductivity type of the MOS transistor as one electrode; a bipolar transistor having a collector formed of the first conductivity type region in which the MOS transistor is formed, a base formed of the drain of the second conductivity type and an emitter of the first conductivity type constituting a junction together with the base thereof; and a bit line connected to the emitter of the bipolar transistor.

A third DRAM of this invention further comprises a resistor connected between the base and emitter of the bipolar transistor in each of the first and second DRAMs.

A fourth DRAM of this invention is a dynamic semiconductor memory device which comprises a semiconductor substrate; a memory cell constructed by a capacitor and a first MOS transistor formed in the semiconductor substrate; a bipolar transistor having a collector formed of a substrate region of first conductivity type of the first MOS transistor, a base of second conductivity type formed of a drain of the first MOS transistor and an emitter of the first conductivity type forming a junction together with the base thereof; a bit line connected to the emitter of the bipolar transistor, for transferring data with respect to the memory cell; a first word line connected to a gate of the first MOS transistor, for driving the memory cell; and a second MOS transistor having a drain connected to the first word line, a source connected to a second word line and a gate supplied with a signal for selecting the bit line.

A fifth DRAM of this invention further comprises a carrier barrier layer formed in the semiconductor substrate in addition to the structure of the first DRAM. As the carrier barrier layer, an SOI substrate, a damage layer formed by high-energy ion implantation or n+-type or p+-type buried layer is used. As the capacitor of the memory cell, a capacitor between the passage word line and a diffusion layer, a capacitor between the transistor isolation region and the diffusion layer, a fringe capacitor of the gate or a junction capacitor is used.

The data readout/write-in operation of the DRAM of this invention is effected as follows. In this case, assume that the cell transistor is an n-channel MOS transistor and a pnp transistor is formed between the drain of the MOS transistor and the bit line.

For example, the bit line is supplied with 3.3 V in the precharge cycle and the bit line potential is set as the emitter potential of the pnp transistor. If a voltage of 0 V ("0" data) is held in the capacitor, the voltage of 0 V is applied to the base of the pnp transistor to turn on the same when the cell transistor is turned on, thereby permitting a collector current to flow and discharging the bit line voltage. If a voltage of 3.3 V ("1" data) is held in the capacitor, the pnp transistor is kept in the OFF-state even when the cell transistor is turned on, thereby preventing the bit line voltage from being discharged. Data of "0" or "1" is determined according to whether or not the bit line voltage is discharged via the pnp transistor.

At the data write-in time, the bipolar transistor operation is not utilized. When "1" data is supplied to the bit line in a case wherein the cell transistor is set in the ON state, "1" data is written into the capacitor by a forward current flowing in the base-emitter path of the pnp transistor, and when "0" data is supplied to the bit line, "0" data is written into the capacitor by a reverse breakdown current flowing in the base-emitter path of the pnp transistor. However, at this time, in order to effect the data write-in operation with higher reliability, it is preferable to control the plate potential of the capacitor.

As described above, in this invention, the data readout operation is effected by detecting variation in the bit line potential by utilizing the current amplifying operation of the bipolar transistor. Therefore, even with a DRAM having a large capacitance of the capacitor and a large bit line capacitance, a high-speed data readout operation can be correctly effected. In this case, the influence of noise can also be relatively reduced. The power consumption of the chip can be reduced by reducing the number of sense amplifiers which are simultaneously activated.

Not only are $C_s$ (which is necessary for the readout voltage of the sense amplifier) and the S/N ratio set to 0 by using either an SOI substrate acting as the barrier layer for carriers generated by application of α-rays incident on the substrate, a damage layer formed by high-energy ion implantation or n+-type or p+-type buried layer and using the transistor isolation region for suppressing the leak current in the element isolation end portion used for refreshing, but also $C_s$ which is necessary for soft error is set to substantially 0 by use of the carrier barrier layer formed in the substrate and $C_s$ which is necessary for refreshing are substantially set to 0 by formation of the transistor isolation structure. Therefore, $C_s$ can be reduced to an extremely small value, the capacitor can be practically or completely omitted, and the capacitor forming step can be made extremely simple or can be completely omitted.

As described above, according to this invention, a DRAM in which data can be read out with high reliability even if the memory cell capacitance is small can be provided by forming a bipolar transistor between the memory cell and the bit line and utilizing the current amplifying operation thereof.

$C_s$, which is necessary for soft error or refreshing, can be reduced to substantially 0 by forming the carrier barrier layer in the substrate and/or using the transistor isolation structure, and the capacitor can be practically or completely omitted so as to simplify or completely omit the capacitor forming step.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 3 is a diagram showing the characteristic of a pnp transistor of FIG. 1;

FIG. 9 is a diagram showing a third modification of the memory cell array shown in FIG. 6 which is applied to a DRAM having a folded bit line structure;

FIG. 14 is a timing chart for illustrating the "0" data writing and reading/rewriting operations of the embodiment shown in FIG. 13;

FIG. 15 is a timing chart for illustrating the "1" data writing and reading/rewriting operations of the embodiment shown in FIG. 13;

FIG. 17 is a diagram showing the construction of a sense amplifier/restore circuit section of FIG. 16;

FIG. 25 is a view showing the cross sectional structure of a fourth modification of the memory cell section shown in FIG. 20;

FIG. 26 is a view showing the cross sectional structure of a memory cell section of a DRAM according to a third embodiment of this invention;

FIG. 27 is a view showing the cross sectional structure of a first modification of the memory cell section shown in FIG. 26;

FIG. 28 is a view showing the cross sectional structure of a second modification of the memory cell section shown in FIG. 26;

FIG. 29 is a view showing the cross sectional structure of a memory cell section of a DRAM according to a fourth embodiment of this invention;

FIG. 30 is a diagram showing the construction of a DRAM core circuit of multiple-divided bit line system having the memory section shown in FIG. 29;

FIG. 32 is a diagram used for deriving the potential difference between a bit line and a dummy bit line in the embodiment of FIG. 30 by use of an analytical method;

FIG. 33 is a diagram showing the result of calculation of the potential difference between the bit line and the dummy bit line with respect to the ratio of the bit line capacitance to the storage capacitance of the cell;

FIG. 34 is a view showing a first modification of the cell structure of FIG. 29;

FIG. 35 is a view showing a second modification in which the collector resistance in the memory section of FIG. 29 is lowered;

FIG. 36 is a view showing a third modification in which the collector resistance in the memory section of FIG. 29 is lowered;

FIGS. 38A to 38C are cross sectional views respectively taken along the lines 38A—38A, 38B—38B and 38C—38C of FIG. 37;

FIG. 39 is a view showing a first modification of the DRAM structure of FIG. 37;

FIGS. 40A to 40C are cross sectional views respectively taken along the lines 40A—40A, 40B—40B and 40C—40C of FIG. 39;

FIGS. 43A to 43C are cross sectional views respectively taken along the lines 43A—43A, 43B—43B and 43C—43C of FIG. 42;

FIG. 44 is a view showing a third modification of the DRAM structure of FIG. 37;

FIG. 45 is a cross sectional view taken along the line 45—45 of FIG. 44;

FIG. 50 is a view showing a fifth modification of the DRAM structure of FIG. 37.

DETAILED DESCRIPTION OF THE PREFERRED EMBODIMENTS

There will now be described an embodiment of this invention with reference to the accompanying drawings.

Figure 1:
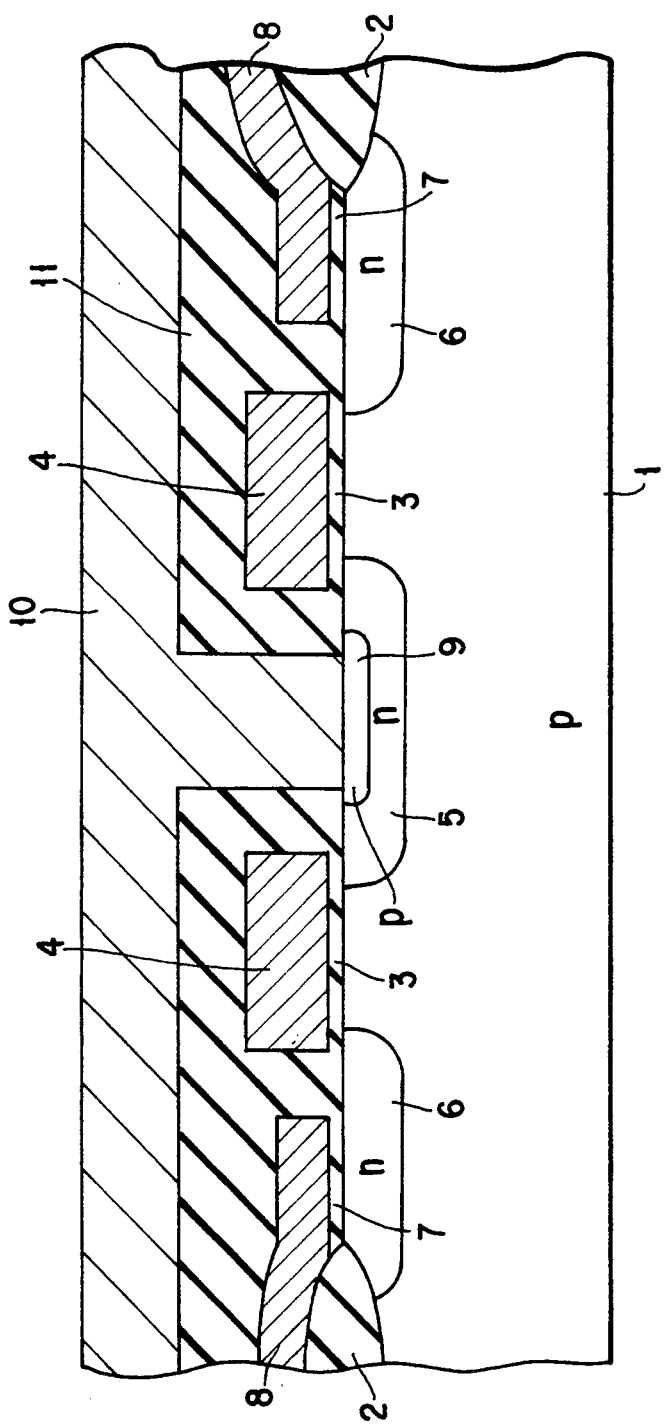
FIG. 1 is a view showing the cross sectional structure of a memory cell section of a DRAM according to a first embodiment of this invention.

FIG. 1 is a view showing the cross sectional structure of a memory cell section including a transistor and a memory cell of a DRAM according to a first embodiment of this invention. The memory section is constructed as follows.

Like the conventional memory cell, gate electrodes 4 of memory cells (MOS transistors) are formed over that area of a p-type silicon substrate 1 which is surrounded by an element isolation insulation film 2 with gate insulation films 3 disposed therebetween. The gate electrode 4 is formed to continuously extend in a direction perpendicular to the drawing of FIG. 1 and used as a word line WL. In the substrate 1, an n-type drain 5 and sources 6 are formed in self-alignment with the gate electrodes 4. Capacitor electrodes 8 acting as a common plate for all of the memory cells are formed over the sources 6 with capacitor insulation films 7 disposed therebetween.

In this invention, a pnp transistor is formed in the drain section of the above memory cell structure, that is, the bit line contact section. More specifically, in FIG. 1, a pnp transistor having a base formed of the n-type drain 5, a collector formed of the p-type silicon substrate 1 and a p-type emitter 9 formed in the surface area of the n-type drain is formed. A bit line 10 is connected to the p-type emitter 9 of the pnp transistor.

As described above, the memory section of the DRAM of this invention is constructed.

Figure 2:
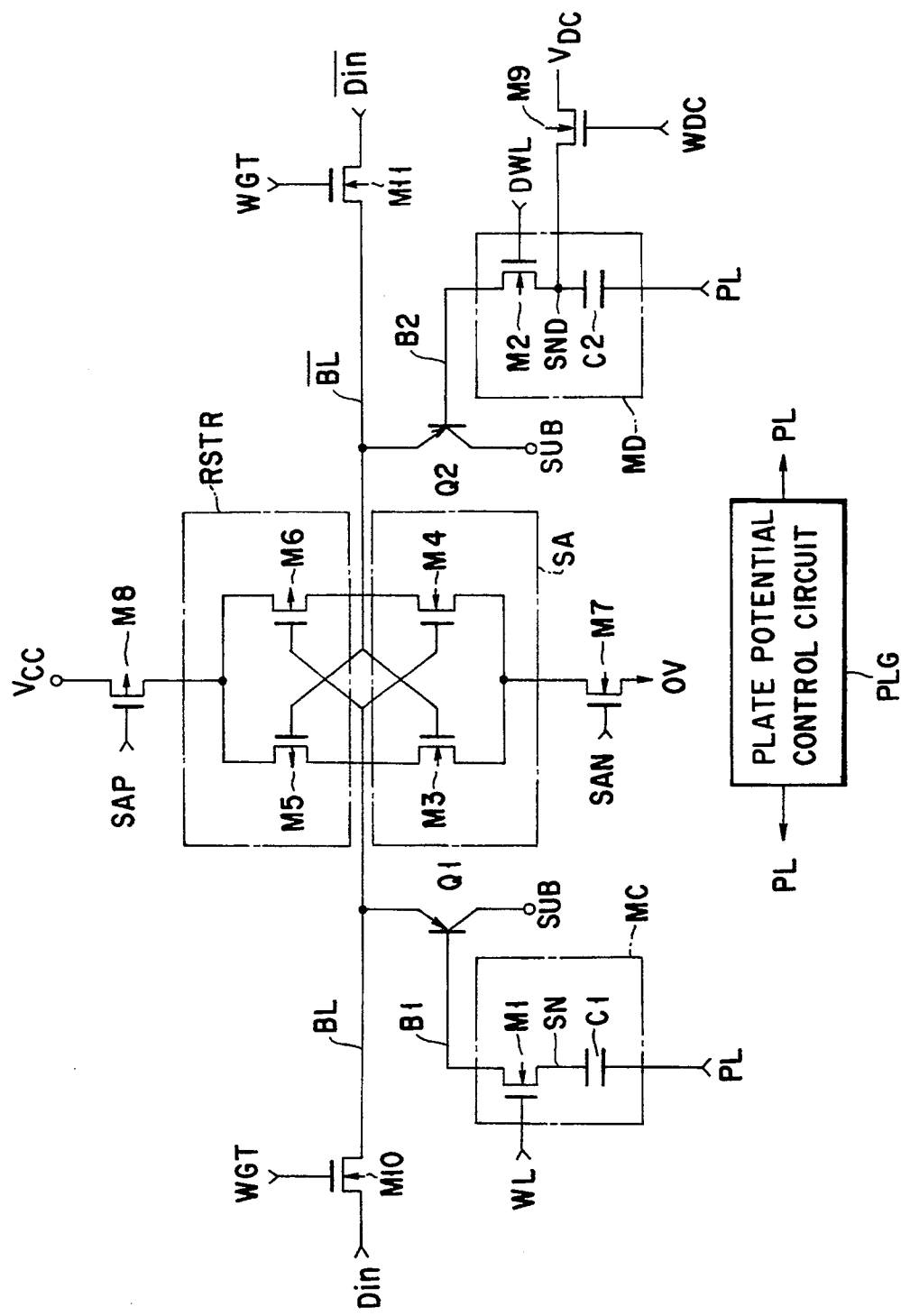
FIG. 2 is a diagram showing the equivalent circuit of the DRAM having the memory cell section shown in FIG. 1.

FIG. 2 is a diagram showing the equivalent circuit of a DRAM having the memory section shown in FIG. 1. The DRAM of FIG. 2 includes one sense amplifier circuit SA and one restore circuit RSTR, a pair of bit lines BL and /BL connected thereto, and a memory cell MC and a dummy cell MD respectively coupled to the bit lines BL and /BL.

The memory cell MC is constructed by an n-channel MOS transistor $M_1$ which is the cell transistor and a capacitor $C_1$ connected to the MOS transistor $M_1$. A connection node SN between the MOS transistor $M_1$ and the capacitor $C_1$ is a storage node and the other node of the capacitor $C_1$ is a plate PL. Likewise, the dummy cell MD is constructed by an n-channel MOS transistor $M_2$ and a capacitor $C_2$. The storage node SND of the dummy cell MD is connected to an n-channel MOS transistor $M_9$ used for setting the dummy cell potential. The gate of the MOS transistor $M_1$ of the memory cell MC is connected to a word line WL and the gate of the dummy cell MD is connected to a dummy word line DWL.

pnp transistors $Q_1$ and $Q_2$ are respectively connected between the drains of the MOS transistors $M_1$ and $M_2$ of the memory cell MC and dummy cell MD on one hand and the bit lines BL and /BL on the other. The emitters of the transistors $Q_1$ and $Q_2$ are respectively connected to the bit lines BL and /BL, the bases thereof are respectively connected to the drains of the MOS transistors $M_1$ and $M_2$ and the collectors thereof are connected to the substrates SUB of the respective MOS transistors $M_1$ and $M_2$. The capacitor plates PL of the memory cell MC and dummy cell MD are connected to a plate potential control circuit PLG for supplying a preset clock in the data write-in mode. In practice, the plate potential control circuit PLG is part of a clock generation circuit formed in a peripheral circuit and generates a clock at preset timings in synchronism with the write-in cycle.

The bit line sense amplifier circuit SA is a flip-flop constructed by n-channel MOS transistors $M_3$ and $M_4$ and the restore circuit RSTR is a flip-flop constructed by p-channel MOS transistors $M_5$ and $M_6$. The common source of the sense amplifier circuit SA is connected to an n-channel MOS transistor $M_7$ for activation control. Likewise, the common source of the restore circuit RSTR is connected to a p-channel MOS transistor $M_8$ for activation control.

The end portions of the bit lines BL and /BL which lie on the data input/output sides are connected to write-in n-channel MOS transistors $M_{10}$ and $M_{11}$, respectively.

FIG. 3 is a diagram showing the base voltage-base current characteristic of the pnp transistor of FIG. 1. $V_{BE}$ indicates a forward rising voltage of the base-emitter junction and $BV_{BE}$ indicates a reverse breakdown voltage of the base-emitter junction.

Next, the operation of the DRAM with the above construction is explained with reference to FIGS. 4 and 5.

Figure 4:
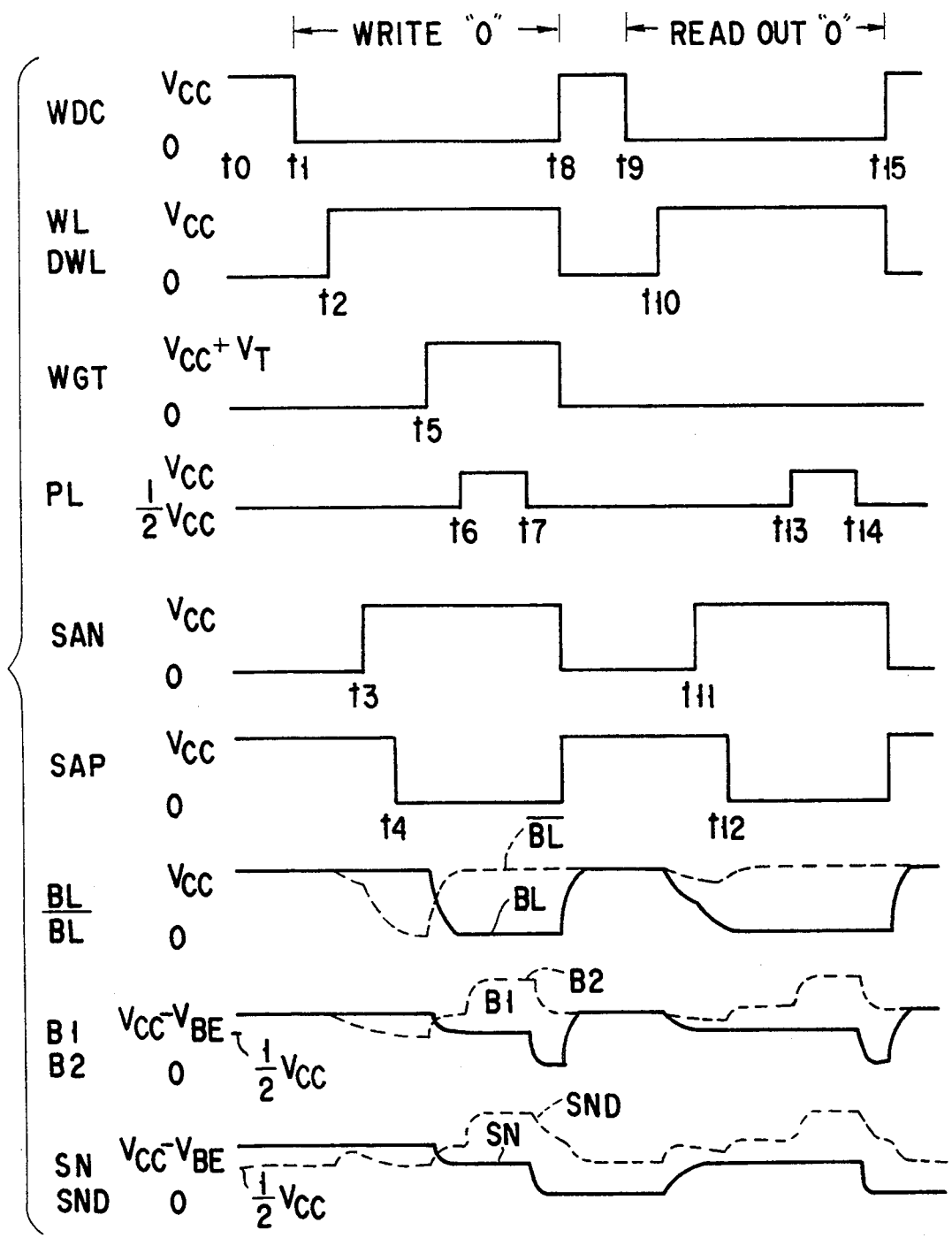
FIG. 4 is a timing chart for illustrating the "0" data writing and reading/rewriting operations of the circuit shown in FIG. 2.
Figure 5:
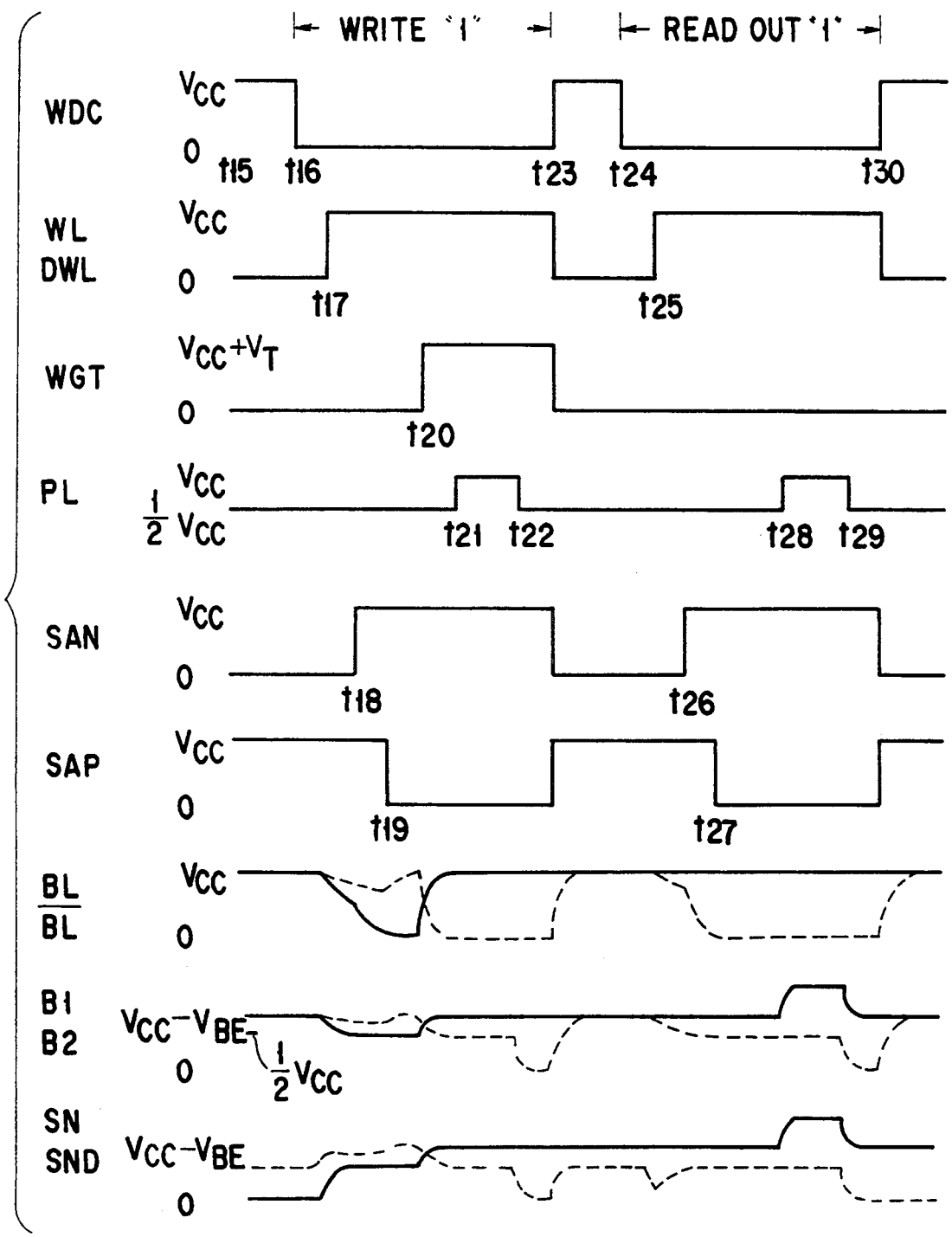
FIG. 5 is a timing chart for illustrating the "1" data writing and reading/rewriting operations of the circuit shown in FIG. 2.

FIG. 4 illustrates the operation of writing "0" data into a memory cell having "1" data stored therein and reading/rewriting the written "0" data.

A period from time $t_0$ to time $t_1$ is a precharge cycle and the bit lines BL and /BL are precharged to a power source potential $V_{cc}$ in this period of time by a precharge circuit (not shown) which is well known in the art.

At this time, the potential of the base nodes $B_1$ and $B_2$ of the pnp transistors $Q_1$ and $Q_2$ is set to $(V_{cc}-V_{BE})$. The storage node SN of the memory cell MC is held at $(V_{cc}-V_{BE})$ corresponding to "1" data. The storage node SND of the dummy cell MD is set to $V_{cc}/2$ via the write-in MOS transistor $M_9$.

After the potential of the gate terminal WDC of the dummy cell write-in MOS transistor $M_9$ is set to an "L" level at time $t_1$, the potentials of the word lines WL and dummy word line DWL rise at time $t_2$. As a result, the MOS transistors $M_1$ and $M_2$ of the memory cell MC and dummy cell MD are turned on and memory cell data and dummy cell data are output to the base nodes $B_1$ and $B_2$. In this case, since the potentials of the storage node SN on the side of the memory cell MC and the base node $B_1$ are set at $(V_{cc}-V_{BE})$, the potentials of the nodes are kept unchanged. Therefore, the potential of the bit line BL is also kept unchanged. Since the potential of the storage node SND is set at $V_{cc}/2$ on the side of the dummy cell MD, the potential of the base node $B_2$ will be varied unless $V_{BE}$ is equal to $V_{cc}/2$. At this time, the potential $V_{B2}$ of the base node $B_2$ is expressed by the following equation.

$$V_{B2} = V_{cc} - V_{BE}(V_{cc} - 2V_{BE})/2(1 + C_{BB}/C_s) \qquad (1)$$

where $C_{BB}$ is a parasitic capacitance associated with the base of the pnp transistor $Q_2$.

When the potential of the base node $B_2$ expressed by the equation (1) becomes lower than $(V_{cc}-V_{BE})$, the pnp transistor $Q_2$ is turned on to permit charges stored on the dummy bit line /BL to be discharged, thereby lowering the potential thereof.

When the sense amplifier circuit SA is activated at time t3, the potential of the dummy bit line /BL is lowered to 0 V as shown by broken lines, then the restore circuit RSTR is activated at time t4 and the potential of the bit line BL is set to $V_{cc}$.

A control signal WGT is set to an "H" level at time t5, transfer gate MOS transistors $M_{10}$ and $M_{11}$ are turned on, and write-in data "0" (0 V) and inverted data "1" ($V_{cc}$) are respectively transferred to the bit line BL and dummy bit line /BL via I/O lines. When the breakdown voltage $BV_{BE}$ between the base and emitter of the pnp transistor $Q_1$ is set to $V_{cc}/2$ and the potential of the base node $B_1$ is higher than $BV_{BE}$, the junction between the base and emitter of the pnp transistor $Q_1$ is broken down and the potential $BV_{BE}$ of the base node $B_1$ is set to $V_{cc}/2$.

When the potential of the plate PL is set from $V_{cc}/2$ to $V_{cc}$ at time t6, the potentials of the base nodes $B_1$ and $B_2$ tend to rise by the capacitive coupling of the capacitors $C_1$ and $C_2$. At this time, the potential of the base node $B_1$ is clamped to $V_{cc}$ since the junction between the base and emitter is broken down and only the potential of the base node $B_2$ rises. Then, when the potential of the plate PL is returned from $V_{cc}$ to $V_{cc}/2$ at time t7, the potential of the base node $B_2$ is returned to ($V_{cc}-V_{BE}$) and the potential of the base node $B_1$ is set to 0 V. That is, data "0" is written into the memory cell MC.

Next, the operation of reading/rewriting data "0" is explained with reference to FIG. 4. A period from time t8 to time t9 indicates a precharge cycle. In this period of time, the bit lines BL and /BL are precharged to ($V_{cc}-V_{BE}$). The potentials of the word line WL and dummy word line DWL rise at time t10 and data items of the memory cell MC and dummy cell MD appear on the base nodes $B_1$ and $B_2$. At this time, the potential of the base node $B_1$ is expressed by the following equation.

$$V_{B1} = V_{cc} - V_{BE}(V_{cc}-V_{BE})/2(1+C_{BB}/C_S) \quad (2)$$

The potential $V_{B2}$ of the base node $B_2$ is expressed by the equation (1). As is understood from the above equations, since $V_{B1}$ is lower than $V_{B2}$ and the collector current of the pnp transistor $Q_1$ on the side of the memory cell MC becomes larger than that of the pnp transistor $Q_2$ on the side of the dummy cell MD, the potential of the bit line BL becomes lower than that of the dummy bit line /BL.

The sense amplifier circuit SA is activated at time t11, the restore circuit RSTR is activated at time t12, the potential of the bit line BL is set to 0 V and the potential of the dummy bit line /BL is set to $V_{cc}$. Thus, data "0" of the memory cell MC is read out. The potential of the plate PL is set from $V_{cc}/2$ to $V_{cc}$ at time t13 and the potential of the plate PL $B_2$ is returned to $V_{cc}/2$ at time t14 so that 0 V or data "0" will be rewritten into the storage node SN of the memory cell MC in the same manner as in the "0" data writing operation.

The operation of writing and reading/rewriting data "1" is explained with reference to FIG. 5.

A period from time t15 to time t16 indicates a precharge cycle. In this period of time, the bit line BL and dummy bit line /BL are precharged to $V_{cc}$ and the base nodes $B_1$ and $B_2$ are precharged to ($V_{cc}-V_{BE}$). In this case, the storage node SN of the memory cell MC is set at the potential 0 V corresponding to data "0" and the potential of the storage node SND is set at $V_{cc}/2$. The potentials of the word line WL and dummy word line DWL rise at time t17 and data items of the memory cell MC and dummy cell MD respectively appear on the base nodes $B_1$ and $B_2$. At this time, the potential $V_{B1}$ of the base node $B_1$ is expressed by the equation (2) and the potential $V_{B2}$ of the base node $B_2$ is expressed by the equation (1). In this case, unlike the "0" data writing operation, the pnp transistor $Q_1$ on the side of the memory cell MC is turned on more deeply than the pnp transistor $Q_2$ on the side of the dummy cell MD so as to permit a large collector current to flow and consequently the potential of the bit line BL is set to be lower than that of the dummy bit line /BL.

The sense amplifier circuit SA is activated at time t18, the restore circuit RSTR is activated at time t19, and the potential of the dummy bit line /BL is set to $V_{cc}$. The control signal WGT rises at time t20, data "1" ($V_{cc}$) to be written and data "0" (0 V) are supplied to the bit line BL and dummy bit line /BL, respectively. When the potential of the plate PL is set from $V_{cc}/2$ to $V_{cc}$ at time t21 and the potential of the plate PL is returned to $V_{cc}/2$ at time t22, the potential of the node SNV of the dummy cell MD is set to 0 V and the potential of the node SN of the memory cell MC is set to ($V_{cc}-V_{BE}$). Thus, "1" data is written into the memory cell MC.

Next, the operation of reading/rewriting data "1" is explained with reference to FIG. 5. A period from time t23 to time t24 indicates a precharge cycle. In this period of time, the bit line BL and dummy bit line /BL are precharged to ($V_{cc}-V_{BE}$). The potentials of the word line WL and dummy word line DWL rise at time t25 and data items of the memory cell MC and dummy cell MD are output to the base nodes $B_1$ and $B_2$. At this time, since the potentials of the nodes SN and $B_1$ are set at ($V_{cc}-V_{BE}$), the potentials of the base node $B_1$ and bit line BL are kept unchanged. The potential $V_{B2}$ of the base node $B_2$ is expressed by the equation (1).

The sense amplifier circuit SA is activated at time t26, the restore circuit RSTR is activated at time t27, a large collector current flows in the pnp transistor $Q_2$ on the side of the bit line BL and the potentials of the bit line BL and dummy bit line /BL are respectively set to $V_{cc}$ and 0 V. Thus, "1" data of the memory cell MC is read out. The potential of the plate PL is set from $V_{cc}/2$ to $V_{cc}$ at time t28 and the potential of the plate PL $B_2$ is returned to $V_{cc}/2$ at time t29 so that the potentials of the node SND and SN will be set to 0 V and ($V_{cc}-V_{BE}$), respectively, and thus data is rewritten into the memory cell MC.

As described above, in the first embodiment, since the operation of discharging bit line charges on the "0" side via the bipolar transistor at the data readout time is effected, the data readout operation can be effected with high reliability even when the capacitance of the capacitor of the memory cell is small. Therefore, it is not necessary to increase the capacitance by using a complicated capacitor structure, thereby making it possible to enhance the integration density of the DRAM. Further, unlike the conventional case, an erroneous readout operation will not occur even when the sense amplifier circuit is activated at a high speed, thus making it possible to attain the high-speed readout operation. In addition, the DRAM can be made highly resistant to noises.

The effect of the first embodiment is explained by use of specific numerals. In the normal system, a signal difference ΔV between the bit line and dummy bit line is expressed by the following equation.

$$\Delta V = V_{cc}/2(1+C_B/C_s) \quad (3)$$

When $C_B=600$ fF, $C_s=30$ fF and $V_{cc}=3.3$ V, then $\Delta V=79$ mV.

In this embodiment, the signal differences $\Delta V_{B0}$ and $\Delta V_{B1}$ appearing on the base of the bipolar transistor at the "0" and "1" data readout times are respectively expressed by the following equations.

$$\Delta V_{B0} = V_{cc}/2(1+C_{BB}/C_s) \quad (4)$$

$$\Delta V_{B1} = (V_{cc}-V_{BE})/2(1+C_{BB}/C_s) \quad (5)$$

When $C_B=600$ fF, $C_s=30$ fF, $V_{cc}=3.3$ V and $V_{BE}=0.6$ V, then $\Delta V_{B0}=1.2$ V and $\Delta V_{B1}=0.79$ V. If the performance of the bipolar transistor is sufficiently high and charges stored on the bit line can be discharged at a sufficiently high speed by means of the bipolar transistor, a difference between the potential differences $\Delta V_{B0}$ and $\Delta V_{B1}$ becomes equal to the potential difference of the bit lines as it is. Therefore, the sensitivity which is higher than 10 times the sensitivity in the conventional system can be attained.

In the first embodiment, the plate potential is clocked between $V_{cc}/2$ and $V_{cc}$, but the clocking potential is not limited to the above values. When data which is held and inverted data thereof are written, the clocking potential difference may be set to be higher than the breakdown voltage $V_{BE}$ so that the junction between the base and emitter of the bipolar transistor can be broken down by the clocking operation.

Figure 6:
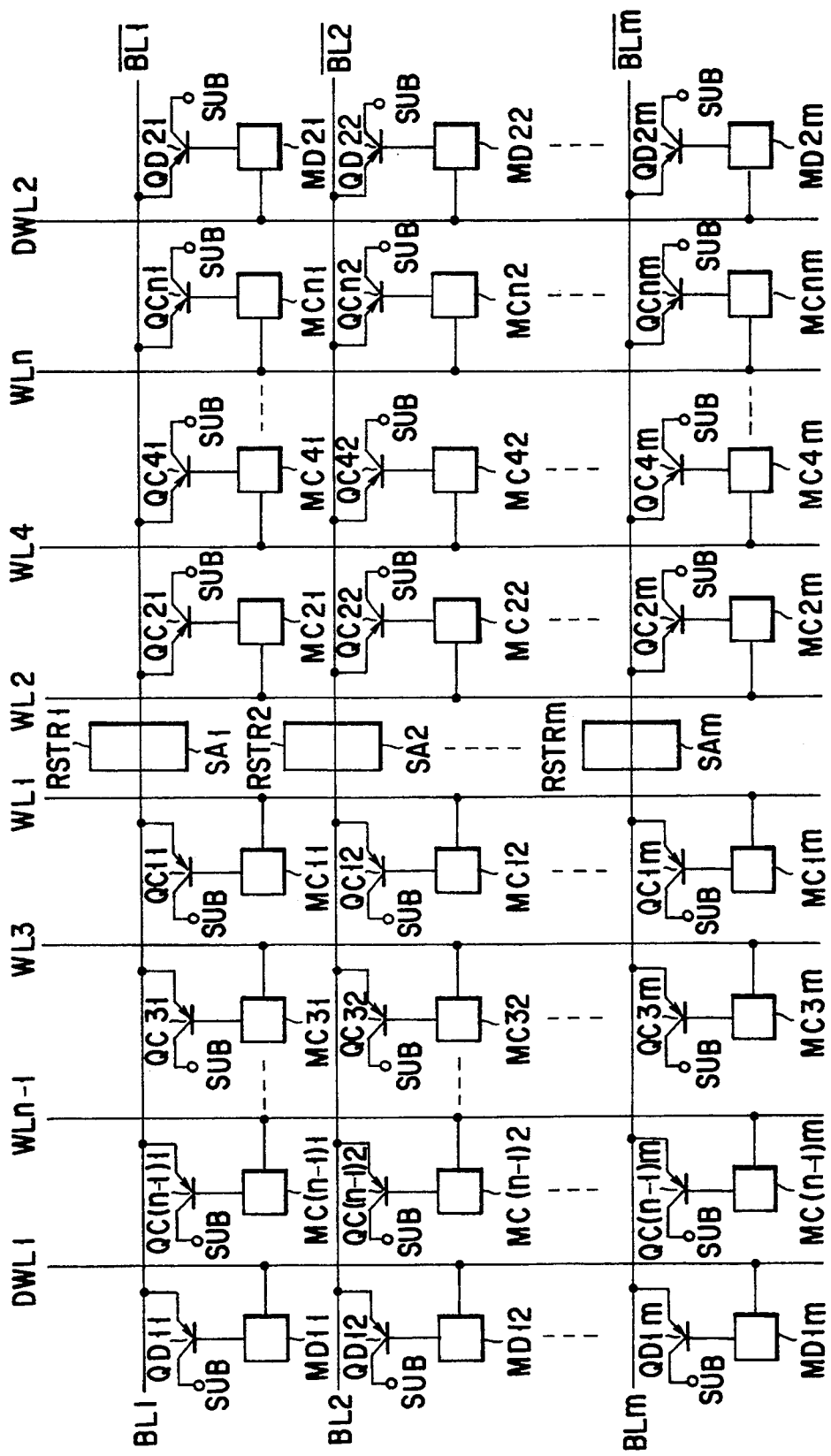
FIG. 6 is a diagram showing a memory cell array using the DRAM shown in FIG. 2.

FIG. 6 is a diagram showing the whole construction set when the cell array whose main portion is shown in FIG. 2 is laid out in the open bit line configuration. In FIG. 6, n memory cells $MC_{1i}$ to $MC_{ni}$ are arranged along i-th (i=1 to m) bit lines BL and /BL, pnp transistors $QC_{1i}$ to $QC_{ni}$ are respectively connected to the memory cells $MC_{1i}$ to $MC_{ni}$, and m memory cells $MC_{j1}$ to $MC_{jm}$ are arranged along a j-th (j=1 to n) word line WL. The plate is commonly used by all of the memory cells in this embodiment.

Figure 7:
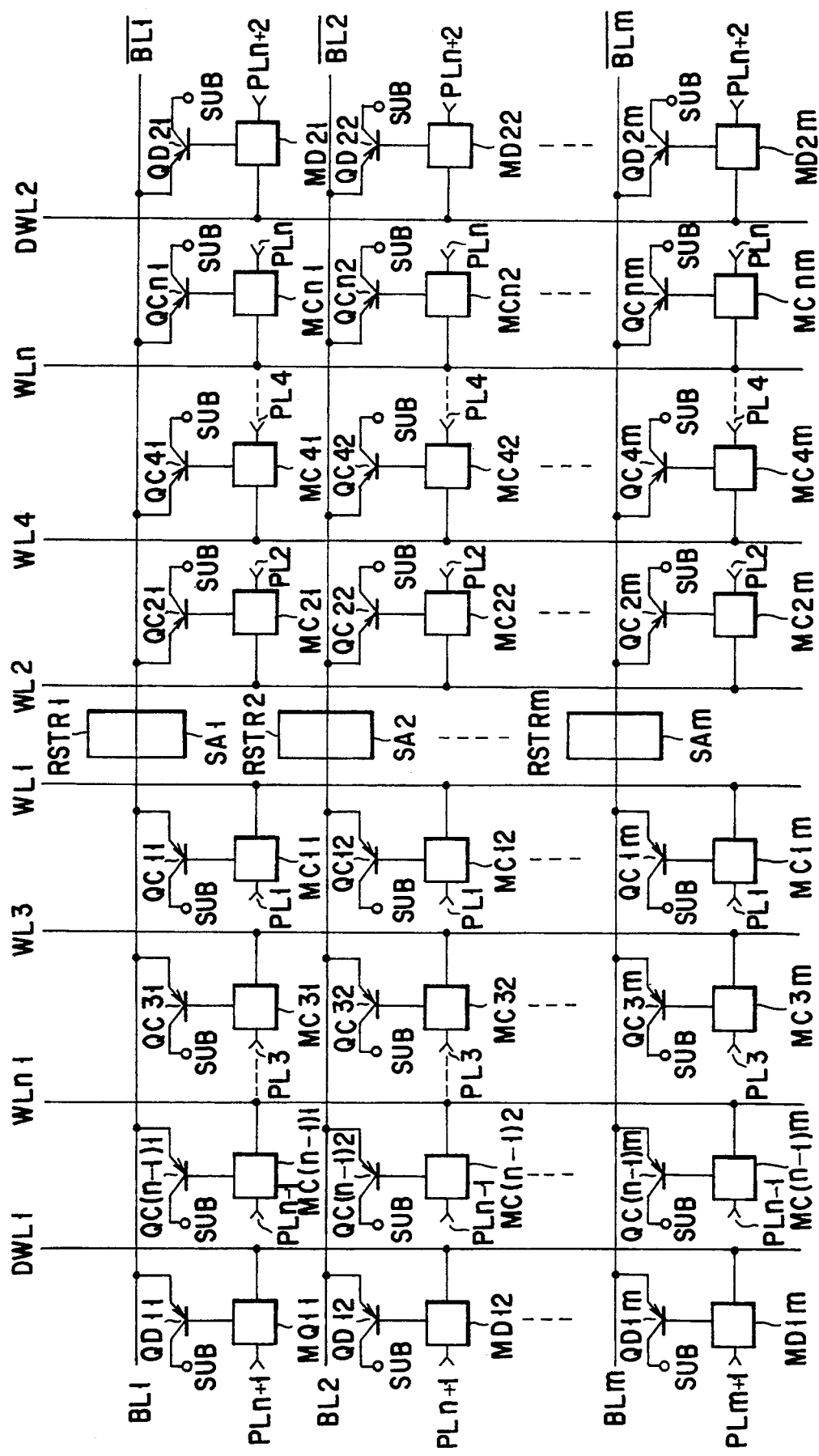
FIG. 7 is a diagram showing a first modification of the memory cell array shown in FIG. 6 in which the plate is divided and separately controlled.

FIG. 7 is a diagram showing a first modification of the memory cell array of FIG. 6 in which the plate is divided and separately controlled. In FIG. 7, the plate PL is divided for each word line WL and one of the plates PL is commonly used for the memory cells arranged along a corresponding one of the word lines WL. When the plate is divided in this way, the capacitance of each plate is reduced, thereby making it possible to enhance the driving speed of the plate potential.

Figure 8:
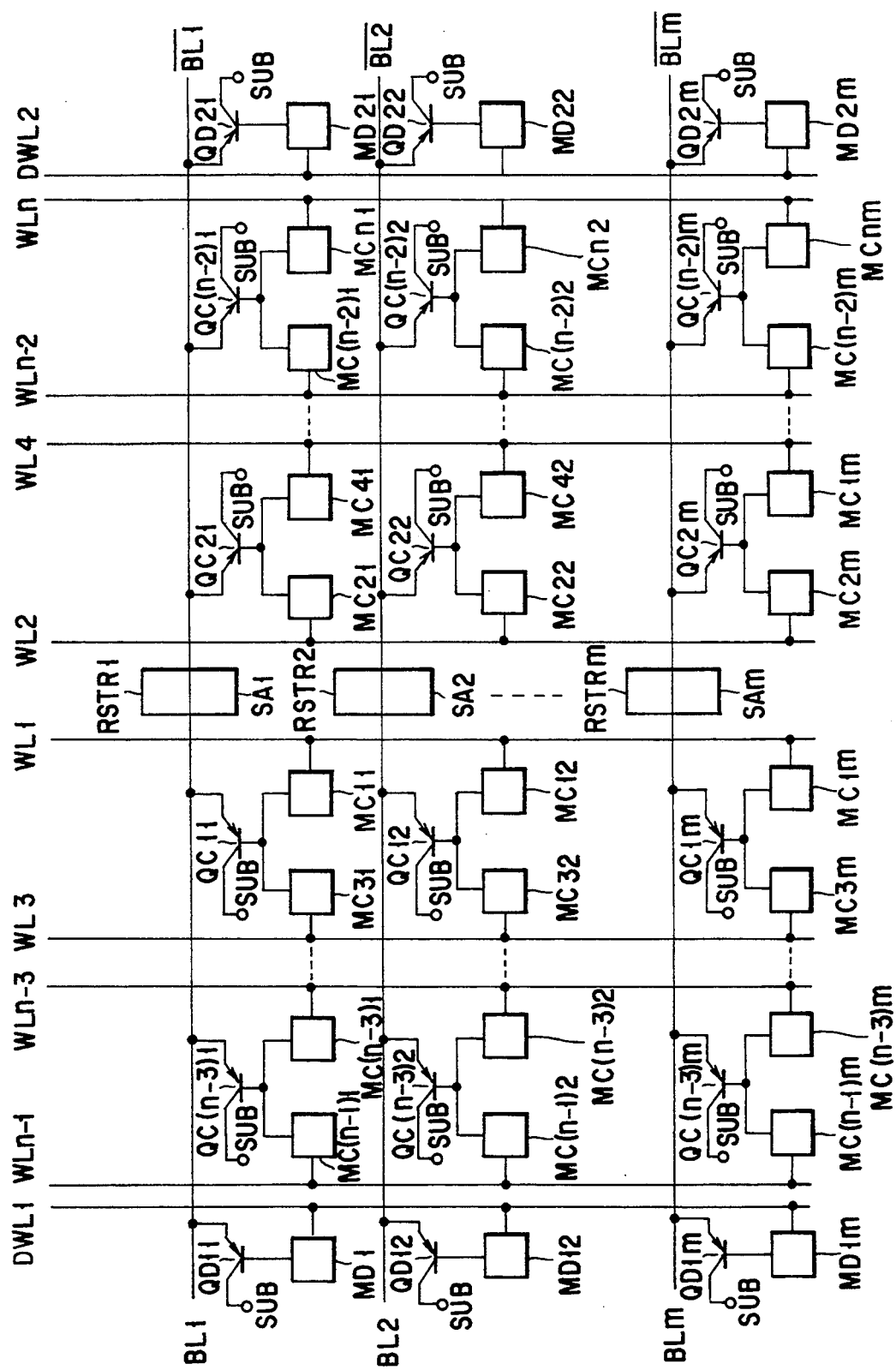
FIG. 8 is a diagram showing a second modification of the memory cell array shown in FIG. 6 in which a bipolar transistor is commonly used by two memory cells.

FIG. 8 is a diagram showing a second modification of the memory cell array of FIG. 6 in which a bipolar transistor is commonly used by two memory cells. In FIG. 8, two memory cells driven by adjacent word lines commonly use one bipolar transistor. The plate may be commonly used for all of the memory cells or may be divided as shown in FIG. 7.

FIG. 9 is a diagram showing a third modification of the memory cell array of FIG. 6 in which the DRAM is formed with the folded bit line structure. In FIG. 9, memory cells are laid out in the folded bit line configuration with one bipolar transistor commonly used by two memory cells. Also, in this embodiment, the plate may be commonly used for all of the memory cells or may be divided as shown in FIG. 7. It is also possible to lay out the memory cells in a folded bit line configuration with one bipolar transistor provided for each memory cell.

Figure 10:
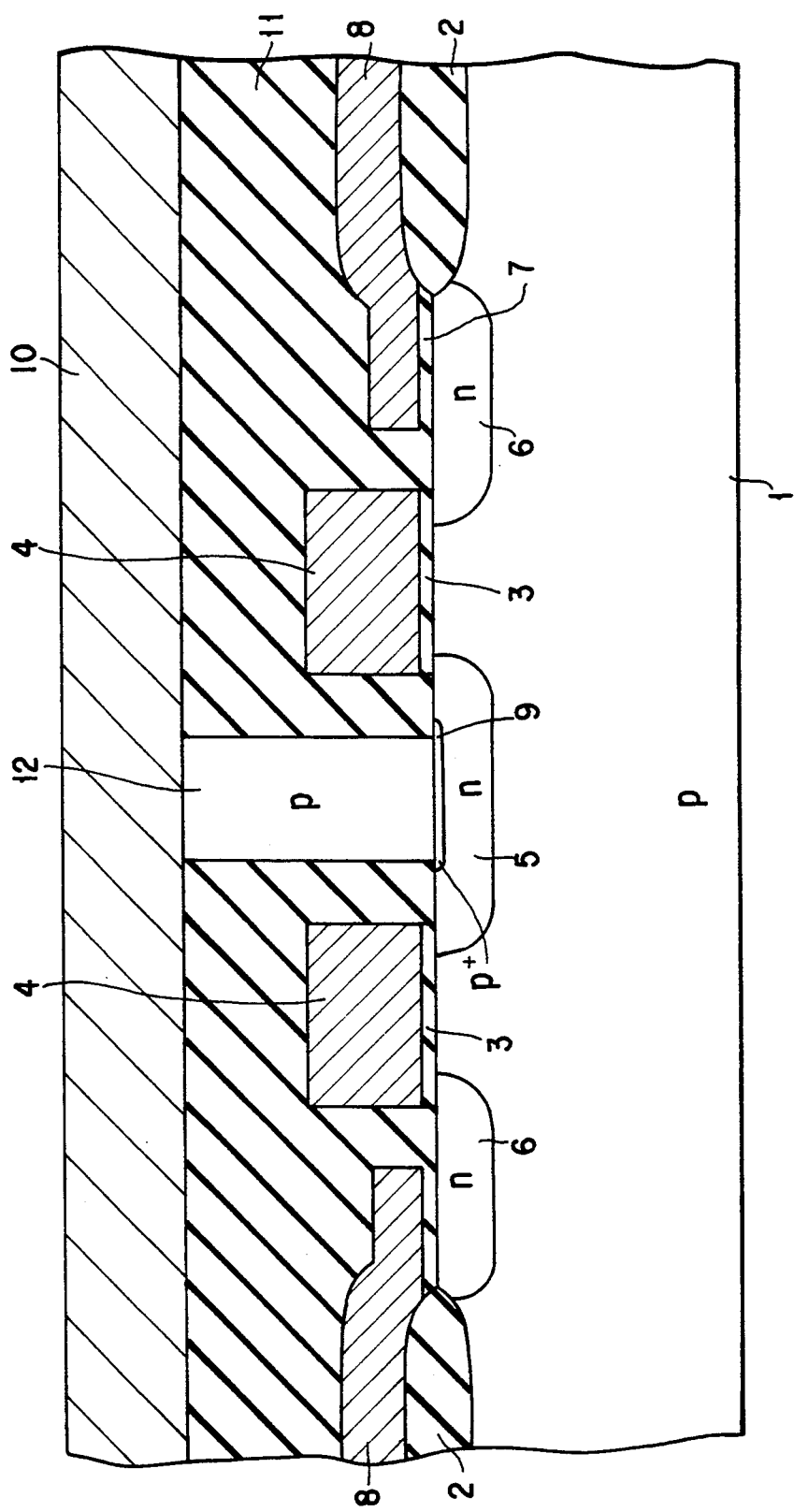
FIG. 10 is a view showing the cross sectional structure of the memory cell section of the DRAM according to the first modification of the DRAM shown in FIG. 1.

FIG. 10 is a diagram showing the cross sectional structure of a memory cell section of a DRAM according to a first modification of the memory cell section of FIG. 1. As shown in FIG. 10, a p-type polysilicon layer 12 is filled in a bit line contact hole formed in an insulation film 11. Breakage of the bit line 10 formed of metal at a stepped portion can be prevented by filling the p-type polysilicon layer 12 in the contact hole.

Figure 11:
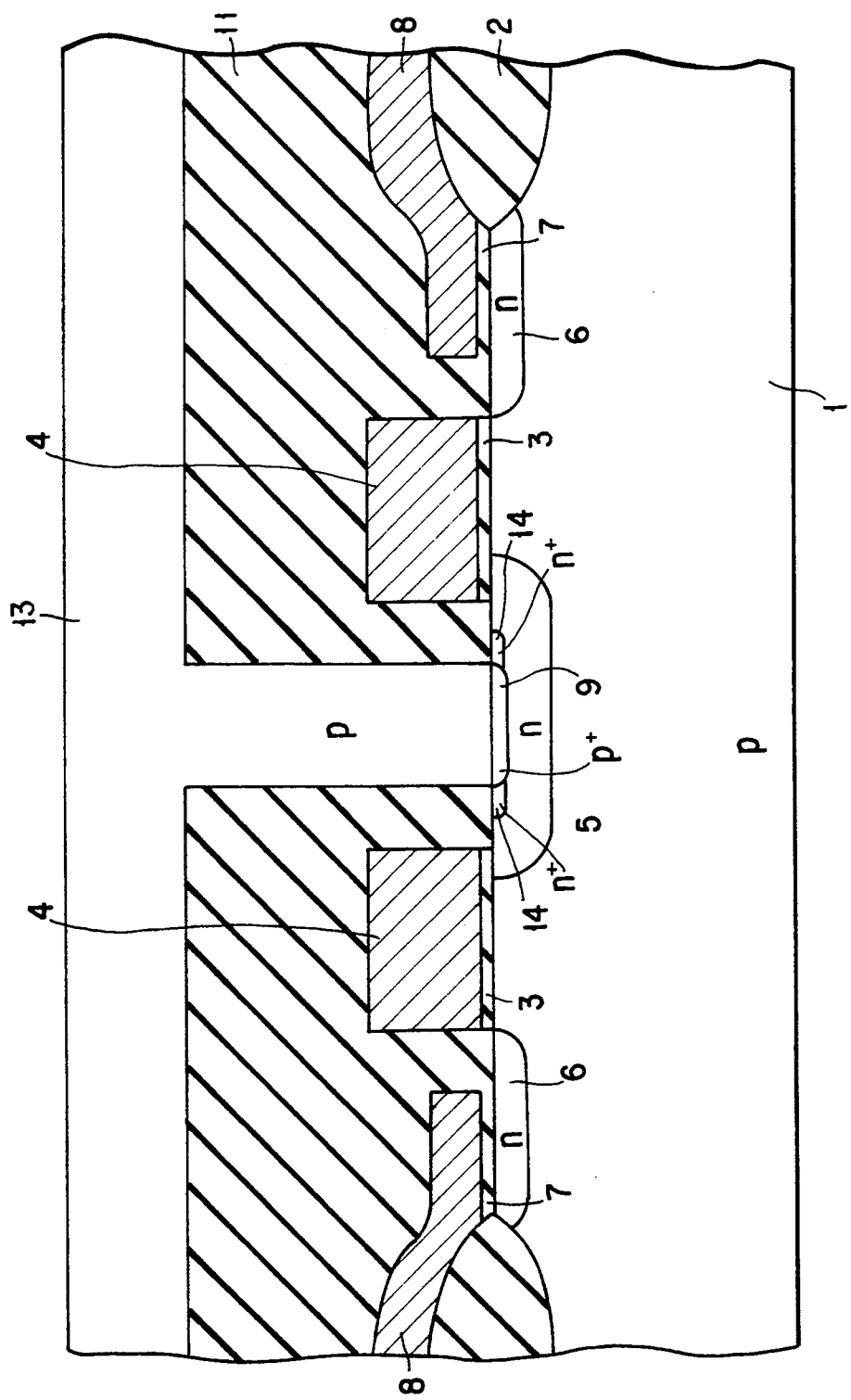
FIG. 11 is a view showing the cross sectional structure of the memory cell section of the DRAM according to the second modification of the DRAM shown in FIG. 1.

FIG. 11 is a diagram showing the cross sectional structure of a memory cell section of a DRAM according to a second modification of the memory cell section of FIG. 1. As shown in FIG. 11, not only the contact portion but also the entire portion of the bit line 13 are formed of a p-type polysilicon layer. An n-type layer 14 of high impurity concentration is formed around the p-type emitter layer 9. With this structure, the breakdown voltage $V_{BE}$ of the junction between the base and emitter of a pnp transistor can be lowered, thereby making it easier to effect the write-in operation.

Figure 12:
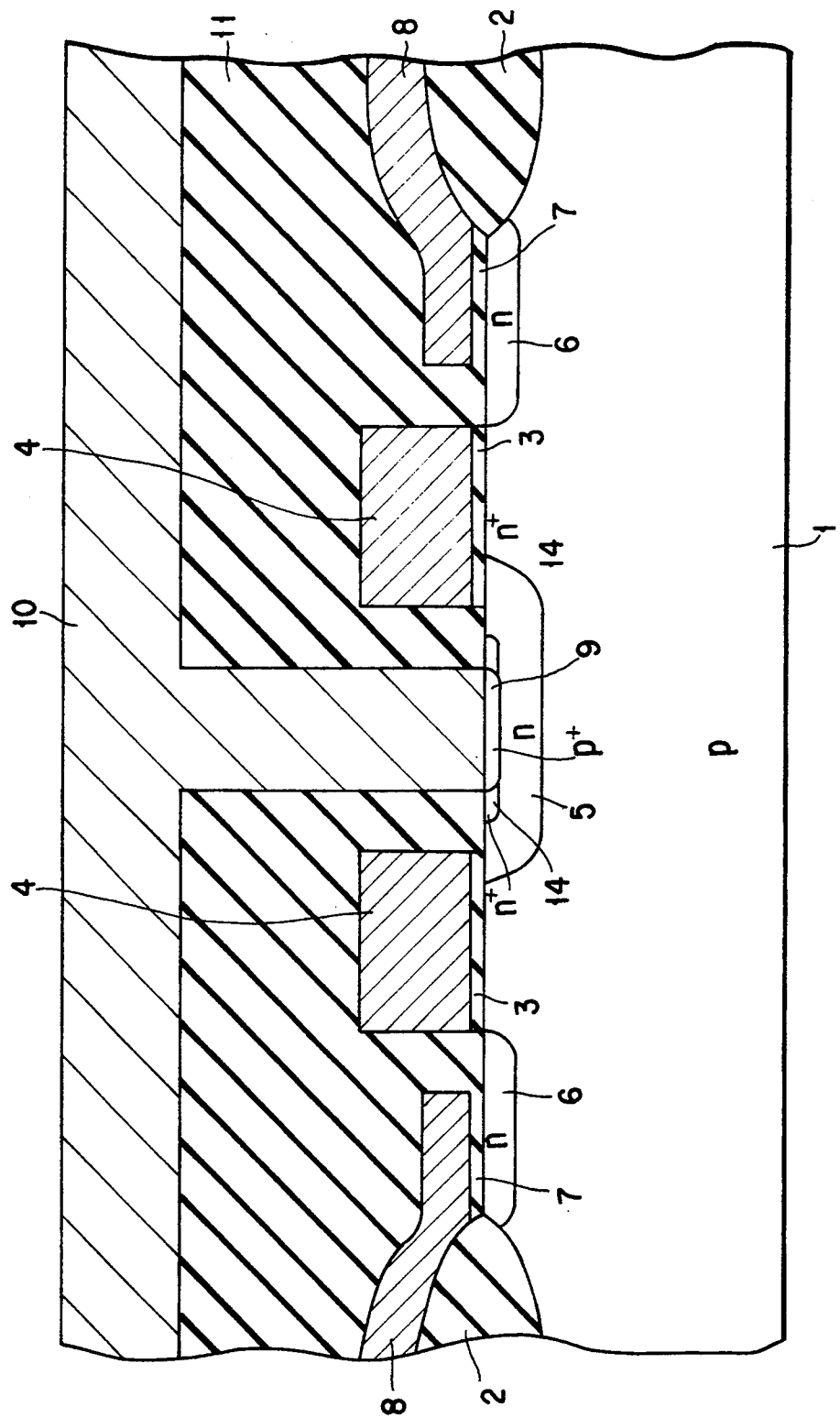
FIG. 12 is a view showing the cross sectional structure of the memory cell section of the DRAM according to the third modification of the DRAM shown in FIG. 1.

FIG. 12 is a diagram showing the cross sectional structure of a memory cell section of a DRAM according to a third modification of the memory cell section of FIG. 1. As shown in FIG. 12, like the structure of FIG. 11, an n-type layer 14 of high impurity concentration is formed around the p-type emitter layer 9 in the structure of FIG. 1 in which the bit line 10 formed of only metal is provided.

Figure 13:
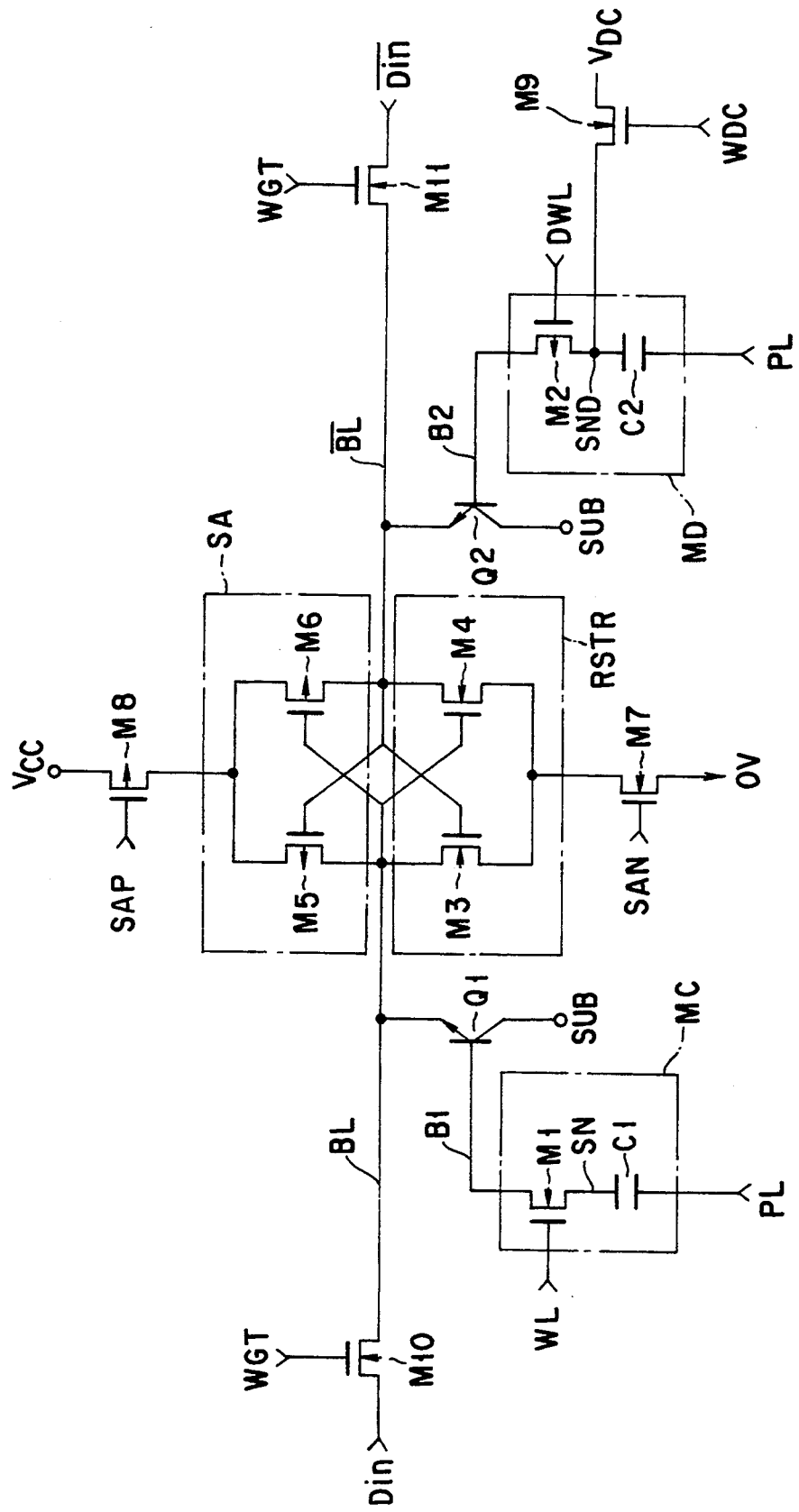
FIG. 13 is an equivalent circuit diagram showing the construction of a modification obtained by inverting the conductivity types of respective portions of the circuit shown in FIG. 2.

FIG. 13 is an equivalent circuit diagram showing the structure of a modification obtained by inverting the conductivity types of respective portions of the circuit of FIG. 2. In FIG. 13, portions which are the same as those of FIG. 2 are denoted by the same reference numerals, and transistors $M_1$ and $M_2$ respectively constituting the memory cell MC and dummy cell MD are each formed of a p-channel MOS transistor, the sense amplifier circuit SA is constructed by p-channel MOS transistors $M_5$ and $M_6$, and the restore circuit RSTR is constructed by n-channel MOS transistors $M_3$ and $M_4$. The bipolar transistors $Q_1$ and $Q_2$ provided between the memory cell MC and dummy cell MD on one hand and the bit lines BL and /BL on the other are each formed of an npn transistor.

The readout and write-in operations in the DRAM of the embodiment of FIG. 13 is explained with reference to FIGS. 14 and 15. Also, a case wherein data which is inverted data of stored data is written is explained.

FIG. 14 is a timing chart for illustrating the "0" data writing and reading/rewriting operations.

The bit lines BL and /BL are precharged to 0 V in a precharge cycle of time $t_0$ to time $t_1$. At this time, base nodes $B_1$ and $B_2$ are precharged to $V_{BE}$. At time $t_2$, the potentials of the word line WL and dummy word line DWL rise and data of the memory cell MC appears on the bit line BL. The sense amplifier circuit SA is activated at time $t_3$ and the restore circuit RSTR is activated at time $t_4$. At time $t_5$, a control signal WGT rises, and data "0" (0 V) and data "1" ($V_{cc}$) are respectively supplied to the bit line BL and dummy bit line /BL. The potential of the plate PL falls from $V_{cc}/2$ to 0 V at time $t_6$ and is returned to $V_{cc}/2$ at time $t_7$. If the breakdown voltage $BV_{BE}$ of the junction between the base and emitter of the npn transistor is $V_{cc}/2$, the potential of the storage node SND on the side of the dummy cell MD and the potential of the storage node SN on the side of the memory cell MC are respectively set to $V_{cc}$ and $V_{BE}$ based on the same principle as that in the former embodiment. As described above, the operation of writing "0" data into the memory cell MC is effected.

In the reading/rewriting operation, the potentials of the word line WL and dummy word line DWL rise at time $t_{10}$ after the precharge cycle of time $t_8$ to time $t_9$ and then data items of the memory cell MC and dummy cell MD appear on the base nodes $B_1$ and $B_2$. As a result, the npn transistors are operated and corresponding data items appear on the bit lines BL and /BL. At this time, the npn transistor $Q_2$ on the side of the dummy cell MD is more deeply turned on so that the potential of the dummy bit line /BL will be set higher than the potential of the bit line BL. At time $t_{11}$, the sense amplifier circuit SA is activated and the restore circuit RSTR is activated at time $t_{12}$ to amplify the bit line data. After this, the plate potential is clocked from $V_{cc}/2$ to 0 V at time $t_{13}$ and is clocked to $V_{cc}/2$ at time $t_{14}$, thus permitting data to be rewritten.

Next, the operation of writing "1" data and reading and rewriting stored data is explained with reference to FIG. 15. Like the case of FIG. 5, the "1" data writing operation is effected by inverting "0" data and writing the inverted data. After the precharge cycle of time $t_{15}$ to time $t_{16}$, the potentials of the word line WL and dummy word line DWL rise at time $t_{17}$. At time $t_{18}$, the sense amplifier circuit SA is activated and the restore circuit RSTR is activated at time $t_{19}$ to amplify the bit line potential. Data "1" to be written is supplied to the bit line BL at time $t_{20}$, and the clocking of the potential of the plate PL in a period of time $t_{21}$ to time $t_{22}$ permits $V_{cc}$ to be written into the storage node SN of the memory cell MC.

In the reading/rewriting operation, the potentials of the word line WL and dummy word line DWL rise at time $t_{10}$ after the precharge cycle of time $t_{23}$ to time $t_{24}$ and then data items of the memory cell MC and dummy cell MD appear on the base nodes $B_1$ and $B_2$ and are supplied to the bit lines BL and /BL by means of the npn transistors. At time $t_{25}$, the sense amplifier circuit SA is activated and the restore circuit RSTR is activated at time $t_{26}$ to amplify the bit line data. After this, the plate potential is clocked from $V_{cc}/2$ to 0 V at time $t_{28}$ and is clocked to $V_{cc}/2$ at time $t_{29}$, thus permitting data to be rewritten.

With the DRAM cell array using the p-channel MOS transistors and npn transistors as described above, the same layout as that shown in FIGS. 6 to 9 can be used.

A method of reducing the bit line contact by serially connecting a plurality of memory cells to constitute a memory cell unit in the DRAM is known. This method has an advantage that the cell area can be reduced, but has a disadvantage that the reliability of the data readout operation is lowered. Data of the memory cell unit is sequentially read out starting from the memory cell which is disposed nearer to the bit line and the thus readout data is stored in a register. When data of the memory cell which is disposed far from the bit line is read out, the capacitance of the other memory cells lying between the former memory cell and the bit line is added to the bit line capacitance. As a result, the effective bit line capacitance is increased, that is, the amount of effective memory cell charges is reduced, causing an erroneous readout operation.

In the DRAM of this invention, since memory cell data can be read out by use of the current amplifying operation of the bipolar transistor, a significant effect can be attained when it is applied to a DRAM of a system in which the memory cell unit is constructed as described above.

Figure 16:
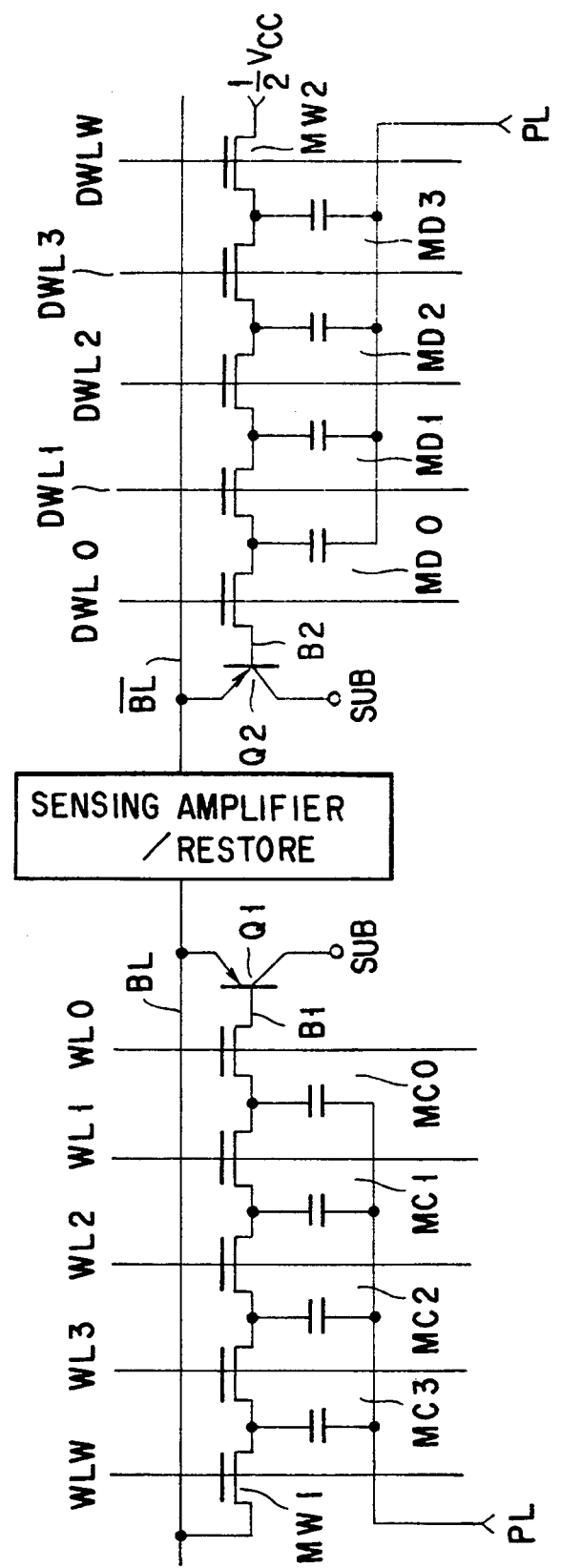
FIG. 16 is a diagram showing the construction in which a bipolar transistor is applied to a DRAM with memory cell unit structure.

FIG. 16 is a diagram showing the construction obtained by using bipolar transistors in a DRAM of the memory cell unit structure. In FIG. 16, one memory cell unit constructed by four memory cells $MC_0$ to $MC_3$ connected to the bit line BL and one dummy cell unit constructed by four dummy cells $MD_0$ to $MD_3$ connected to the dummy bit line /BL are shown. Like the first embodiment, the drains of the MOS transistors on one side of the memory cell unit and dummy cell unit are respectively connected to the bases of pnp transistors $Q_1$ and $Q_2$. The storage node on the other side of the memory cell unit is connected to the bit line BL via a data writing MOS transistor $MW_1$ and the other end of the dummy cell unit is supplied with $V_{cc}/2$ via a writing MOS transistor $MW_2$.

FIG. 17 is a diagram showing an example of a concrete construction of the sense amplifier/restore circuit section of FIG. 16. In this construction, a current mirror type CMOS differential amplifier circuit DA is used as the sense amplifier/restore circuit and two input nodes thereof are respectively connected to the bit line BL and dummy bit line /BL via transfer gate MOS transistors $M_{21}$ and $M_{22}$. A register REG for temporarily storing data read out from the memory cell unit is connected to upper bit lines GBL and /GBL connected to output lines of the differential amplifier circuit DA. An equalizing circuit EQ for setting the bit lines BL and /BL to the precharge potential $V_{PRE}$ is connected to the bit lines BL and /BL and an equalizing MOS transistor $M_{35}$ is connected to the upper bit lines GBL and /GBL.

Like the first embodiment, it is possible to use a flip-flop type sense amplifier/restore circuit in the section of the differential amplifier circuit DA. The reason why the differential amplifier circuit DA is used in this embodiment is that the register REG for temporarily storing readout data is provided and it is not necessary to use a latch type circuit in the sense amplifier/restore circuit section if the register is constructed as a latch type circuit capable of setting an amplitude ranging from 0 V to the power source potential $V_{cc}$. The register REG may be formed of dynamic type if it is constructed to set an amplitude ranging from 0 V to $V_{cc}$.

Figure 18:
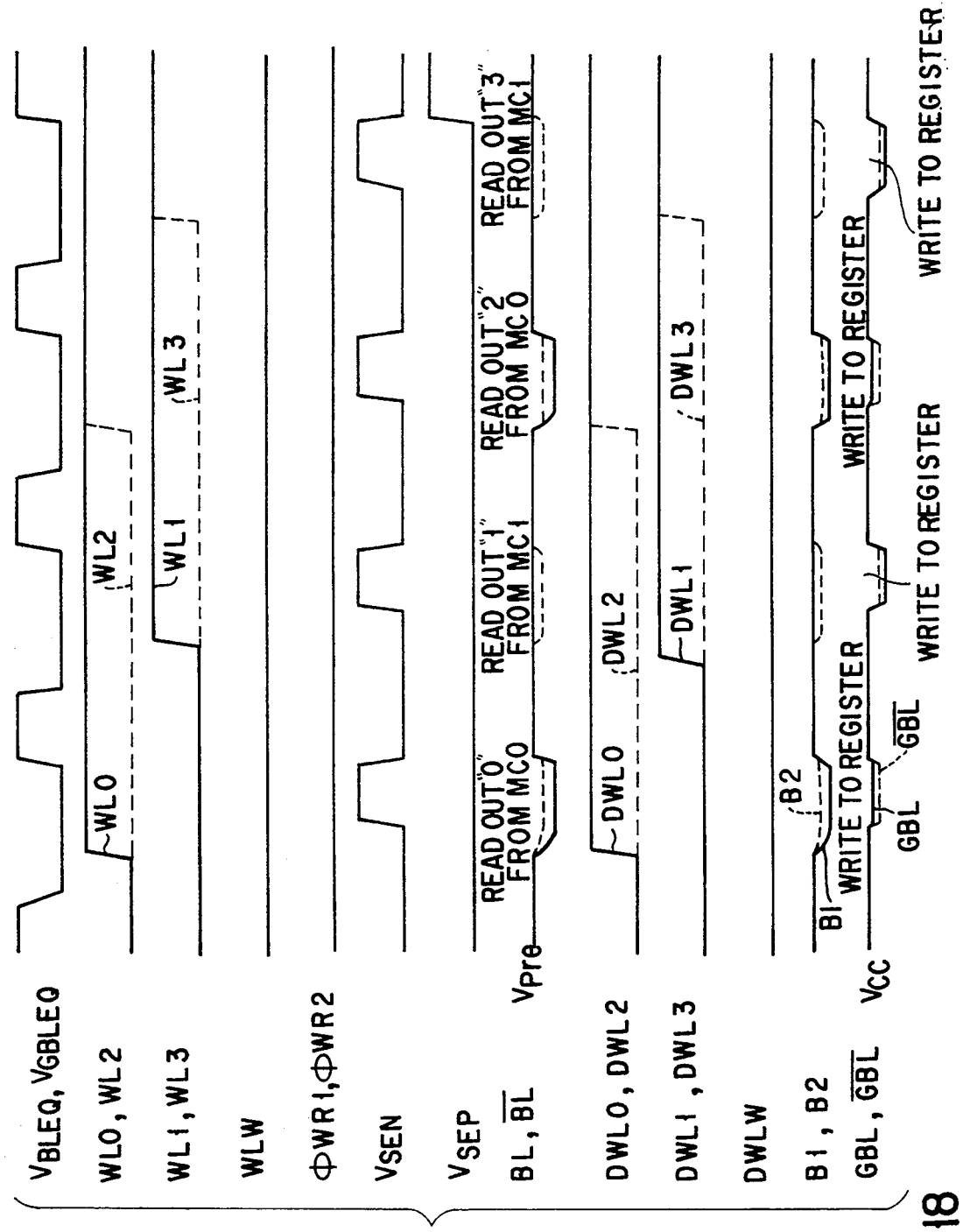
FIG. 18 is a timing chart for illustrating the data readout operation of the circuit shown in FIG. 16.

FIG. 18 is a timing chart for illustrating the readout operation of the DRAM of FIG. 16. In the initial state, $V_{cc}/2$ is stored into all of the dummy cells $MD_0$ to $MD_3$ in the dummy cell unit. The potentials of the upper bit lines GBL and /GBL are equalized by means of the equalizing MOS transistor $M_{35}$ and the potentials of the bit lines BL and /BL are equalized to the precharge potential $V_{PRE}$ by means of the equalizing circuit EQ. The precharge potential $V_{PRE}$ may be set to a value which is larger than the sum of the write-in potential $V_{cc}/2$ of the dummy cell and the forward voltage $V_{BE}$ between the base and emitter of the pnp transistor and is set to $V_{cc}$, for example. At this time, like the first embodiment, the base nodes $B_1$ and $B_2$ of the pnp transistors $Q_1$ and $Q_2$ are precharged to $(V_{PRE}-V_{BE})$.

When the readout cycle is started, the equalizing MOS transistor $M_{35}$ connected to the upper bit lines GBL and /GBL is first turned off, the equalizing circuit EQ of the bit lines BL and /BL is also set in the OFF state, and the potentials of the word line $WL_0$ and dummy word line $DWL_0$ are raised in order to read out first data. When data of the memory cell $MC_0$ is "0", the potential of the base node $B_1$ on the side of the bit line BL is set to be lower than the potential of the base node $B_2$ on the side of the dummy bit line /BL so as to turn on the pnp transistor $Q_1$. At this time, since the amount of charges drawn from the emitter of the pnp transistor $Q_1$ into the collector thereof is set to $h_{FE}$ times the amount of charges attracted to the base of the pnp transistor, the discharging operation of the bit line BL is effected at a high speed. Data read out and supplied to the bit lines BL and /BL is amplified by the current mirror type differential amplifier circuit DA by turning on the transistors $M_{26}$ to $M_{29}$ and stored into the register REG. After the data storage into the register REG is completed, the upper bit lines GBL and /GBL are equalized and the bit lines BL and /BL are equalized.

Next, the data readout operation of the memory cell $MC_1$ is effected. The data readout method is the same as that effected for the memory cell $MC_0$. In FIG. 18, a case wherein data of the memory cell $MC_1$ is "1" is shown. At this time, the voltage drop of the bit line BL is smaller than that of the dummy bit line /BL. After this, data readout operations for the memory cells $MC_2$ and $MC_3$ are sequentially effected and the readout data is stored into the register REG.

Figure 19:
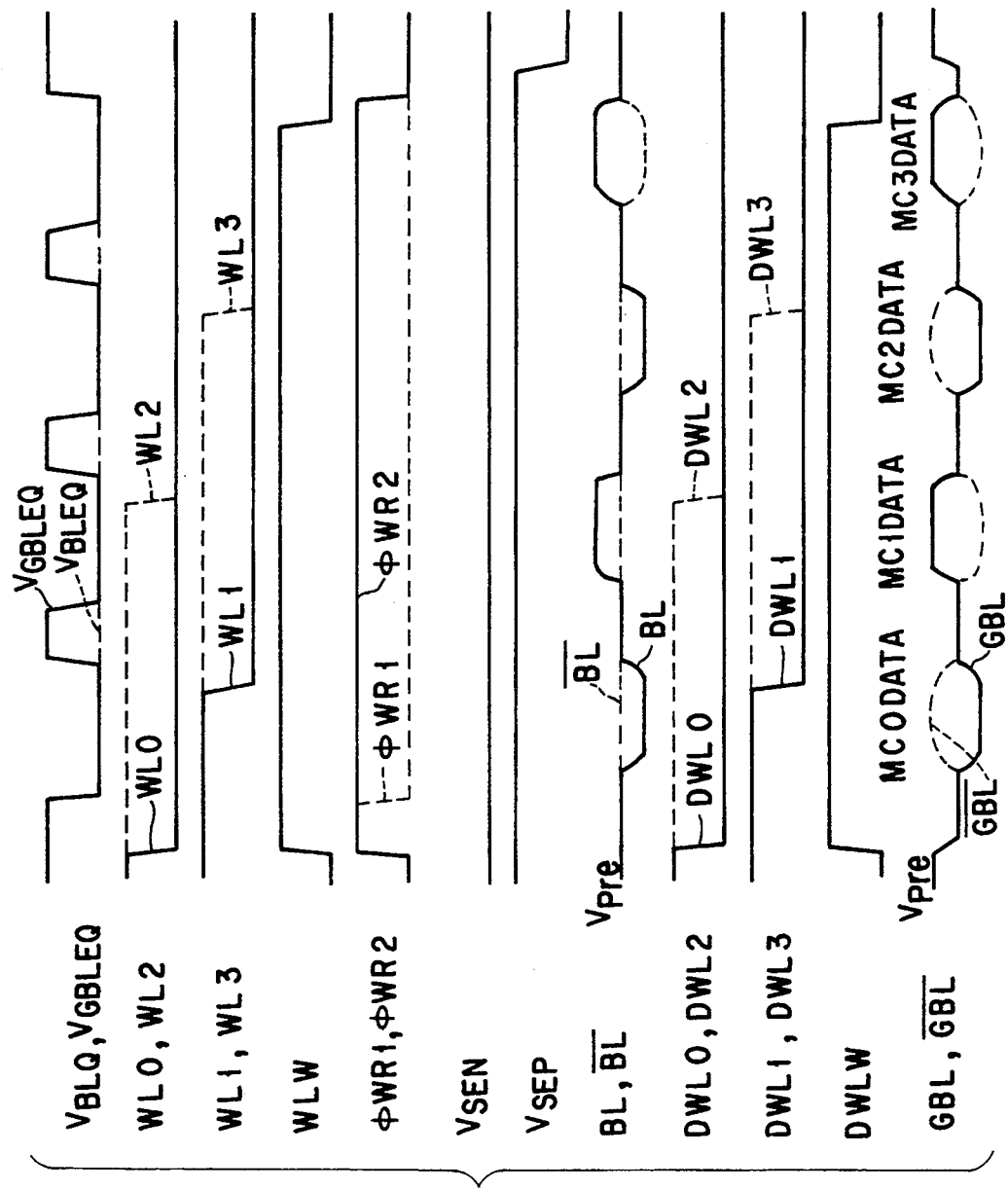
FIG. 19 is a timing chart for illustrating the data write-in operation of the circuit shown in FIG. 16.

FIG. 19 is a timing chart for illustrating the write-in operation of the DRAM of FIG. 16. In the initial state, the differential amplifier circuit DA is kept in the deactivated state. The potentials of the word lines $WL_0$ to $WL_3$ and the dummy word lines $DWL_0$ to $DWL_3$ are all kept at the "H" level. The upper bit lines GBL and /GBL are equalized and the bit lines BL and /BL are equalized. When the write-in cycle is started, the potentials of the word line $WL_0$ and the dummy word line $DWL_0$ fall and the potentials of the write-in word line $WL_W$ and dummy word line $DWL_W$ rise so as to set the memory cell into the write-in state.

After this, the equalizing MOS transistor $M_{35}$ and the equalizing circuit EQ are set into the OFF state to read out data to be written into the memory cell $MC_0$ from the register REG. The data is transferred to the bit line BL via the transfer gate MOS transistor $M_{21}$ and then written into the memory cell $MC_0$ via the writing MOS transistor $MW_1$ and the cell transistors of the memory cells $MC_3$, $MC_2$ and $MC_1$. Then, the potentials of the word line $WL_1$ and dummy word line $DWL_1$ fall to complete the write-in operation. At this time, $V_{cc}/2$ is written into the dummy cell $MD_0$.

After this, the operations of writing data into the memory cells $MC_1$, $MC_2$ and $MC_3$ are sequentially effected. When data is written into the final memory cell $MC_3$, the MOS transistor $M_{22}$ is turned on to permit data which takes an inverted form of data of the bit line BL to be written into the dummy bit line /BL. Thus, the $V_{cc}/2$ precharge potential used for the next readout operation can be set by setting the equalizing circuit EQ into the activated state. The write-in operation is the same in a case where data is written from the exterior and in a case where the readout data is rewritten.

As described above, according to the above embodiment, in a system having a memory cell unit constructed by serially connecting a plurality of memory cells, the current amplifying operation of the bipolar transistor is effected for reading memory cell data and therefore it can be considered that the bit line capacitance as viewed from the memory cell side is reduced, thus making it possible to provide a DRAM free from the erroneous readout operation and having high reliability.

Figure 20:
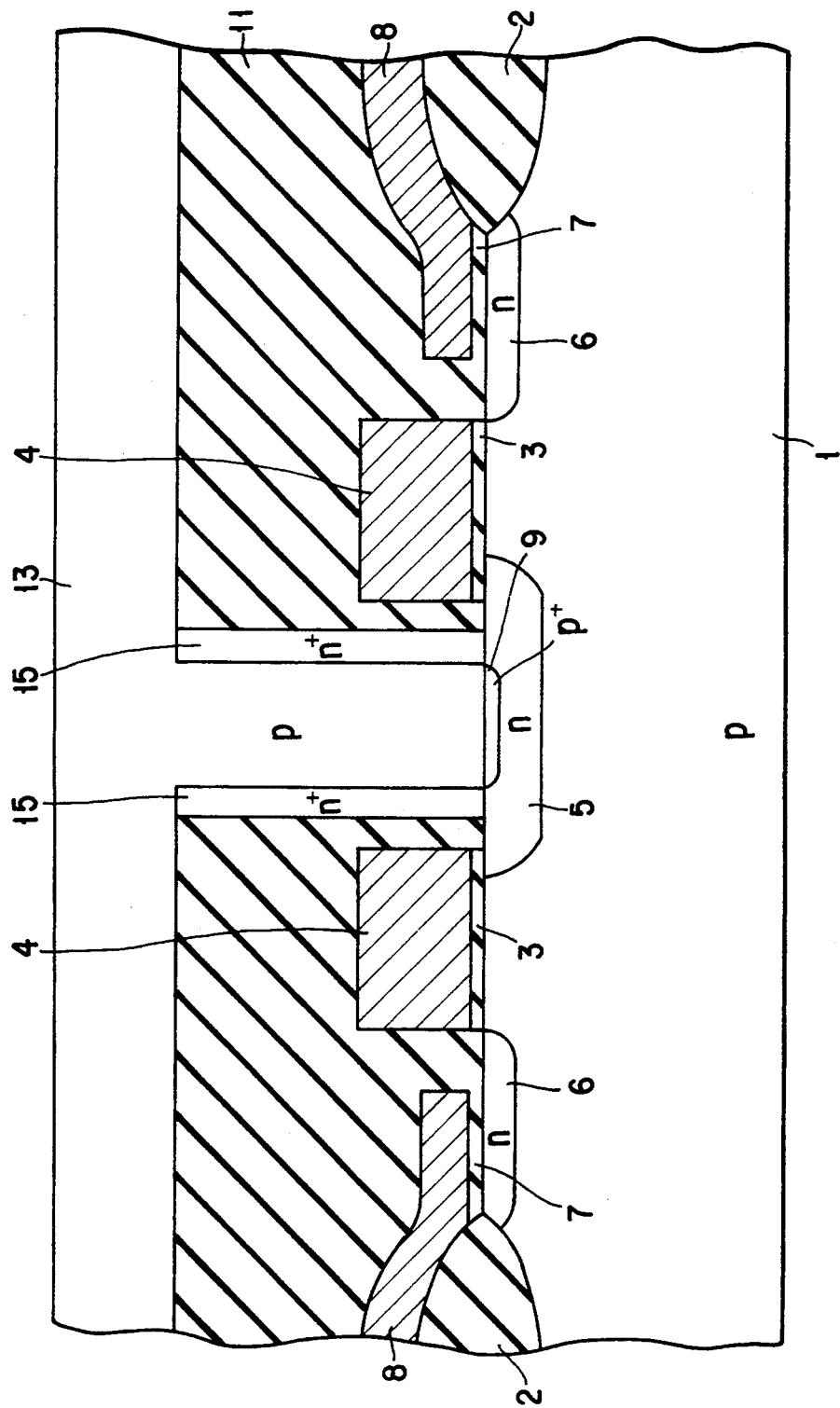
FIG. 20 is a view showing the cross sectional structure of a memory cell section of a DRAM according to a second embodiment of this invention.

FIG. 20 is a view showing the cross sectional structure of a memory cell section of a DRAM according to a second embodiment of this invention. In FIG. 20, an n-type layer 15 of high impurity concentration is formed on the side wall portion of the bit line contact hole in the embodiment in which the bit line 13 is partly formed of the p-type polysilicon layer. The n-type layer 15 of high impurity concentration functions as a resistor of high resistance for connecting the base and emitter of the pnp transistor to each other.

Figure 21:
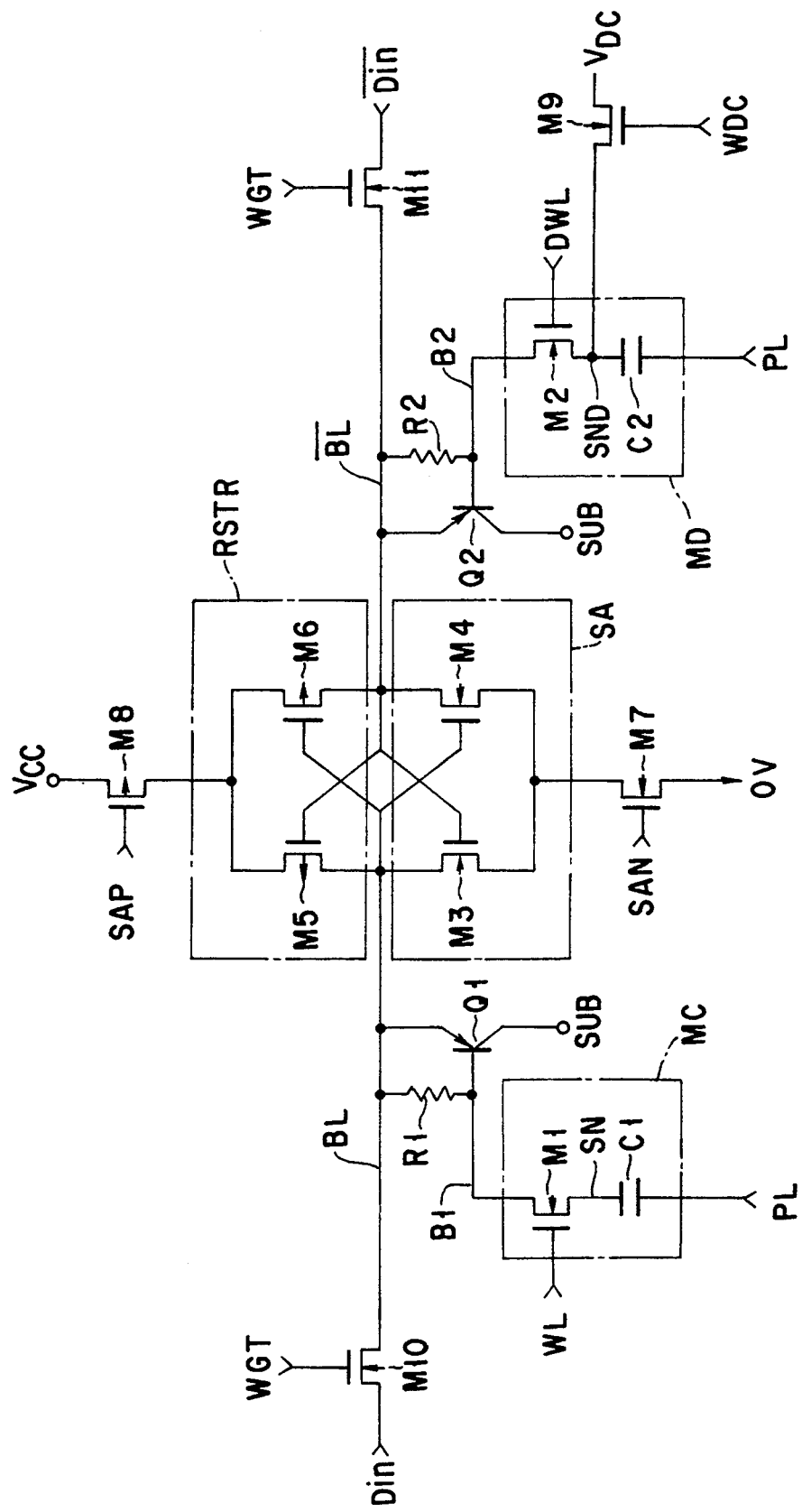
FIG. 21 is a diagram showing an equivalent circuit of a DRAM which has the memory cell section of FIG. 20 and which does not require the plate potential control.

FIG. 21 is a diagram showing an equivalent circuit of a DRAM which has the memory cell section of FIG. 20 and which does not require the plate potential control. Unlike the case of FIG. 2, in this embodiment, resistors $R_1$ and $R_2$ of sufficiently high resistance are respectively connected between the bases and emitters of the pnp transistors $Q_1$ and $Q_2$.

As described above, when the resistors $R_1$ and $R_2$ are inserted, the data writing operation can be effected without effecting the clocking operation with respect to the plate PL of the capacitor as in the first embodiment, that is, without breaking down the junction between the base and emitter of the pnp transistor.

Figure 22:
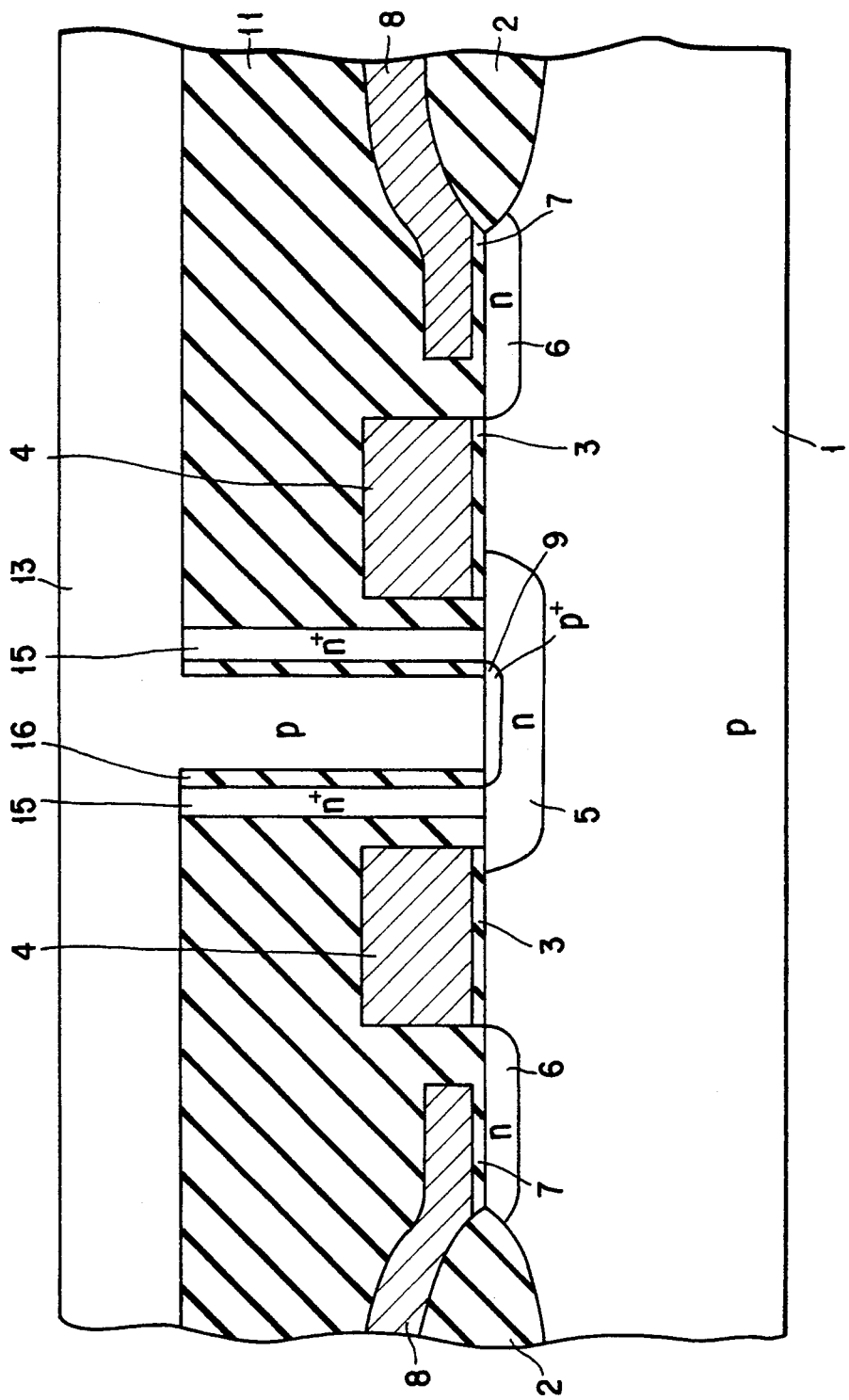
FIG. 22 is a view showing the cross sectional structure of a first modification of the memory cell section shown in FIG. 20.

FIG. 22 is a view showing the cross sectional structure of a first modification of the memory cell section shown in FIG. 20. In this modification, an insulation film 16 is formed between the n-type layer 15 of high impurity concentration and the p-type layer of the contact portion of the bit line 13 in the structure of FIG. 20.

Figure 23:
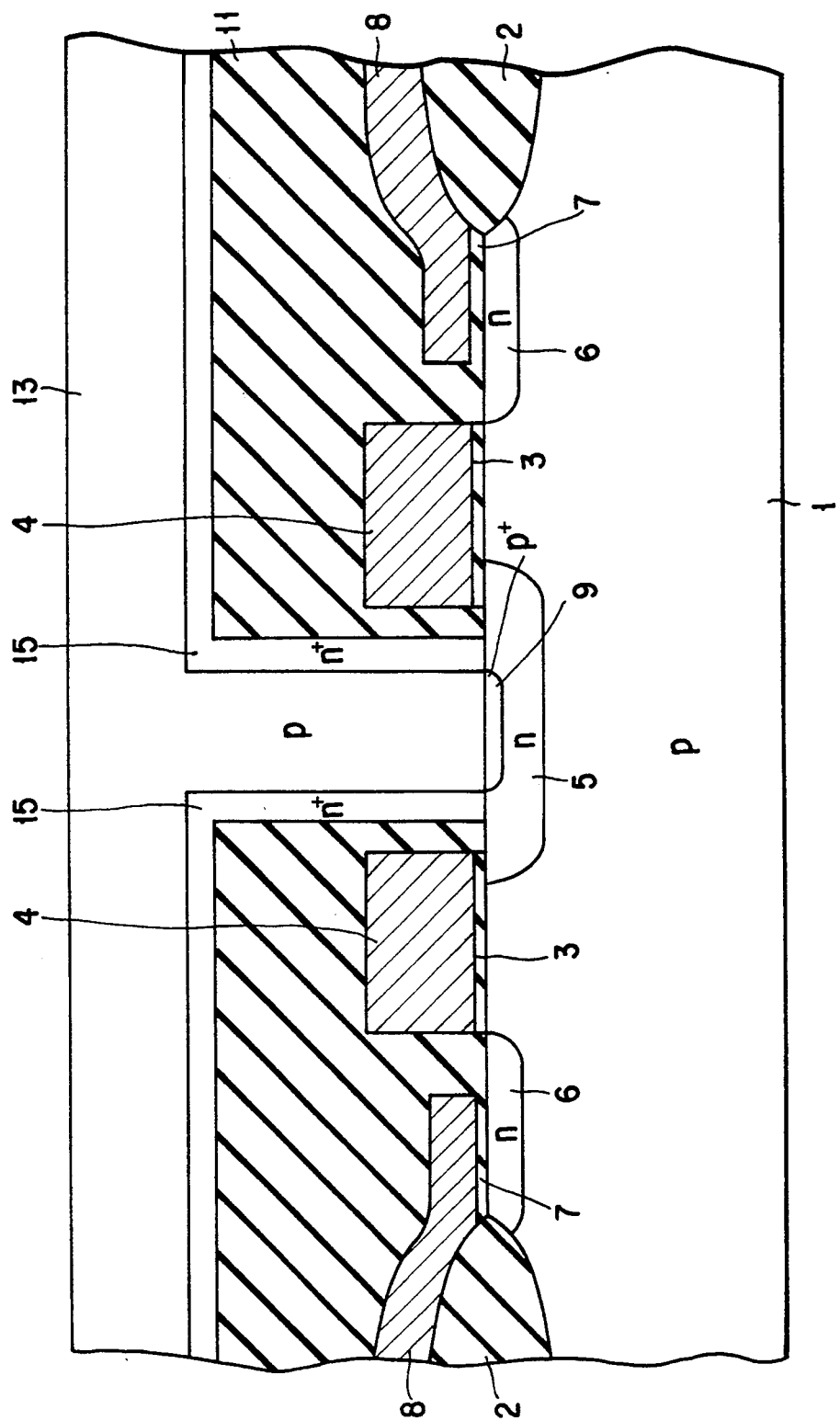
FIG. 23 is a view showing the cross sectional structure of a second modification of the memory cell section shown in FIG. 20.

FIG. 23 is a view showing the cross sectional structure of a second modification of the memory cell section shown in FIG. 20. In this modification, the n-type layer 15 of high impurity concentration is formed not only on the contact portion but also on the entire portion of the rear surface of the bit line 13 in the structure of FIG. 20.

Figure 24:
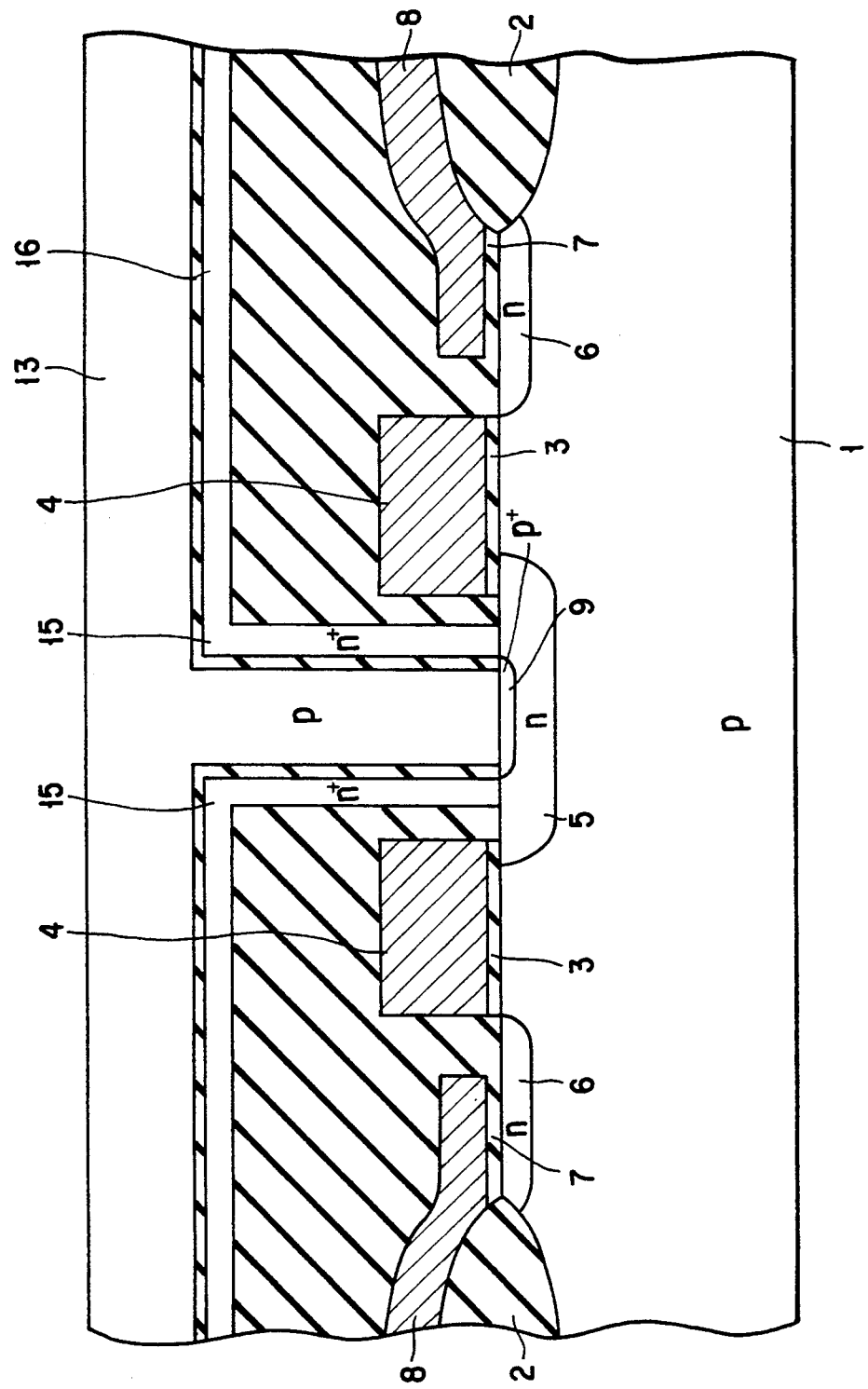
FIG. 24 is a view showing the cross sectional structure of a third modification of the memory cell section shown in FIG. 20.

FIG. 24 is a view showing the cross sectional structure of a third modification of the memory cell section shown in FIG. 20. In this modification, an insulation film 16 of silicon oxide film, for example, is formed between the bit line 13 formed of p-type polysilicon and the n-type layer 15 of high impurity concentration in the structure of FIG. 20.

FIG. 25 is a view showing the cross sectional structure of a fourth modification of the memory cell section shown in FIG. 20. In this modification, the contact portion of the n-type drain is formed in a convex form and a p-type emitter layer 9 is formed on the surface of the convex portion.

FIGS. 26 to 28 are views showing a third embodiment in which this invention is applied to a DRAM of memory cell structure having surrounded gate transistors (SGT). Column-shaped silicon layers 20 are formed in each memory cell area by forming grooves in the silicon substrate 1. An n-type source layer 6 used as a storage node is formed in the peripheral portion of the bottom portion of each column-shaped silicon layer 20 and a plate 8 is formed in the bottom portion of each groove with a capacitor insulation film 7 disposed therebetween. A gate electrode 4 is formed to surround that portion of the column-shaped silicon layer which lies above the plate 8 with a gate insulation film 3 disposed between the column-shaped silicon layer and the gate electrode and an n-type drain layer 5 is formed on each of the column-shaped silicon layer 20. A p-type emitter layer 9 of a pnp transistor is formed on the surface of the n-type drain layer 5 and the p-type emitter layer 5 is connected to the bit line 10.

FIG. 26 is a view showing the cross sectional structure of a memory cell section of a DRAM according to a third embodiment of this invention, and in this case, a metal bit line 10 formed of Al, for example, is used.

FIG. 27 is a view showing the cross sectional structure of a first modification of the memory cell section shown in FIG. 26, and in this case, a bit line 13 formed of p-type polysilicon is used.

FIG. 28 is a view showing the cross sectional structure of a second modification of the memory cell section shown in FIG. 26. In FIG. 26, the surface of the p-type emitter layer 9 is set at substantially the same level as the surface of the buried insulation film so as to provide a flat structure and then the bit line 10 is formed, but in FIG. 28, the p-type emitter layer 9 is formed to project from the surrounding buried insulation film and the bit line 10 is formed also in contact with the side surface of the emitter layer 9.

Next, an embodiment of multiple-divided bit line system is explained.

FIG. 29 is a view showing the cross sectional structure of a memory cell section of a DRAM according to a fourth embodiment of this invention. The structure of the DRAM is explained below.

A gate 42 which is used as a word line is formed over an n well 40 formed in an n-type substrate or p-type substrate with an insulation film 41 disposed between the gate and the n well. Next, p-type diffusion layers 43 serving as a source and a drain are formed and a storage electrode 44 of the capacitor is formed. Further, a plate 46 is formed on a capacitor insulation film 45 which is formed on the storage electrode 44. The drain portion of the MOS transistor serving as a bit contact constitutes a p-type polysilicon layer 47 serving as a resistor element by use of the side wall leaving technique which is well known in the art. Then, n+-type polysilicon layer 49 serving as the bit line is formed with an insulation film 48 disposed between the polysilicon layers. Since, in the bit line contact section, the n+-type polysilicon layer 49 is formed in contact with the p-type diffusion layer 43, n+-type impurities are diffused into the p-type layer to form an npn bipolar transistor.

Thus, the DRAM of this embodiment is formed.

FIG. 30 is a diagram showing the construction of a DRAM core circuit of multiple-divided bit line system having the memory section shown in FIG. 29. FIG. 30 shows an example made by laying out m×n memory cells in a known folded bit line configuration. The core circuit of FIG. 30 includes memory cells 31 shown in FIG. 29 and a bit line control circuit 32 constructed by a bit line equalizing circuit and restore circuit. m main word lines 34 are connected to k sub-word lines 35 via switching transistors 33. The transfer gates of the memory cells 31 are connected to the respective sub-word lines 35. The switching transistors 33 are supplied with a signal $\phi_k$ which is decoded by a column address. The signal $\phi_k$ is also used to select the bit line control circuit 32.

The operation of the core circuit of this embodiment is explained below. First, the main word line 34 is selected by a row address. Then, the sub-word line 35 and the bit line control circuit 32 are selected by a column address. That is, the transfer gates of 1/k of n memory cells which are connected to the main word line selected by the row address via the sub-word lines 35, that is, the transfer gates of n/k memory cells are activated so that data can be read out from the memory cells.

Figure 31A:
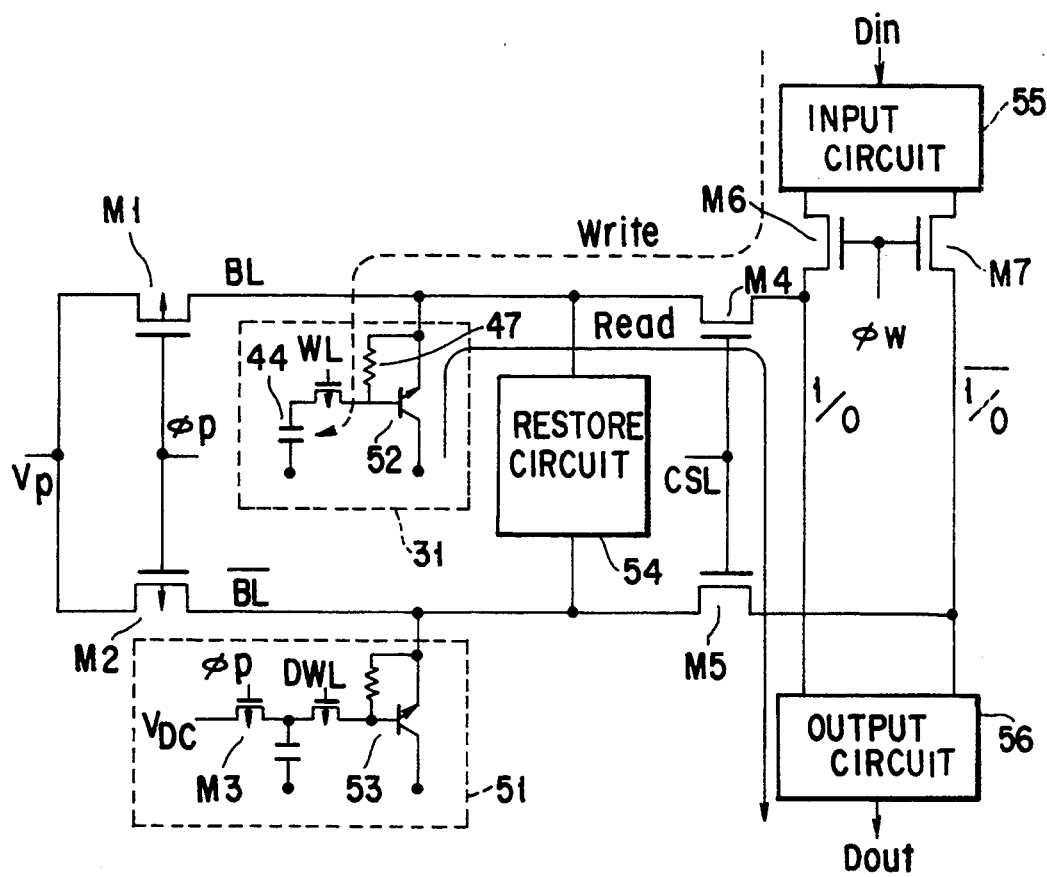
FIG. 31A is a diagram for illustrating the write-in/readout operation of the embodiment shown in FIG. 30
Figure 31B:
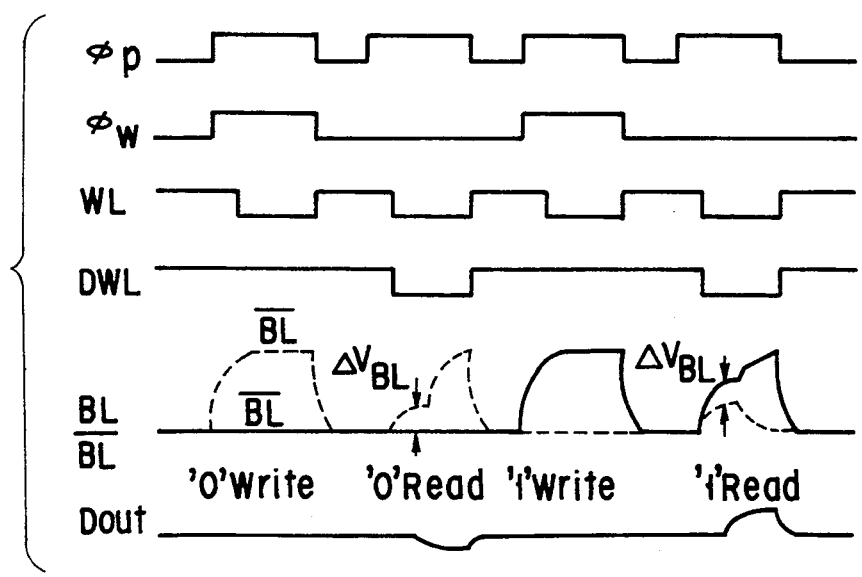
FIG. 31B is a diagram showing the timings of the write-in/readout operation.

The write-in and readout operations of the DRAM using the cells of this embodiment are explained with reference to FIGS. 31A and 31B. In the precharge cycle, $\phi_p$ is set to a low level and the potentials of the bit line BL and dummy bit line /BL are set to $V_P (=0\ V)$ by means of MOS transistors $M_1$ and $M_2$. Further, the potential of a dummy cell 51 is set to a potential $V_{DC}$ which is lower than $V_{cc}$ by means of a MOS transistor $M_3$. At the write-in time, $\phi_W$ is set to a high level and input data $D_{in}$ is supplied from an input circuit 55 to an I/O line via a MOS transistor $M_6$. A column selection signal CSL is set to a high level to permit data to be transmitted to the bit line BL via a MOS transistor $M_4$. The data is transferred via a resistor 47 and stored into a storage electrode 44.

At the "0" (0 V) readout time, a bipolar transistor 52 in the memory cell 31 is kept nonoperative so that the bit line potential will be kept unchanged. Since, at this time, a bipolar transistor 53 in the dummy cell 51 is operated, the dummy bit line potential is changed. As a result, the bit line potential becomes lower than the dummy bit line potential. At the "1" ($V_{cc}$) readout time, the bit line potential becomes higher than the dummy bit line potential. This is because the amount of charges stored in the memory cell 31 is larger than that of the dummy cell 51. After cell data is read out on the bit line, the operation of rewriting data into the cell is effected by the restore circuit 54. The column selection signal CSL is set to a high level so as to permit data to be transferred to the I/O line and output circuit 56 via the MOS transistors $M_4$ and $M_5$ and output as output data $D_{out}$.

In the DRAM using the above cells, since cell data appear on the bit line while being amplified by the bipolar transistors 52 and 53, a potential difference $\Delta V_{BL}$ between the bit line and the dummy bit line can be made larger than that in the conventional cell. Next, $\Delta V_{BL}$ is derived in an analytical process.

First, $\Delta V_{BL}$ in the conventional cell is derived. In this case, assume that the write-in potential of the dummy cell is $V_{cc}/2$. That is, assume that $V_{DC} = V_{cc}/2$. Further, assume that the precharge potential of the bit line is $V_P$. If $V_{cc}$ is stored in the cell storage capacitor $C_s$, the potential $V_{B1}$ of the bit line is expressed by the following equation.

$$V_{B1} = (C_s V_{cc} + C_B V_P)/(C_B + C_s)$$

$C_B$ is a bit line capacitance.

When 0 V is written, the bit line potential $V_{B0}$ is expressed by the following equation.

$$V_{B0} = C_B V_P/(C_B + C_s)$$

Further, the potential $V_{BD}$ appearing on the dummy bit line is expressed as follows.

$$V_{BD} = (C_s V_{DC} + C_B V_P)/(C_B + C_s)$$

Therefore, the potential difference $\Delta V_{BL}$ between the bit line and the dummy bit line can be expressed by the following equation both in the "1" readout operation and "0" readout operation.

$$\Delta V_{BL} = V_{DC}/(1 + C_B/C_s)$$

Next, $\Delta V_{BL}$ in the cell of this embodiment is derived by use of the diagram of FIG. 32. Assume that a voltage between the base and emitter of the bipolar transistor 52 is always set to a constant voltage level $V_F$ while the transistor is operated. Further, assume that after the operation of the bipolar transistor, the bit line potential is set to $V_B'$, a current is permitted to flow via the resistor 47 and the bit line potential is finally set to $V_B$. In the initial state, the potential of the bit line BL is set at 0 V and the base potential of the bipolar transistor 52 is set at 0 V.

When $V_{cc}$ is stored in the cell storage capacitor $C_s$, charges of $[C_s V_{cc} - (C_s + C_B')(V_B' + V_F)]$ flow into the base and resistor 47 since the base potential is set to $(V_B' + V_F)$ after the bipolar transistor operation. In this case, $C_B'$ is a parasitic capacitance of the base. The amount of charges is multiplied by $(1+\beta)$ by means of the bipolar transistor 52 and then the charges flow into the bit line to charge the bit line capacitor $C_B$. Therefore, the following equation is obtained.

$$[C_s V_{cc} - (C_s + C_B')(V_B' + V_F)](1+\beta) = C_B V_B'$$

where $\beta$ is a value obtained by multiplying the current amplification factor of the bipolar transistor 52 by the rate of charges flowing into the bipolar transistor 52 with respect to the total charges which separately flow into the bipolar transistor 52 and resistor 47. Therefore, the following equation can be obtained.

$$V_B' = (1+\beta)[C_s V_{cc} - (C_s + C_B') V_F] / [(1+\beta)(C_s + C_B') + C_B]$$

Next, $V_B$ is derived. The base potential of the bipolar transistor 52 is changed from $(V_B' + V_F)$ to $V_B$, the bit line potential is changed from $V_B'$ to $V_B$, and the amount of charges is kept unchanged during the potential variation period. Therefore, the following equation can be attained.

$$(C_s + C_B')(V_B' + V_F) + C_B V_B' = (C_s + C_B') V_B + C_B V_B$$

The above equation can be rewritten as follows.

$$V_B = V_B' + [(C_s + C_B')/(C_s + C_B' + C_B)] V_F$$

When 0 V is written into the cell storage capacitor $C_s$, the bipolar transistor 52 is kept nonoperative and the charge transfer with respect to the bit line is effected so that the bit line potential will be kept unchanged. That is, $V_B = 0$.

Since $V_{DC}$ is written into the dummy cell, the dummy bit line potential can be expressed by use of the following equations in the same manner as that effected in a case where the bit line potential is derived when $V_{cc}$ is written in the cell.

$$V_{BD}' = (1+\beta)[C_s V_{DC} - (C_s + C_B') V_F] / [(1+\beta)(C_s + C_B') + C_B]$$

$$V_{BD} = V_{BD}' + [(C_s + C_B')(C_s + C_B' + C_B)] V_F$$

If $C_B' << C_B$ and $V_F << V_{cc}$, then $V_{BD}$ becomes equal to $V_{BL}/2$ when $V_{DC} = V_{cc}/2$.

Therefore, the potential difference $\Delta V_{BL}$ between the bit line and the dummy bit line can be expressed by the following equation both in the "1" readout operation and "0" readout operation.

$$V_{BL} = \{[1+\beta-\beta(1+C_B'/C)V_F/V_{cc}] / [(1+\beta)(1+C_B'/C_s) + C_B/C_s]\} V_{DC}$$

FIG. 33 shows the results of calculation for the potential difference $\Delta V_{BL}$ between the bit line and the dummy bit line with respect to the conventional cell and the cell of this embodiment. In this case, $V_{cc} = 4$ V, $V_F = 0.7$ V and $C_B' = 8.5$ fF. In the case of conventional cell, a small value of $\Delta V_{BL}$ which is approx. 200 mV and is obtained when $C_B/C_s$ is 10 is amplified by means of the sense amplifier. However, in the case of the cell of this embodiment, a sufficiently large value of $\Delta V_{BL}$ which is approx. 300 mV can be obtained even when $C_B/C_s$ is 200 which is 20 times the value of the conventional case. Therefore, it is possible to increase the bit line capacitance $C_B$.

Next, the chip size of a 64M DRAM using the conventional cells in which the cell storage capacitance $C_s$ is 20 fF and the bit line capacitance $C_B$ is 200 fF is derived. In order to set $C_B$ to 200 fF, the number of cells connected to a single bit line is set to 128. Therefore, the number of bit lines in one chip can be derived by the following equation.

$$2^{26}/128 = 524288$$

When the shared sense amplifier and folded bit line system are used, the number of bit lines connected to a single sense amplifier is 4. Therefore, the number of sense amplifiers used in one chip can be derived as follows.

$$524288/4 = 131072$$

The cell area is 1.6 $\mu m^2$, the pattern area for one sense amplifier and input/output gate and a peripheral circuit for controlling the same is 646 $\mu m^2$, and the pattern area of the other peripheral circuits is 23 $mm^2$. Therefore, the chip area S can be derived as follows.

$$S = 1.6\ \mu m^2 \times 2^{26} + 646\ \mu m^2 \times 131072 + 23\ mm^2$$
$$= 215\ mm^2$$

Next, the chip size of a 64M DRAM using the cells of this embodiment is derived. When the bit line is not divided and if the shared sense amplifier and folded bit line system are used, the number of sense amplifiers can be derived as follows.

$$2^{13} = 8192$$

Therefore, the chip area S' thereof can be derived as follows.

$$S' = 1.6\ \mu m^2 \times 2^{26} + 646\ \mu m^2 \times 8192 + 23\ mm^2$$
$$= 135.7\ mm^2$$

Thus, the chip area can be reduced by 63% in comparison with the conventional case.

As described above, according to this invention, even when the bit line capacitance is increased with an increase in the integration density, a sufficiently large bit line amplitude can be attained and a stable DRAM can be realized. As a result, the number of input/output gates and sense amplifiers for the bit line can be reduced, thereby reducing the pattern areas thereof. Further, the pattern area of a circuit for driving the sense amplifier can be reduced. According to this embodiment, an increase in the power consumption of the chip can be suppressed by dividing the cells connected to a single word line into a plurality of blocks and selectively activating them.

FIG. 34 is a view showing a modification of the cell structure of FIG. 29. In this modification, an n+-type buried layer 50 is formed in an n well 40 and the other portions are the same as those of FIG. 29.

Electrons injected from the emitter of the bipolar transistor into the base thereof flow into the collector thereof (w well 40). However, at this time, if the collector resistance is large, the electrons are injected into the storage electrode 44 by the effect of voltage drop, thereby destroying the cell data. The data destruction can be prevented by lowering the collector resistance by use of the n+-type buried layer 50. In order to prevent the data destruction, it is also effective to set the collector potential higher than the "1" writing level for the cell.

FIG. 35 is a view showing a second modification in which the collector resistance in the memory section of FIG. 29 is lowered. The potential applied to the n well 40 which is a collector is supplied not only from the peripheral portion of the cell array but also from portions between cell array blocks 61 of the sub-word line via a wiring layer 62. Further, the wiring layer 62 may be arranged to pass through the cell array block 61 of the sub-word line as required, and the n+-type buried layer 50 of FIG. 34 may be incorporated.

FIG. 36 is a view showing a third modification in which the collector resistance in the memory section of FIG. 29 is lowered and shows an example in which the n well 63 is divided into a plurality of wells and cell data in the well is prevented from being destroyed by electrons from the emitter in the adjacent well. Also, in this modification, the examples of FIGS. 34 and 35 may be combined.

In the SEA cell structure having a bipolar transistor connected between the drain of the above cell transistor and the bit line, the stored charge is amplified by the npn bipolar transistors formed in the bit line contact portion 11 and the substrate and is then supplied to the bit line, thus permitting data to be correctly written and read out at a high speed. Therefore, with small $C_s$ of simple capacitor structure, it can be operated with high reliability.

The value of $C_s$ is determined by the following three factors when the DRAM is formed with high integration density.
  (i) The readout voltage of the bit line sense amplifier and the S/N ratio
  (ii) Soft error
  (iii) Refreshing However, the above SEA cell is formed to cope with the factor (i). Therefore, the effect of reduction in $C_s$ cannot be attained for the factors (ii) and (iii), and since $C_s$ must be set to be larger than a certain value when the integration density is further enhanced, it is required to form a relatively large capacitor storage node. Therefore, a large stepped portion is formed and it may become difficult to form the bit line which is an upper-level wiring layer or an Al wiring layer formed thereon.

In the following embodiment, a countermeasure is taken for the remaining factors (soft error, refreshing) determining the value of $C_s$ so as to reduce $C_s$ to the minimum permissible value and substantially or completely omit the capacitor.

In order to take the above countermeasure, an SOI substrate acting as the barrier layer for carriers generated by application of α-rays incident on the substrate, a damage layer formed by high-energy ion implantation or n+-type or p+-type buried layer is used and the transistor isolation structure for suppressing the leak current in the element isolation end portion used for refreshing is used.

Figure 37:
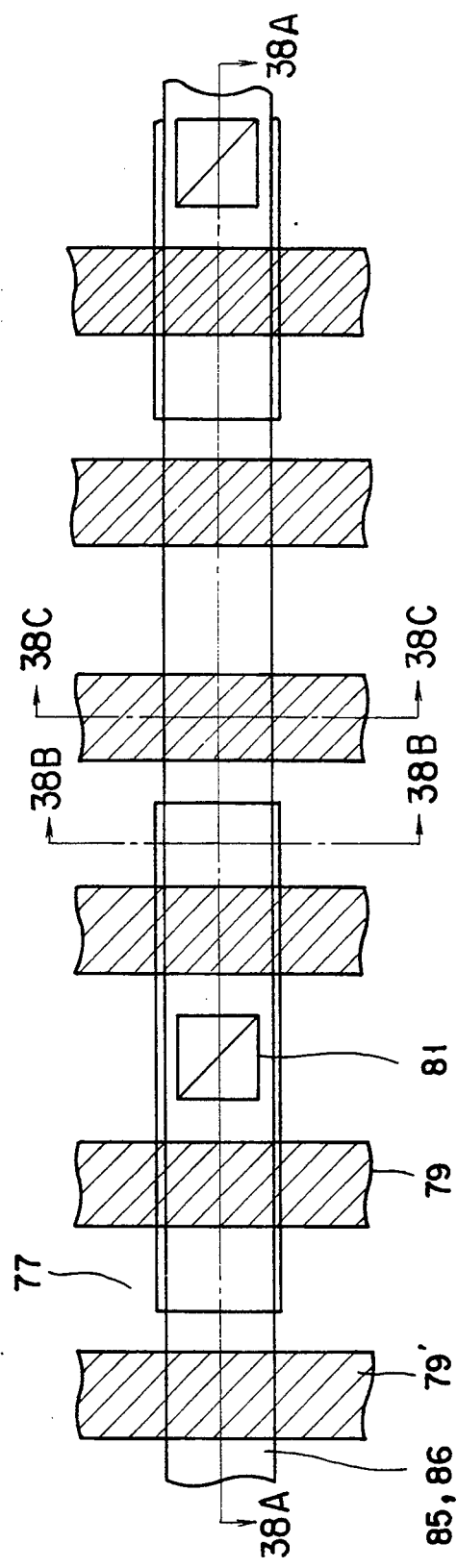
FIG. 37 is a plan view showing a DRAM structure according to a fifth embodiment of this invention constructed with the soft error and refreshing taken into consideration.

FIG. 37 is a plan view showing a DRAM structure according to a fifth embodiment of this invention constructed with the soft error and refreshing taken into consideration, and FIGS. 38A to 38C are cross sectional views respectively taken along the lines 38A—38A, 38B—38B and 38C—38C of FIG. 37.

A layer 72 which is an SOI oxide film or damage layer formed by high-energy ion implantation or the like is formed in a p-type silicon substrate 71, an n+-type buried layer 73 is formed on the layer 72 by high-energy ion implantation or the like, and then an n well 74 is formed on the layer 73. A diffusion layer 75' is formed in the surface area of the above substrate by the lithography technology and ion-implantation technique so as to form a transistor isolation region by use of a polysilicon layer 77 and an insulation film 76. In this case, a capacitor between the diffusion layer 75' and the divided electrode formed of the polysilicon layer serves as a storage capacitor. The insulation film 76 may be formed of an oxide film, NO film, ONO film or ferroelectric film according to a required $C_s$. After this, word line MOS transistors are formed and the diffusion layer 75 is formed by ion-implantation technique.

Next, a p-type polysilicon layer 82 is formed in a bit line contact 81 so as to be electrically connected to the diffusion layer 75 by the side wall leaving technique, and then an insulation film 83 such as an oxide film is formed by the side wall leaving technique. After this, an n+-type polysilicon layer 85 is deposited and a diffusion layer 84 serving as an emitter of the bipolar transistor is formed by thermal diffusion of impurity. Then, a silicide 86 or the like which may be used as a bit line material is formed and patterned to form bit lines. The collector of the bipolar transistor is formed of the n+-type buried layer 73 and n well 74, the base thereof is formed of a diffusion layer p which is also used as the drain of the transfer gate transistor 79, and the emitter thereof is formed of bit lines 85 and 86 and diffusion layer 84. The p-type layer 82 connected to the base 75 forms a pn junction together with the bit line 85 so as to constitute a resistor R which is used as a path for charges at the write-in time.

With the above structure, the stored charge is amplified by the npn bipolar transistor to enhance the sensitivity of the sense amplifier. Carriers generated by application of α-rays or the like are blocked by the carrier barrier layer 72 to enhance the resistance to soft error. Further, since the transistor isolation structure is used, the leak current in the element isolation end portion can be suppressed to significantly enhance the refresh characteristic. Thus, the storage capacitance $C_s$ can be reduced to an extremely small value and it is not necessary to additionally form a capacitor structure. That is, with an extremely simple structure, the processibility and the length of time of the process for the SEA cell can be improved.

The carrier barrier layer 72 in this embodiment may be commonly used with the n+-type buried layer 73 or may be a p+-type buried layer. In this embodiment, the npn bipolar transistor is used, but a pnp bipolar transistor may be used. The conductivity types of the other regions may be inverted. In the above embodiment, the folded bit line system is used, but another layout such as the open bit line system may be used.

As described above, according to this embodiment, since $C_s$ required for the S/N ratio and the readout voltage of the sense amplifier, soft error and refreshing can be made substantially 0, $C_s$ can be reduced to an extremely small value, the capacitor can be practically or completely omitted, and consequently, the capacitor forming step which is a problem of the SEA cell can be made extremely simple or completely omitted.

FIG. 39 is a view showing a first modification of the DRAM structure of FIG. 37, and FIGS. 40A to 40C are cross sectional views respectively taken along the lines 40A—40A, 40B—40B and 40C—40C of FIG. 39.

Unlike the embodiment of FIGS. 37 and 38A to 38C applied to a normal DRAM cell, in this embodiment, a NAND type DRAM cell having MOS transistors and capacitors alternately arranged on a row is formed. A damage layer formed by high-energy ion implantation or an SOI oxide film is used as a carrier barrier layer and the transistor isolation structure is used for element isolation. Also, in this embodiment, $C_s$ can be reduced to an extremely small value, and the storage capacitor $C_s$ is formed of only the capacitor between the overlapped portions of the diffusion layer 75 and the transistor isolation layer 77 and the junction capacitor between the diffusion layer 75 and the n well 74.

Figure 41:
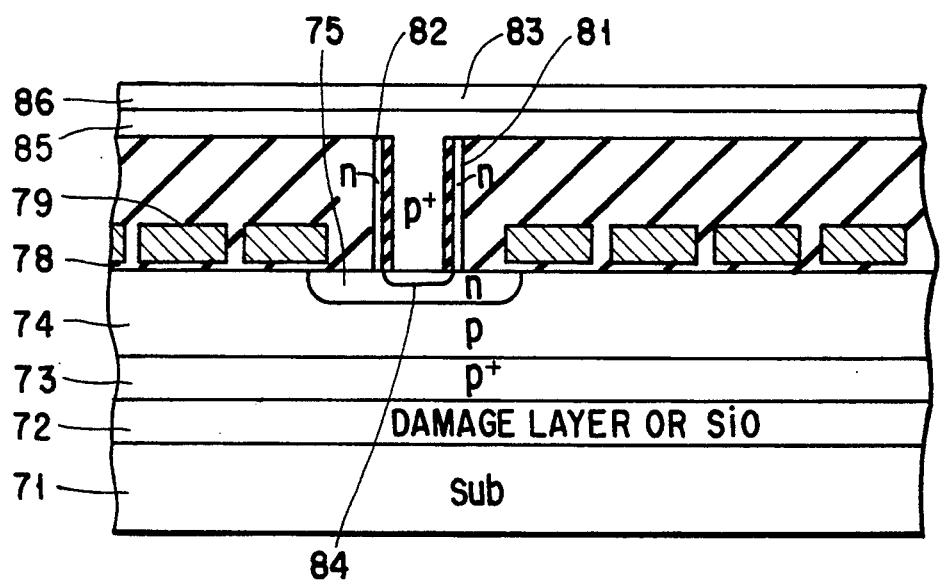
FIG. 41 is a view showing a modification of the DRAM structure of FIG. 39.

FIG. 41 is a view showing a modification of the DRAM structure of FIG. 39. FIG. 41 shows an embodiment in which the space between word lines 79 is narrowed by use of the phase shifting technique. In FIG. 41, a coupling capacitor between the word lines constitutes $C_s$, and in this case, the integration density can be extremely enhanced. In both of the embodiment of FIGS. 39 and 40A to 40C and the embodiment of FIG. 41, the carrier barrier layer 72 may be commonly used with the $n^+$-type buried layer or $p^+$-type buried layer 73. The conductivity types of the bipolar transistor, diffusion layer and the like may be inverted.

Figure 42:
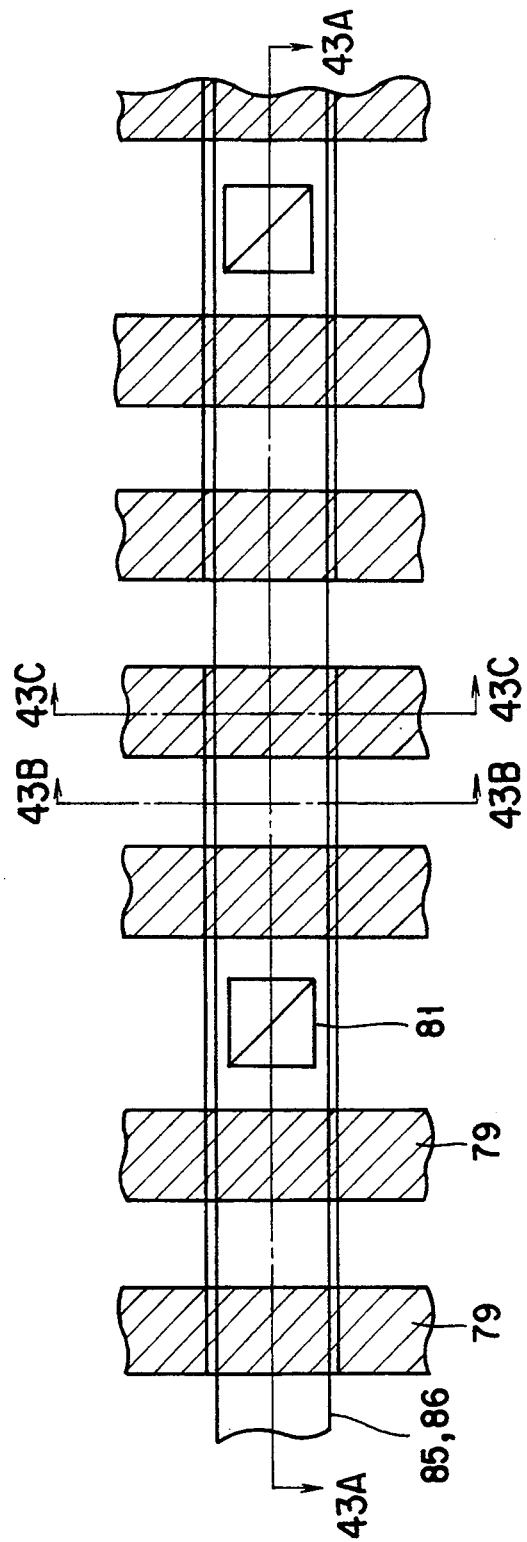
FIG. 42 is a view showing a second modification of the DRAM structure of FIG. 37.

FIG. 42 is a view showing a second modification of the DRAM structure of FIG. 37. FIGS. 43A to 43C are cross sectional views respectively taken along the lines 43A—43A, 43B—43B and 43C—43C of FIG. 42.

In this embodiment, a capacitor between the overlapped portions of the diffusion layer 75 and the passage word line is used as a storage capacitor $C_s$, a damage layer formed by high-energy ion implantation or an SOI oxide film is used as a carrier barrier layer, and a damageless trench isolation structure is used as an element isolation structure. In this case, it is not necessary to form a capacitor structure such as a storage node. Only the insulation film 78' lying under the passage word line WL can be replaced by an NO film or ferroelectric film in order to increase $C_s$.

Figure 46:
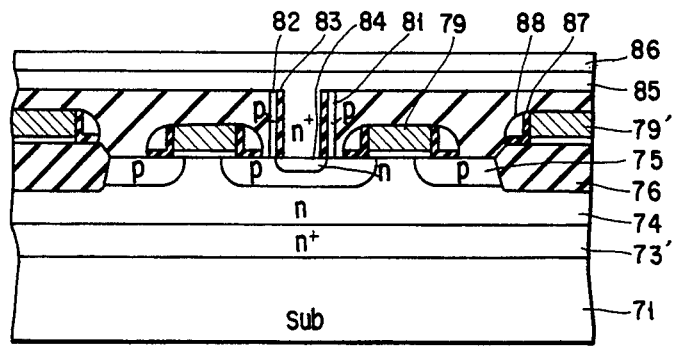
FIG. 46 is a view showing a first modification of the DRAM structure of FIG. 45.
Figure 47:
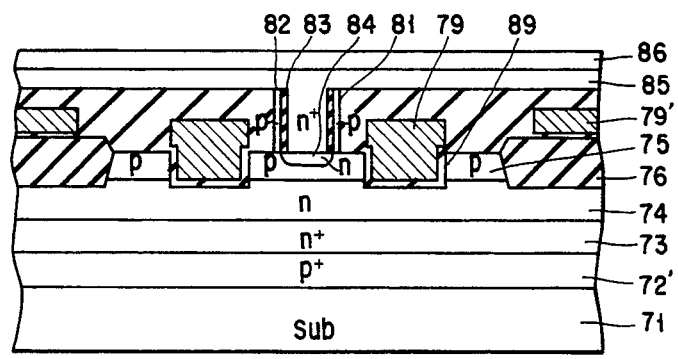
FIG. 47 is a view showing a second modification of the DRAM structure of FIG. 45.
Figure 48:
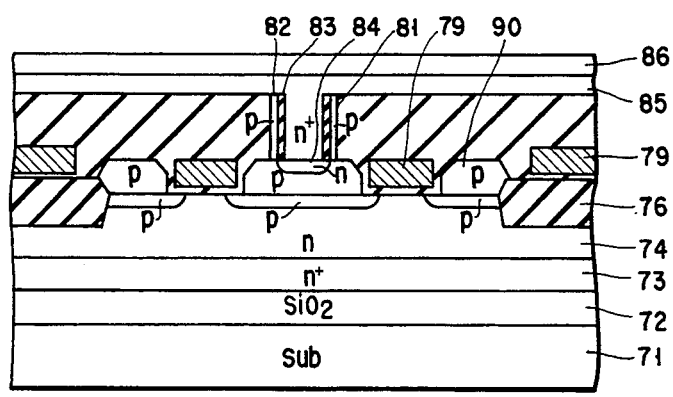
FIG. 48 is a view showing a third modification of the DRAM structure of FIG. 45.

FIG. 44 is a view showing a third modification of the DRAM structure of FIG. 37 and FIG. 45 is a cross sectional view taken along the line 45—45 of FIG. 44. FIGS. 46 to 48 show respective modifications of the DRAM structure of FIG. 45.

FIG. 45 shows a case wherein only a junction capacitor between the diffusion layer 75 and the n well 74 is used as the storage capacitor.

FIG. 46 is a view showing a first modification of the DRAM structure of FIG. 45. In this modification, a coupling capacitor formed between a gate 7 which is formed of a polysilicon layer 88 and an insulation film 87 formed on the side wall of the word line and a junction 75 is used as the storage capacitor, and an $n^+$-type buried layer 73' is used as the carrier barrier layer.

FIG. 47 is a view showing a second modification of the DRAM structure of FIG. 45. In this modification, an overlapping capacitor formed between a transistor having a gate electrode 79 buried in a trench 89 and a diffusion layer 75 is used as the storage capacitor, and a $p^+$-type buried layer 72' is used as the carrier barrier layer.

FIG. 48 is a view showing a third modification of the DRAM structure of FIG. 45. In this modification, a transistor of elevated source/drain structure having source and drain regions formed by growing silicon epitaxial layers 90 after formation of the gate electrode 79 and diffusing p-type impurities into the epitaxial layers is used, an overlapping capacitor formed between the gate electrode 79 and the diffusion layer 90 is used as the storage capacitor, and an SOI oxide film 72 is used as the carrier barrier layer.

In the embodiments shown in FIGS. 44 to 48, it is not necessary to form a special capacitor structure.

Figure 49:
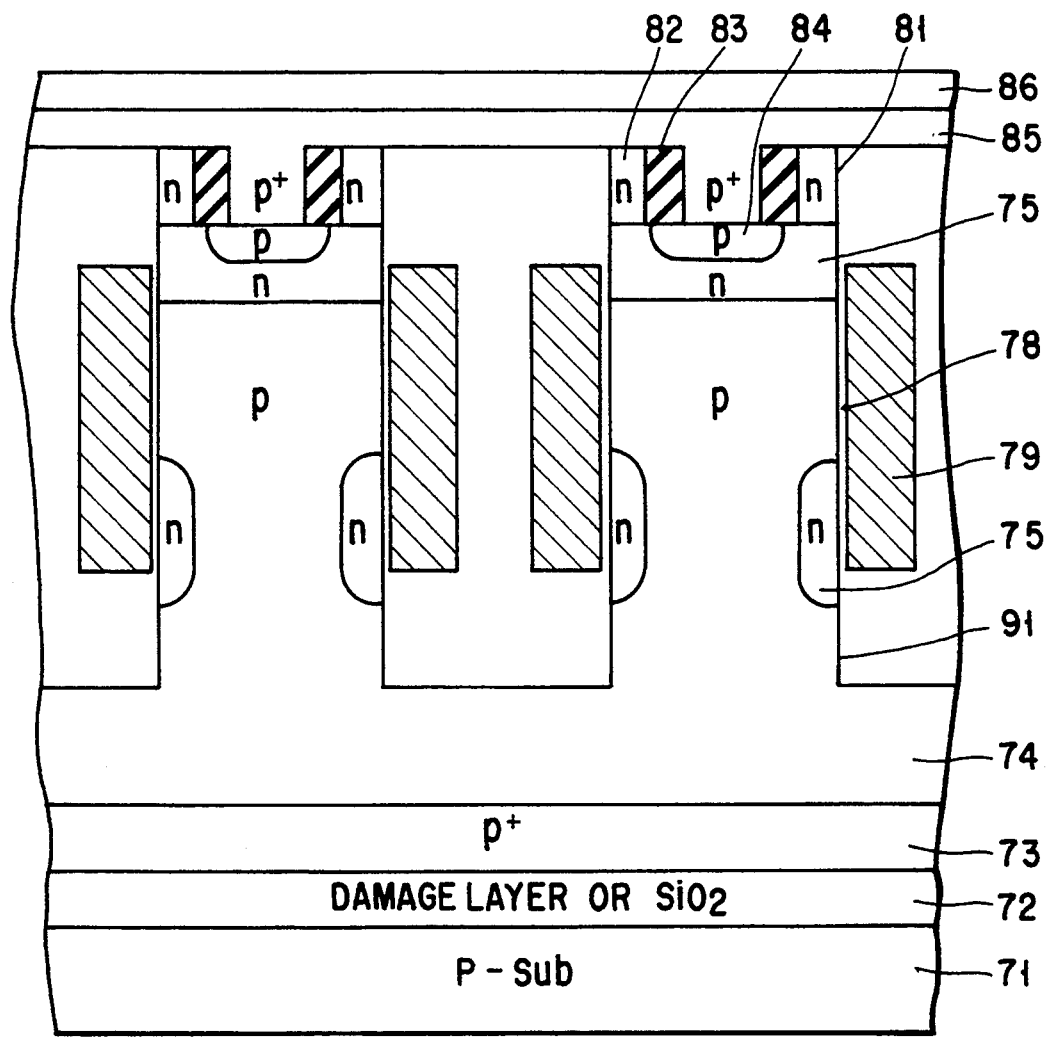
FIG. 49 is a view showing a fourth modification of the DRAM structure of FIG. 37.

FIG. 49 is a view showing a fourth modification of the DRAM structure of FIG. 37. In this modification, a 3-dimensional MOS transistor is used as the cell transistor. Trenches 91 are formed in a p-type substrate having a layer 72 which is a damage layer formed by high-energy ion implantation or SOI oxide film and a $p^+$-type buried layer 73, an n-type diffusion layer 75' is formed in the side wall of each trench and then a gate electrode 79 is formed in each trench so as to constitute a 3-dimensional MOS transistor. Further, a pnp bipolar transistor and a pn junction of an n-type layer 81 and $p^+$-type layer 85 serving as a resistor R at the write-in time are formed on each of the column-shaped silicon layers. An overlapping capacitor formed between the n-type diffusion layer 75' and the gate electrode 79 is used as the storage capacitor.

Figure 51:
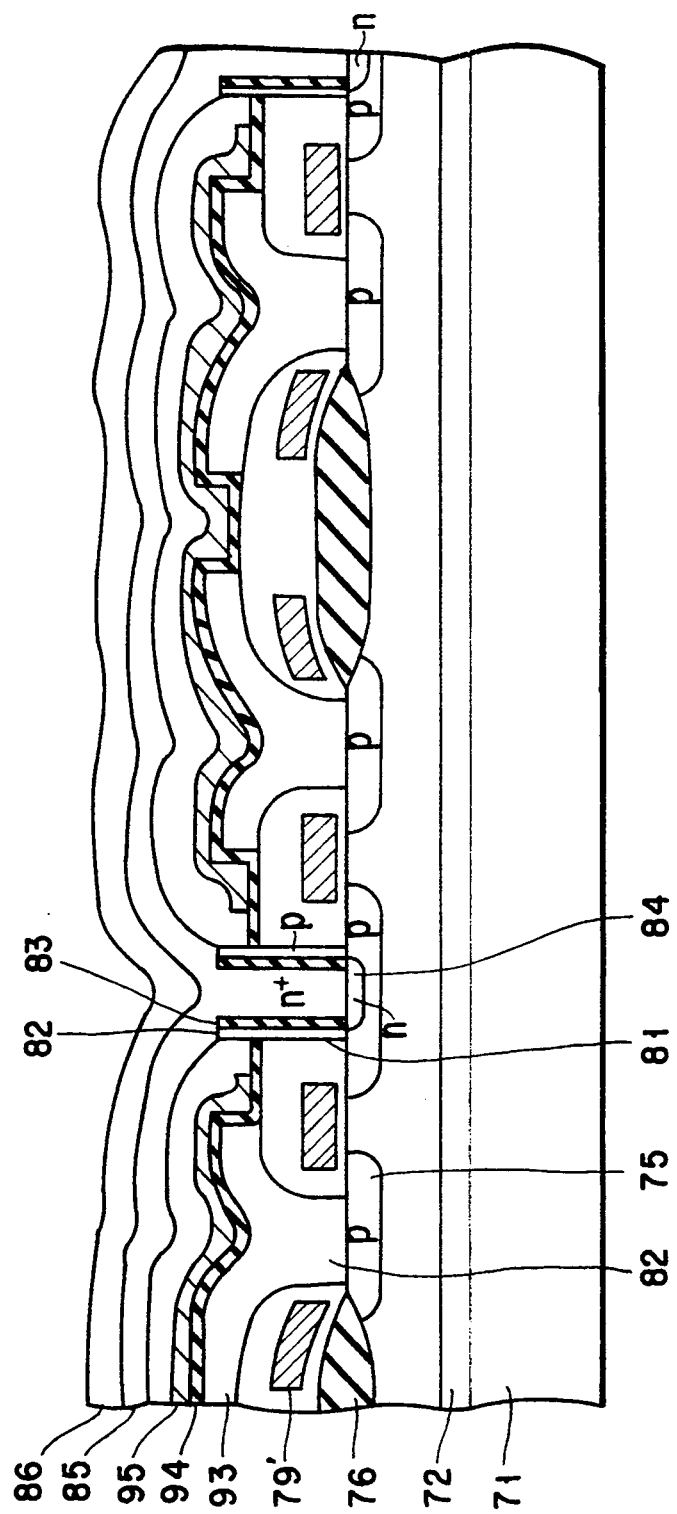
FIG. 51 is a cross sectional view taken along the line 51—51 of FIG. 50.

FIG. 50 is a view showing a fifth modification of the DRAM structure of FIG. 37 and FIG. 51 is a cross sectional view taken along the line 51—51 of FIG. 50. In this modification, a countermeasure for soft error and refreshing is made in the element structure as shown in FIG. 29. This modification is basically the same as the structure of FIG. 29, and in this modification, a layer 72 formed of a damage layer or SOI oxide film in a substrate 71 is formed in addition to the structure of FIG. 29. This modification includes a storage node electrode 93, capacitor insulation film 94 and plate electrode 95. With the above structure, since the capacitance $C_s$ of the capacitor can be reduced, the height of the storage node electrode 93 can be made small to reduce a difference in level of the stepped portion on the surface. Therefore, the bit line which is an upper-level wiring layer or an Al wiring layer can be easily processed. In this modification, the bit line is formed after the storage capacitor is processed, but it is also possible to form the storage capacitor after the bit line is processed.

This invention is not limited to the above embodiments.

For example, in the embodiments of FIGS. 37 to 50, a damage layer formed by high-energy ion implantation, SOI oxide film, $n^+$-type buried layer, or $p^+$-type buried layer may be used as the carrier barrier layer 72, and it is also possible to use a desired layer which may serve as a carrier barrier layer.

As the storage capacitor, a coupling capacitor associated with the transistor isolation structure, coupling capacitor associated with the passage word line, junction capacitor, overlapping capacitor of the gate or coupling capacitor associated with the 3-dimensional transistor can be used.

The conductivity types of the bipolar transistors can be inverted and the resistor R which can be used at the data write-in time may be provided or omitted as required.

The cell layout can be realized by use of the folded bit line configuration, open bit line configuration, NAND layout or checkered pattern layout.

The materials of the respective layers may be changed unless a bad influence is given to the operation of the SEA cell DRAM.

The concept of the embodiments of FIGS. 37 to 51 can be applied to the embodiments of FIGS. 1 to 36.

Further, this invention can be variously modified without departing from the technical scope thereof.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A dynamic semiconductor memory device comprising:
   a semiconductor substrate of a first conductivity type;
   a memory cell constituted by at least one capacitor and at least one MOS transistor formed on said semiconductor substrate;
   at least one bit line formed on said semiconductor substrate;
   at least one word line formed on said semiconductor substrate; and
   a bipolar transistor having an emitter connected to said bit line, a base connected to said memory cell and a collector connected to said semiconductor substrate;
   wherein said MOS transistor has a source and a drain, which are respectively formed of first and second regions of a second conductivity type formed on said semiconductor substrate, and an insulated gate connected to said word line;
   said bipolar transistor is constituted by said second region serving as said base and also used as said drain, a third region of said first conductivity type formed on said second region and serving as said emitter, and said semiconductor substrate serving as said collector;
   said capacitor includes a capacitor electrode insulatively formed over said first region; and
   said bit line is formed of a semiconductor layer of said first conductivity type.

2. A dynamic semiconductor memory device comprising:
   a semiconductor substrate of a first conductivity type;
   a memory cell constituted by at least one capacitor and at least one MOS transistor formed on said semiconductor substrate, said capacitor having a plate;
   at least one bit line formed on said semiconductor substrate;
   at least one word line formed on said semiconductor substrate;
   a bipolar transistor having an emitter connected to said bit line, a base connected to said memory cell and a collector connected to said semiconductor substrate; and
   plate potential controlling means for clocking said plate with a potential difference larger than a breakdown voltage between said base and emitter of said bipolar transistor at the data write-in time;
   wherein said MOS transistor has a source and a drain, which are respectively formed of first and second regions of a second conductivity type formed on said semiconductor substrate, and an insulated gate connected to said word line;
   said bipolar transistor is constituted by said second region serving as said base and also used as said drain, a third region of said first conductivity type formed on said second region and serving as said emitter, and said semiconductor substrate serving as said collector; and
   said capacitor includes a capacitor electrode insulatively formed over said first region.

3. A dynamic semiconductor memory device comprising:
   a semiconductor substrate;
   a memory cell constituted by a capacitor and a MOS transistor formed on said semiconductor substrate;
   a plurality of memory cells constituted by at least one capacitor and at least one MOS transistor formed on said semiconductor substrate;
   memory cell units each constituted by series-connected memory cells among said plurality of memory cells;
   at least one bit line formed on said semiconductor substrate;
   a plurality of word lines formed on said semiconductor substrate;
   a bipolar transistor having an emitter connected to said bit line, a base and a collector connected to said semiconductor substrate; and
   a sense amplifier section connected to said bit line;
   wherein the drain of the MOS transistor of the memory cell, which lies at one end of said memory cell unit, is connected to the base of said bipolar transistor, and the source of the MOS transistor of the memory cell, which lies at the other end of said memory cell unit, is connected to said bit line; and
   said sense amplifier section includes a register for temporarily storing a plurality of data items sequentially read out from said memory cell unit.

4. A dynamic semiconductor memory device according to claim 3, further comprising a resistor formed between said base and said bit line.

5. A dynamic semiconductor memory device according to claim 4, wherein said resistor is constructed by selectively forming said second region of said second conductivity type between the base of said bipolar transistor and said bit line.

6. A dynamic semiconductor memory device according to claim 4, further comprising an insulation layer formed to face said second region of said second conductivity type between said bit line and said second region of said second conductivity type serving as said resistor.

7. A dynamic semiconductor memory device comprising:
   a semiconductor substrate having a region of a first conductivity type;
   at least one MOS transistor formed on said semiconductor substrate;

a capacitor formed to face said MOS transistor on said semiconductor substrate, said capacitor having a plate;

at least one bit line formed on said semiconductor substrate;

at least one word line formed on said semiconductor substrate;

a bipolar transistor having a base connected to said MOS transistor, an emitter connected to said bit line, and a collector connected to said semiconductor substrate; and plate potential controlling means for clocking said plate with a potential difference larger than a breakdown voltage between said base and emitter of said bipolar transistor at the data write-in time;

wherein said MOS transistor has a source and a drain of a second conductivity type separately formed in said first conductivity type region of said semiconductor substrate, and a gate formed over a part of said first conductivity type region which lies between said source and drain, with an insulation film disposed between said gate and said first conductivity type region;

said word line is formed of a layer which also constitutes the gate electrode of said MOS transistor;

said capacitor has an electrode which is formed of said source of said MOS transistor;

said bipolar transistor is constituted by a second region serving as said base and also used as said drain, a third region of said first conductivity type formed on said second region and serving as said emitter, and said semiconductor substrate serving as said collector; and said bit line is connected to the emitter of said bipolar transistor.

8. A dynamic semiconductor memory device according to claim 7, in which a plurality of memory cells are provided as said memory cell and which further comprises memory cell units each constructed by series-connected memory cells among said plurality of memory cells, the drain of the MOS transistor of the memory cell which lies at one end of said memory cell unit being connected to the base of said bipolar transistor and the MOS transistor of the memory cell which lies at the other end of said memory cell unit being connected to said bit line; and a sense amplifier section connected to said bit line, said sense amplifier section including a register for temporarily storing a plurality of data items sequentially read out from said memory cell unit.

9. A dynamic semiconductor memory device comprising:

a semiconductor substrate having a region of first conductivity type;

at least one MOS transistor formed on said semiconductor substrate;

a capacitor formed to face said MOS transistor on said semiconductor substrate;

at least one bit line formed on said semiconductor substrate;

at least one word line formed on said semiconductor substrate;

a bipolar transistor having a base connected to said MOS transistor, an emitter connected to said bit line, and a collector connector to said semiconductor substrate;

wherein said MOS transistor has a source and a drain of second conductivity type separately formed in said first conductivity type region of said semiconductor substrate and a gate formed over that part of said first conductivity type region which lies between said source and drain with an insulation film disposed between said gate and said first conductivity type region;

said word line is formed of a layer which also constitutes the gate electrode of said MOS transistor;

said capacitor has an electrode which is formed of said source of said second conductivity type of said MOS transistor;

said bipolar transistor is constituted by said second region serving as said base and also used as said drain, a third region of said first conductivity type formed on said second region and serving as said emitter, and said semiconductor substrate serving as said collector; and said bit line is connected to the emitter of said bipolar transistor, and further comprising:

a resistor connected between said base and said bit line.

10. A dynamic semiconductor memory device comprising:

a semiconductor substrate having a first conductivity type region;

a memory cell constructed by at least one capacitor and at least one first MOS transistor formed on said semiconductor substrate;

at least one bit line formed on said semiconductor substrate;

a first word line connected to the gate of said first MOS transistor to drive said memory cell;

a bipolar transistor having a base connected to said first MOS transistor, an emitter connected to said bit line and a collector connected to said semiconductor substrate; and a second MOS transistor having a drain connected to said first word line, a source connected to a second word line and a gate supplied with a signal for selecting said bit line;

wherein said bipolar transistor is constructed by said semiconductor substrate serving as said collector, a base of said second conductivity type which is also used as the drain of said MOS transistor, and an emitter of said first conductivity type formed on said base and connected to said bit line.

11. A dynamic semiconductor memory device comprising:

a semiconductor substrate of a first conductivity type;

a memory cell constituted by at least one capacitor and at least one MOS transistor formed on said semiconductor substrate;

at least one bit line formed on said semiconductor substrate;

at least one word line formed on said semiconductor substrate;

a bipolar transistor having an emitter connected to said bit line, a base connected to said memory cell and a collector connected to said semiconductor substrate; and a resistor formed between said base and said bit line;

wherein said MOS transistor has a source and a drain, which are respectively formed of first and second regions of second conductivity type formed on said semiconductor substrate, and an insulated gate connected to said word line;

said bipolar transistor is constituted by said second region serving as said base and also used as said drain, a third region of said first conductivity type formed on said second region and serving as said emitter, and said semiconductor substrate serving as said collector; and said capacitor includes a capacitor electrode insulatively formed over said first region.

12. A dynamic semiconductor memory device according to claim 11, wherein said resistor is formed by selectively forming said second region of said second conductivity type between the base of said bipolar transistor and said bit line.

13. A dynamic semiconductor memory device according to claim 11, further comprising an insulation layer formed to face said second region of said second conductivity type between said bit line and said second region of said second conductivity type serving as said resistor.

14. A dynamic semiconductor memory device according to claim 11, wherein said substrate includes a diffusion layer formed below said collector.

15. A dynamic semiconductor memory device according to claim 14, wherein said diffusion layer serves as a carrier barrier layer.

16. A dynamic semiconductor memory device according to claim 14, wherein said carrier barrier layer is formed of one of an SOI substrate, a damage layer formed by high-energy ion implantation, an $n^+$-type buried layer and a $p^+$-type buried layer.

17. A dynamic semiconductor memory device according to claim 14, wherein said capacitor of said memory cell is constituted by one of a capacitor between a passage word line and a second diffusion layer, a capacitor between a transistor isolation region and said second diffusion layer, a fringe capacitor of said insulated gate and a junction capacitor.

* * * * *